(12) United States Patent
Dorrough et al.

(10) Patent No.: US 10,663,613 B2
(45) Date of Patent: May 26, 2020

(54) APPARATUS AND METHODS FOR DETECTING OBSCURED FEATURES

(71) Applicant: Franklin Sensors, Inc., Meridian, ID (US)

(72) Inventors: David M. Dorrough, Eagle, ID (US); Daniel Scott Toborg, Bellevue, WA (US); Dylan Thomas Smith, Idaho Falls, ID (US)

(73) Assignee: Franklin Sensors, Inc., Meridian, ID (US)

( * ) Notice: Subject to any disclaimer, the term of this patent is extended or adjusted under 35 U.S.C. 154(b) by 0 days.

(21) Appl. No.: 16/360,913

(22) Filed: Mar. 21, 2019

(65) Prior Publication Data

US 2019/0219721 A1  Jul. 18, 2019

Related U.S. Application Data

(63) Continuation-in-part of application No. 15/136,570, filed on Apr. 22, 2016, now Pat. No. 10,261,208, and
(Continued)

(51) Int. Cl.
*G01R 27/26* (2006.01)
*G01V 3/08* (2006.01)
*G01V 3/15* (2006.01)

(52) U.S. Cl.
CPC .......... *G01V 3/081* (2013.01); *G01R 27/2605* (2013.01)

(58) Field of Classification Search
CPC . G01V 3/08; G01V 3/088; G01V 3/15; G01R 27/26; G01R 27/221; G01R 27/2605; G01N 27/22; G01N 27/221
See application file for complete search history.

(56) References Cited

U.S. PATENT DOCUMENTS

| 4,177,421 A | 12/1979 | Thornburg |
| 5,247,261 A | 9/1993 | Gershenfeld |

(Continued)

FOREIGN PATENT DOCUMENTS

| DE | 3600446 A1 | 7/1987 |
| DE | 102004007314 A1 | 8/2005 |

(Continued)

OTHER PUBLICATIONS

International Search Report and Written Opinion dated Sep. 8, 2017 for PCT/US2017/040901.
(Continued)

*Primary Examiner* — Minh N Tang
(74) *Attorney, Agent, or Firm* — Stoel Rives LLP; R. Whitney Johnson; Andrew Wasden

(57) ABSTRACT

Obscured feature detectors are disclosed. An obscured feature detector includes a sensor plate array including three or more sensor plates, each of the three or more sensor plates configured to form a first end of a corresponding electric field and to take a sensor reading of the corresponding electric field. The corresponding electric field varies based on a proximity of the sensor plate to one or more surrounding objects and on a material property of each of the one or more surrounding objects. The three or more sensor plates include a first sensor plate that has a first shape and a second sensor plate that has a second shape that is different from the first shape of the first sensor plate. The obscured feature detector also includes one or more common plates to form a second end of the corresponding electric field of the three or more sensor plates.

20 Claims, 47 Drawing Sheets

Related U.S. Application Data a continuation-in-part of application No. 15/499,701, filed on Apr. 27, 2017.

(60) Provisional application No. 62/183,189, filed on Jun. 23, 2015.

(56) References Cited

U.S. PATENT DOCUMENTS

| | | | |
|---|---|---|---|
| RE34,741 E | 9/1994 | Andermo | |
| 5,900,550 A | 5/1999 | Menzel | |
| 6,198,271 B1 | 3/2001 | Heger et al. | |
| 6,215,293 B1 | 4/2001 | Yim | |
| 6,867,602 B2 | 3/2005 | Davis et al. | |
| 7,116,091 B2 * | 10/2006 | Miller | G01V 3/088 324/67 |
| 7,504,817 B2 | 3/2009 | Sanoner et al. | |
| 8,669,772 B2 | 3/2014 | Dorrough | |
| 8,836,347 B2 | 9/2014 | Dorrough | |
| 2003/0201783 A1 | 10/2003 | Steber et al. | |
| 2005/0194959 A1 | 9/2005 | Miller | |
| 2008/0238403 A1 | 10/2008 | Sanoner et al. | |
| 2009/0039899 A1 | 2/2009 | Bassani et al. | |
| 2011/0215814 A1 | 9/2011 | Dorrough | |
| 2011/0215822 A1 | 9/2011 | Dorrough | |
| 2011/0309572 A1 | 12/2011 | Miyamoto | |
| 2012/0212241 A1 | 8/2012 | Wallace et al. | |
| 2016/0061630 A1 | 3/2016 | Aussertechner et al. | |
| 2016/0377758 A1 | 12/2016 | Dorrough | |
| 2018/0203149 A1 | 7/2018 | Dorrough et al. | |
| 2018/0313968 A1 | 11/2018 | Dorrough et al. | |

FOREIGN PATENT DOCUMENTS

| | | |
|---|---|---|
| DE | 202007002776 U1 | 6/2007 |
| DE | 102008054447 A1 | 6/2010 |
| EP | 0506605 A1 | 9/1992 |
| EP | 0952465 A2 | 10/1999 |
| EP | 2196828 A1 | 6/2010 |
| WO | 2007051780 A1 | 5/2007 |
| WO | 2007141062 A1 | 12/2007 |
| WO | 2009111518 A1 | 9/2009 |
| WO | 2010066659 A2 | 6/2010 |
| WO | 2011138084 A1 | 11/2011 |

OTHER PUBLICATIONS

International Search Report and Written Opinion for PCT/US2017/040857, dated Sep. 14, 2017.

Dorrough, et al., Office Action dated Mar. 7, 2018 for U.S. Appl. No. 15/136,570.

Dorrough, et al., Office Action dated Mar. 21, 2019 for U.S. Appl. No. 15/499,701.

Dorrough, et al., Office Action dated Mar. 30, 2018 for U.S. Appl. No. 15/406,322.

Dorrough, et al., Office Action dated Dec. 27, 2018 for U.S. Appl. No. 15/406,322 ,15 pages.

Dorrough, et al., Notice of Allowance dated Dec. 5, 2018 for U.S. Appl. No. 15/136,570 , filed Dec. 5, 2018 ,7 pages.

Kapaziteten Mi Einem Sigma-Delta,-Wandler Messen et al., Ein neuer Ansatz : mit ΣΔ, elektronik industrie 3 ,2005 ,pp. 60-61.

Tjora,Sigve et al., Evaluation of Methods for Ground Bounce Removal in GPR Utility Mapping, Tenth International Conference on Ground Penetration Radar ,Jun. 2004 ,pp. 21-24.

Dorrough , et al., Notice of Allowance dated Aug. 7, 2019 for U.S. Appl. No. 15/499,701.

Dorrough , et al., Office Action dated Jul. 17, 2019 for U.S. Appl. No. 15/406,322.

* cited by examiner

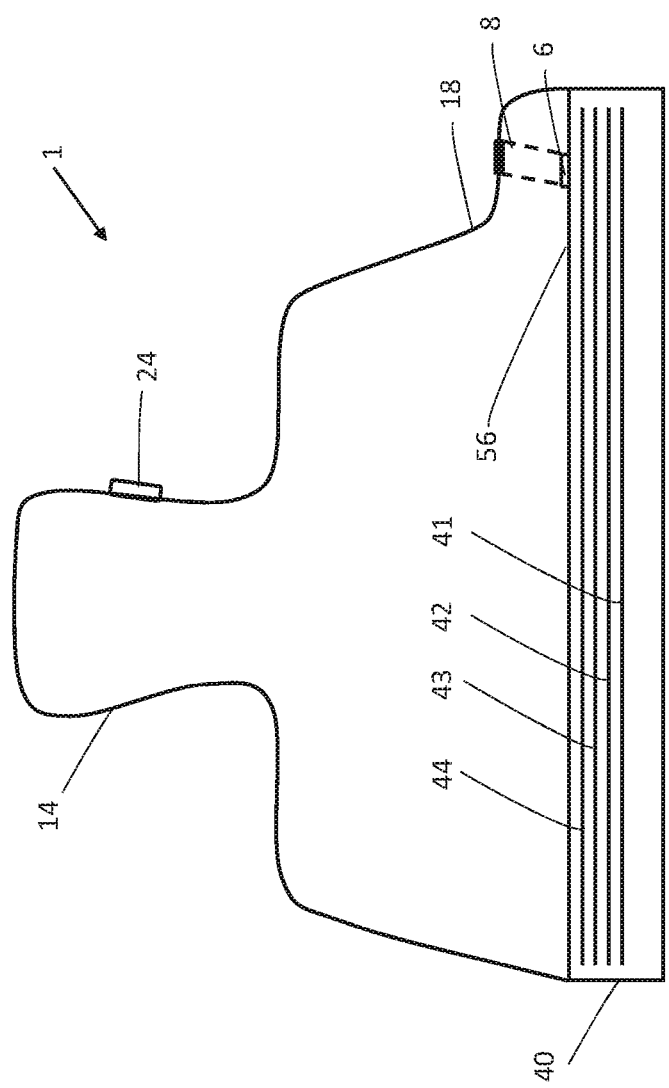

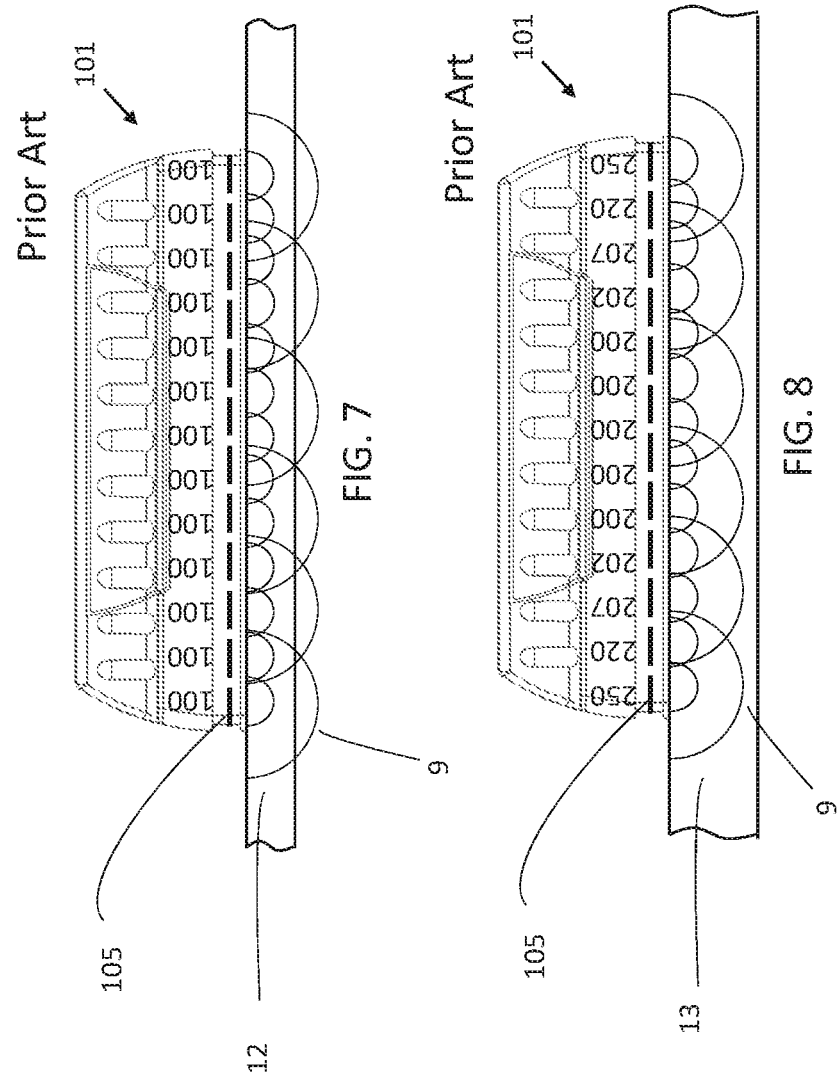

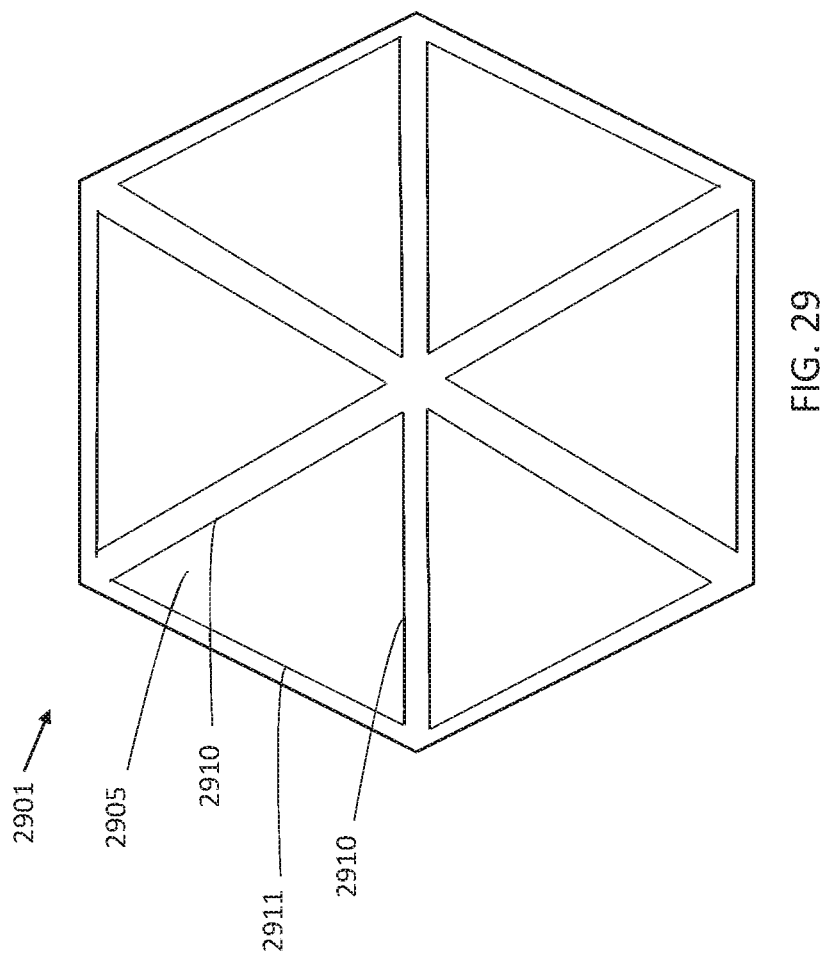

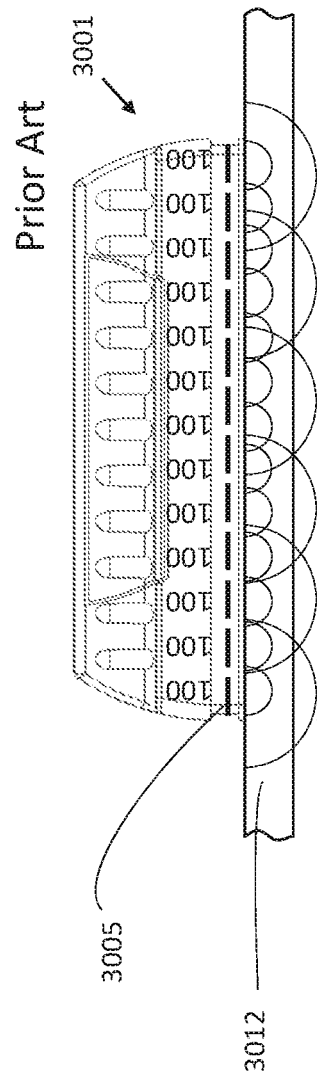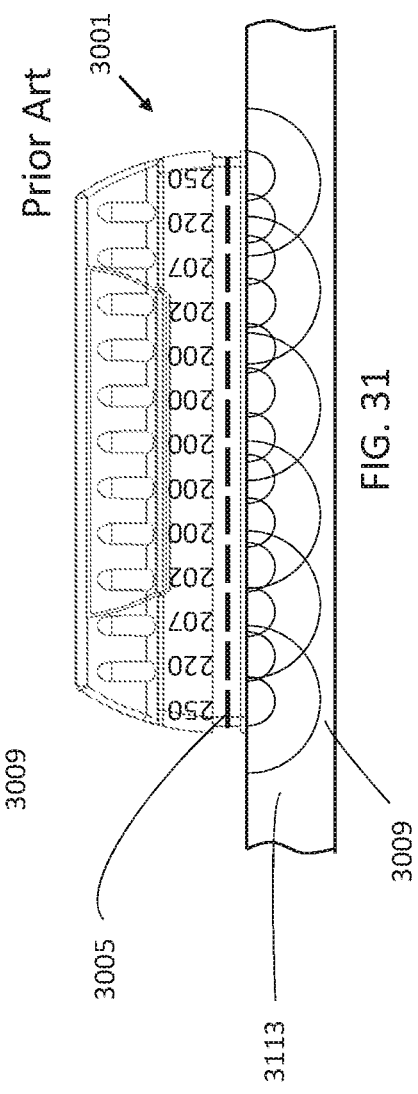

APPARATUS AND METHODS FOR DETECTING OBSCURED FEATURES

RELATED APPLICATIONS

This application is a continuation in part of U.S. Pat. No. 10,261,208, entitled "APPARATUS AND METHODS FOR DETECTING OBSCURED FEATURES," filed Apr. 22, 2016, which claims the benefit under 35 U.S.C. § 119(e) of U.S. Provisional Patent Application No. 62/183,189, entitled "OBSCURED FEATURE DETECTOR WITH ADVANCED SENSOR PLATE CONFIGURATION," filed Jun. 23, 2015, the entire disclosures of which are hereby incorporated herein by reference. This application is also a continuation in part of U.S. patent application Ser. No. 15/499,701, entitled "APPARATUS AND METHODS FOR OBSCURED FEATURE DETECTION," filed Apr. 27, 2017, the disclosure of which is hereby incorporated herein in its entirety by reference.

TECHNICAL FIELD

The present disclosure relates generally to devices to detect a presence of obscured features behind opaque, solid surfaces, and more specifically to devices to locate beams and studs behind walls and joists beneath floors.

BACKGROUND

Locating obscured features such as beams, studs, joists and other elements behind walls and beneath floors is a common problem encountered during construction, repair and home improvement activities. For example, often a desire arises to cut or drill into a wall, floor, or other supported surface with the aim of creating an opening in the surface while avoiding the underlying support elements. In these instances, knowing where the support elements are positioned before beginning can be desirable so as to avoid cutting or drilling into the support elements. On other occasions, one may desire to anchor a heavy object such as a picture or shelf to a support element obscured by a supported surface. In these cases, it is often desirable to install a fastener through the supported surface in alignment with an underlying support element. However, with the wall, floor or supported surface in place, the location of the support element is not visually detectable.

A variety of rudimentary techniques have been employed in the past with limited success to address the problem of locating underlying features obscured by an overlying surface. These techniques include driving small pilot nails through various locations in the overlying surface until an underlying support element is encountered and then covering over holes in the surface that did not reveal the location of the underlying support element. A less destructive technique comprises tapping on the overlying surface with the aim of detecting audible changes in the sound which emanates from the surface when there is a support element beneath or behind the area of the surface being tapped. This technique is ineffective, however, because the accuracy of the results depends greatly on the judgment and skill of the person tapping and listening to search for the underlying support element, and because the sound emitted by the tapping is heavily influenced by the type and density of the surface being examined.

Magnetic detectors have also been employed to find obscured support elements with the detector relying on the presence of metallic fasteners, such as nails or screws, in the wall and support element to trigger a response in the detector. However, since metallic fasteners are spaced at discrete locations along the length of a support, a magnetic detector may pass over a length of the support where no fasteners are located, thereby failing to detect the presence of the obscured support element.

Electronic sensors have also been employed to detect obscured features behind opaque surfaces. These detectors sense changes in capacitance on the examined surface that result from the presence of features positioned behind, beneath or within the surface. These changes in capacitance are detectable through a variety of surfaces such as wood, sheetrock, plaster and gypsum and do not rely on the presence of metal fasteners in the surface or obscured feature for activation of the sensor. However, conventional electronic detectors may suffer from a significant shortcoming. Conventional obscured feature detectors may have difficulty accurately compensating for the thickness and density of the detected surface, which negatively impact accuracy.

SUMMARY

The present disclosure advantageously addresses one or more of the aforementioned deficiencies in the field of obscured feature detection by providing an accurate, simple to use and inexpensively manufactured obscured feature detector. The detector can be employed by placing the device against the examined surface and reading the location of all features present beneath the surface where the device is positioned. The detector is able to accurately read through different surface materials and different surface thicknesses.

Additional aspects and advantages will be apparent from the following detailed description of preferred embodiments, which proceeds with reference to the accompanying drawings.

BRIEF DESCRIPTION OF THE DRAWINGS

FIG. 6 is a cross-sectional view of an obscured feature detector, according to one embodiment, including a housing, with light pipes and a button, and a printed circuit board.

FIG. 7 is a prior art obscured feature detector placed on a comparatively thinner surface.

FIG. 8 is a prior art obscured feature detector placed on a comparatively thicker surface.

FIG. 29 illustrates a sensor plate group with six sensor plates.

FIG. 30 is a prior art obscured feature detector placed on a comparatively thinner surface.

FIG. 31 is a prior art obscured feature detector placed on a comparatively thicker surface.

In the following description, reference is made to the accompanying drawings that form a part thereof, and in which is shown by way of illustration specific exemplary embodiments in which the invention may be practiced. These embodiments are described in sufficient detail to enable those skilled in the art to practice the technology and embodiments described herein, and it is to be understood that modifications to the various disclosed embodiments may be made, and other embodiments may be utilized, without departing from the spirit and scope of the present disclosure. The following detailed description is, therefore, not to be taken in a limiting sense.

DETAILED DESCRIPTION

Many presently available stud finders (e.g., obscured feature detectors) use capacitance to detect obscured features behind a surface. Capacitance is an electrical measure of an object's ability to hold or store charge. A common form of an energy storage device is the parallel plate capacitor whose capacitance is approximated by: $C = \varepsilon_r \, \varepsilon_0 \, A/d$, where A is the overlapping area of the parallel plates, d is the distance between the plates, $\varepsilon_r$ is the relative static permittivity (or dielectric constant of the material between the plates), and $\varepsilon_0$ is a constant. A dielectric material is an electrical insulator that can be polarized by applying an electric field. When a dielectric is placed in an electric field, the molecules shift from their average equilibrium positions causing dielectric polarizations. Because of dielectric polarizations, positive charges are shifted toward the negative edge of the field, and negative charges shift in the opposite direction.

The dielectric constant ($\varepsilon r$) of air is one, while most solid non-conductive materials have a dielectric constant greater than one. Generally, it is the variations in the dielectric constants of non-conductive solids that enable conventional capacitive sensors to work.

When the sensor plates on an obscured feature detector are placed on a wall at a location with no support behind the wall, the detector measures the capacitance of the wall and the air behind it. When placed in a position having a support behind the wall, the detector then measures the capacitance of the wall and the support, which has a higher dielectric constant than air. As a consequence, the detector registers an increase in capacitance which can then be used to trigger an indicating system.

Figure 10:
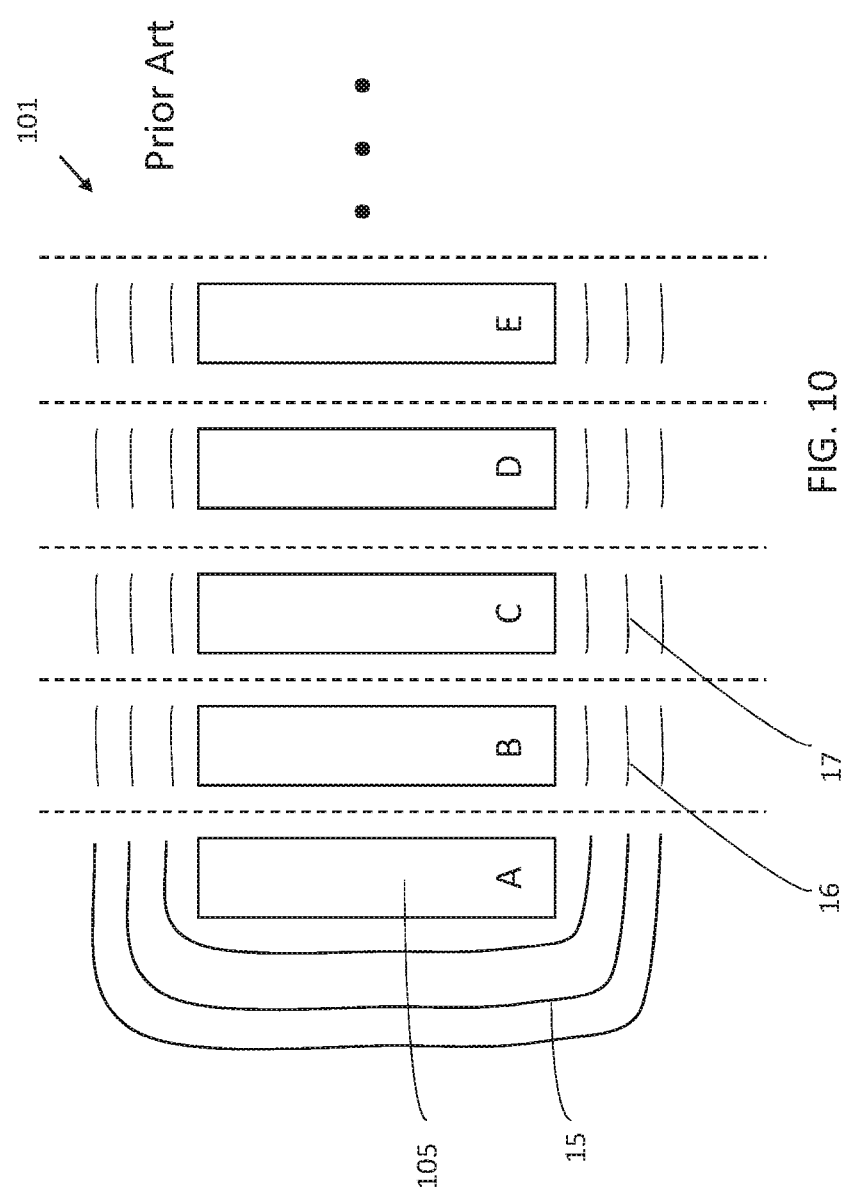
FIG. 10 shows an elevation view of a bottom surface of a prior art obscured feature detector, illustrating the primary sensing field zones for several sensor plates.

In presently available obscured feature detectors a set of identical sensor plates are typically arranged in a linear fashion (see, e.g., FIG. 10). Each of the sensor plates performs a sensor reading of the surface. The sensor readings are then compared. The sensor plates that have the highest sensor readings are interpreted to be the locations of obscured features. However, sensor plates that are near the ends of the group may not respond to obscured features in the same manner as the plates that are near the center. This issue may be particularly evident when the obscured feature detector is moved from a thinner, or less dense, surface to a thicker, or more dense, surface.

Ideally, each of the sensor plates on a thicker surface would have similar sensor readings to each other, because the sensor plates are all on the same surface, with no obscured features present. However, the sensor readings of the sensor plates near the ends may see a larger reading increase than the sensor plates near the center. The sensor plates that are at the ends are alone in creating the electric fields that are beyond the group of sensor plates. As a result, the sensor plates near the end may respond with a disproportionately higher reading when placed on a thicker surface. Accordingly, the controller may have difficulty determining if the elevated sensor readings are due to the presence of an obscured feature, or due to the detector being placed on a thicker surface. This disclosure provides a solution.

In obscured feature detectors with multiple sensor plates it is desirable for each sensor plate to have a similar response to the same obscured feature. To ensure a similar response from each sensor plate, proper geometric shape and arrangement of the sensor plates can ensure an equivalent response to an obscured feature. Improved shielding of sensor plate traces may also improve performance. In addition, enhanced electrical coupling of the user to the sensing circuit may provide improved performance. Also, a mechanism to ensure that the sensor plates are flat against the surface may improve performance.

The present disclosure is directed to obscured feature detectors and methods of detecting obscured feature detectors. In the exemplary embodiments, an obscured feature detector comprises a group of sensor plates, a multi-layer printed circuit board (PCB), a sensing circuit, a controller, a display circuit, a power controller, and/or a housing.

The disclosed embodiments help maintain uniform or near uniform electric field lines generated by the group of sensor plates. Specifically, the electric field of two end sensor plates in the group of sensor plates is substantially similar to the electric field of the non-end sensor plates. The electric fields produced by the end sensor plates and the non-end sensor plates may be oriented transverse relative to each other.

The disclosed embodiments enable more accurate identification of a location of an obscured feature. The disclosed embodiments can also instantly and accurately read through a variety of surfaces with different dielectric constants. In addition, the presently disclosed embodiments improve the ability to instantly and accurately read through a variety of surface thicknesses.

The disclosed embodiments also create a detector that is easier to use. Many prior art detectors require more steps, and more time and more proficiency, in order to recalibrate the unit to different surfaces to determine the locations of obscured features. The disclosed embodiments provide more reliable sensor readings. The sensor readings from the sensor plates self-adjust to the detected surface and provide a more reliable reading and have the ability to detect features more deeply. The sensor readings have significantly less surface-thickness-induced reading error. With this reading error removed, the disclosed embodiments can detect objects more deeply.

In some embodiments it may be desirable for each sensor plate to have a response that is similar to that of other sensor plates in a set of sensor plates. For example, in one embodiment, it may be desirable to have the response from each sensor plate in a group of sensor plates to be similar to the response from each other sensor plates of the group. In some embodiments, a similar response may mean that if the obscured feature detector were to be placed on or against a first surface and the readings were recorded to form a first set of readings, then, if the obscured feature detector were to be placed against a second surface (e.g., a thicker surface, a denser surface, etc.) and a second set of readings recorded, then the difference between the first set of readings and the second set of readings may be similar for each of the respective sensor plates.

Said otherwise, each of the sensor plates of an embodiment of the obscured feature detector, when placed against a first surface and remote from any support structure, et al., may produce a similar reading. For example the reading may be 100. If the obscured feature detector is then placed against another surface remote from a support structure, et al., and having a different, e.g., density, thickness, dielectric constant, etc., each sensor plate of the obscured feature detector may produce a similar value, such as 150, and the difference of the values produced by each respective sensor plate may be 50 such that the difference in values produced by each sensor plate of the group of sensor plates is essentially equal in the absence of an obscured feature (e.g., a support structure, etc.). Any variation in the values (or differences of values) produced by the group of sensor plates may be attributable, therefore, to a presence of an obscured feature (e.g., a support structure, etc.).

In a typical embodiment, the presence of a support structure, e.g., a framing stud, behind a surface against which the obscured feature detector is placed may produce a distinct variance in the reading of each sensor plate which overlies the support structure behind the surface. For example, a first sensor plate detecting a framing stud behind a surface may produce a reading increase of, e.g., 50. Each other sensor plate passing or lying over the framing stud may likewise produce a reading increase of similar magnitude. Furthermore, each sensor plate may produce a similar degree of variance while the particular sensor plate overlies the support structure. Furthermore, supporting structures having different characteristics, e.g., density, thickness, material, etc., may produce distinctive variances, each such distinctive variance may be similar for each respective sensor plate. Thus, the obscured feature detector may serve to both identify a presence of a support structure and to distinguish to some degree between support structures having substantial distinctions. For example, steel provides a much stronger signal than wood and in some embodiments it may be possible to distinguish between wood and steel.

A sensor plate of an embodiment may have a rectangular shape, a trapezoidal shape, a triangular shape, or a complex-geometry shape (e.g., an asymmetric shape, an irregular shape), in order to produce a more uniform sensor field among a plurality of sensor plates in a sensor plate group. In other words, the shape of each sensor plate in a sensor plate group may be formed so as to produce a similar signal response in each of the sensor plates in the sensor group. Asymmetric or irregular shapes of at least some of the sensor plates may make it possible to achieve a similar response across each of the sensor plates by allowing a better tuning for a more similar response. For example, in an embodiment wherein the sensor plate group comprises a plurality of sensor plates arranged generally in a row, the sensor plates near the center of the row may be uniformly (or approximately uniformly) rectangular while each successively distal sensor plate to either side of the central rectangular sensor plates may take a different form so as to "tune" the signal field across the collection of sensor plates to be more uniform than may result from using exclusively a single geometric form for all of the sensor plates. A preferred shape of each sensor plate, and a preferred configuration of a collection of sensor plates of a sensor plate group may be identified through prototype testing according to methods known to persons having ordinary skill in the art, including physical prototype testing and computer-based simulation testing.

For example, the shapes of the sensor plates may be determined by testing physical prototypes by cutting various sensor plate shapes and testing them. To find desired sensor plate shapes, various shapes may be tested in various conditions, such as with different surface thicknesses and on surfaces with different dielectric constants. Then the results of various tests would need to be compared to determine the magnitude of variation in sensor plate readings. In some embodiments the sensor plate design that minimizes the variation in readings across various test conditions may be selected. The process of testing physical prototypes to determine the ideal sensor plate design may be effective, but may be unusually burdensome for some embodiments.

Simulation testing is another example of a way to determine shapes of sensor plates. In some embodiments, the shapes of sensor plates may be determined by simulating them with software, such as by using finite element analysis software to simulate static electric fields. Other approaches for analyzing fields to determine shapes of plates may include method of moments (MoM) approaches, finite difference time domain (FDTD) approaches, etc. Available software can be used to perform these functions. By way of non-limiting example, finite element analysis may be used to find sensor plate shapes that provide the most similar response across all of the target conditions.

In some embodiments, different simulation models can be built that represent different target conditions. For example it may be beneficial to run models with three different surface thicknesses, each with three different dielectric constants, which would be a total of nine different models. In this way, nine different target conditions can be tested. Each model may be tested individually to determine the simulated readings on the sensor plates. Then the results of various simulation tests can be compared to determine the magnitude of variation in sensor plate readings. In some embodiments the sensor plate design that minimizes the variation in readings may be selected. It may be possible to test different sensor plate shapes to determine designs that minimize variation in sensor plate readings across each of the target conditions.

In some embodiments, one approach to prototyping and/or simulation testing may be to divide the sensor plates into sections and then simulate individual sections independently. Those skilled in the art will appreciate that the concept of superposition may be relied upon to combine fields resulting from sections by adding the fields together to obtain the total resulting fields.

Prototyping and/or simulation testing may be used to identify ideal shapes (potentially including thicknesses and/or constituency) for sensor plates and ideal configurations of sensor plates to produce uniform or near-uniform and consistent signal responses when used for the purpose of identified obscured features.

The present disclosure will now be described more fully with reference to the accompanying drawings. This disclosure may, however, be embodied in many different forms and should not be construed as limited to the embodiments set forth herein; rather, these embodiments are provided by way of illustration only so that this disclosure will be thorough, and fully convey the full scope to those skilled in the art.

Figure 1:
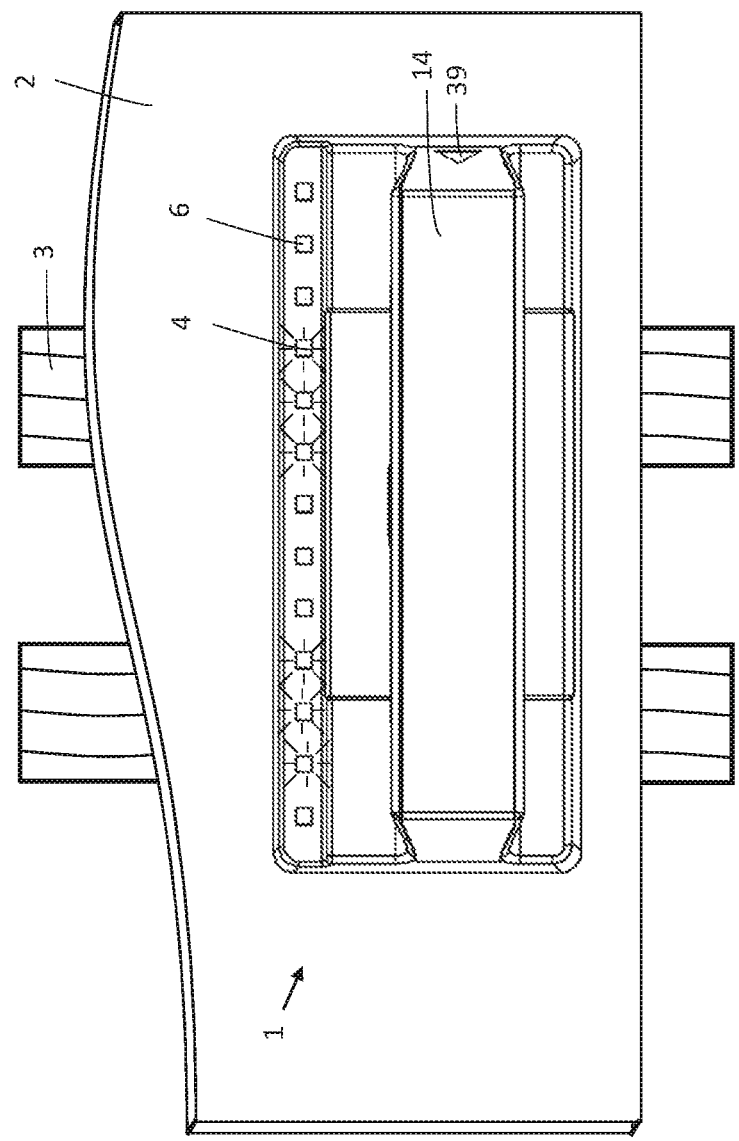
FIG. 1 illustrates an advanced obscured feature detector, according to one embodiment, placed on a piece of sheetrock and detecting an obscured feature.
Figure 2:
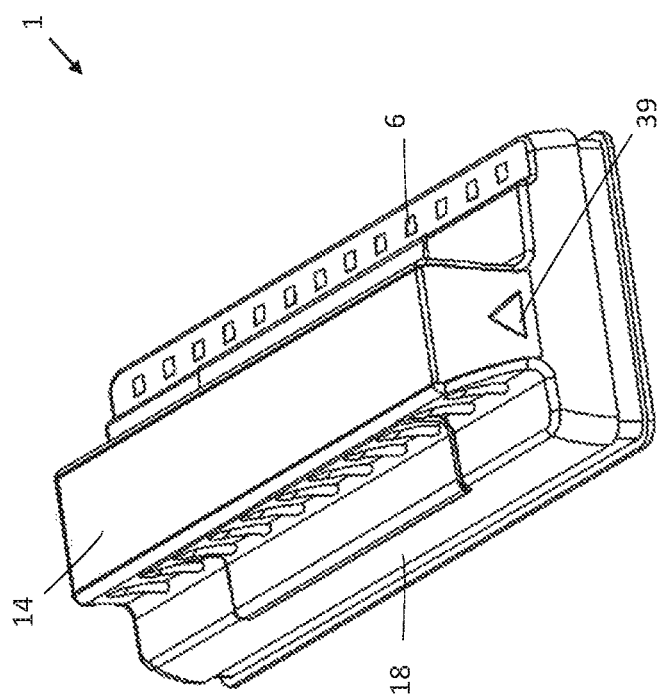
FIG. 2 is a perspective view of the obscured feature detector of FIG. 1.
Figure 3:
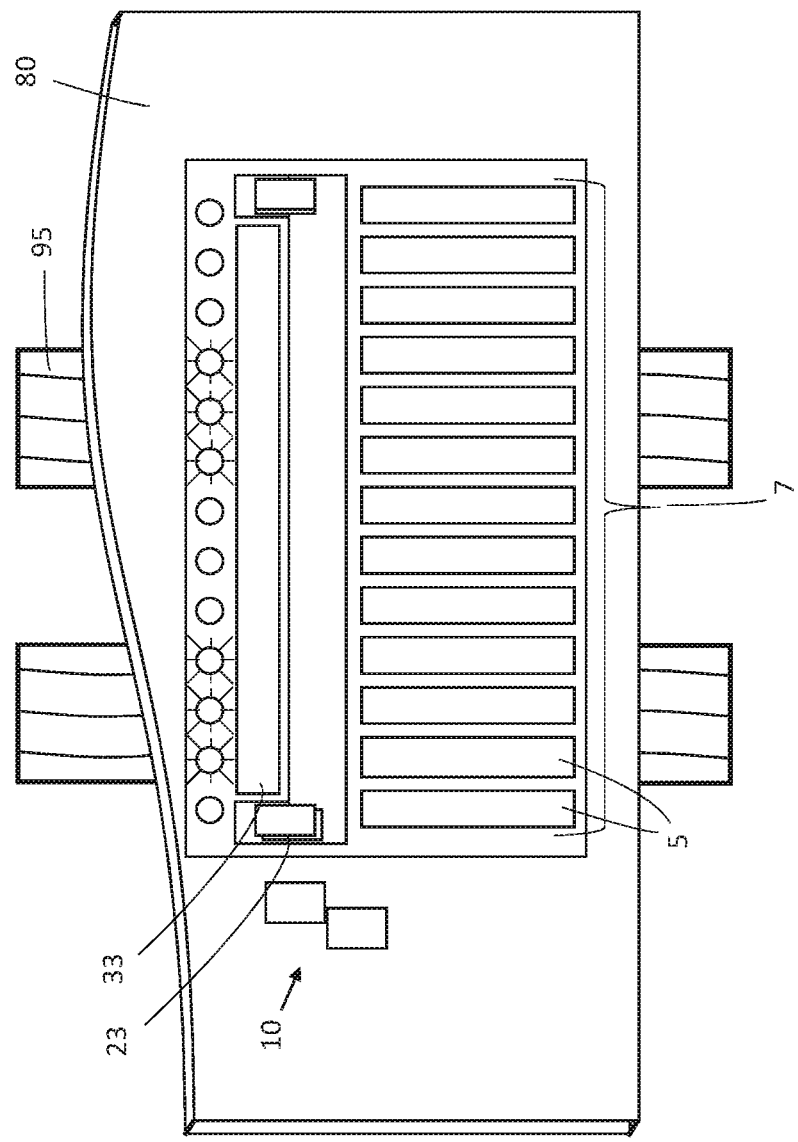
FIG. 3 is an illustrative drawing that shows sensor plates and activated indicators of the obscured feature detector of FIG. 1, with the activated indicators signaling a position of the hidden obscured feature.

FIG. 1 illustrates an obscured feature detector 1, according to one embodiment, placed on a piece of sheetrock 2 (or similar surface) and detecting an obscured feature 3. FIG. 2 is a perspective view of the obscured feature detector 1 of FIG. 1. FIG. 3 shows a sensor side of the obscured feature detector 1, which includes a plurality of sensor plates 5 and a shortened common plate 33.

With reference to FIGS. 1-3, generally and collectively, the obscured feature detector 1 includes three or more sensor plates 5, a sensing circuit (see FIG. 4), one or more indicators 6, one or more proximity indicators 39, and a housing 19 to provide or otherwise accommodate a handle 14, an active shield plate 23, and a battery cover 28.

The three or more sensor plates 5 each can take a sensor reading that varies based on a proximity of the sensor plate 5 to one or more surrounding objects and on a material property of each of the one or more surrounding objects. The three or more sensor plates 5 may collectively create a sensing field. Each individual sensor plate 5 of the three or more sensor plates 5 may create a corresponding primary sensing field zone that may be a geometric three-dimensional volume within the sensing field where the individual sensor plate 5 contributes more strongly to the sensing field than any other of the three or more sensor plates 5. The three or more sensor plates 5 may all create primary sensing field zones that are geometrically similar. The sensing circuit may couple to the three or more sensor plates 5 to measure the sensor readings of the three or more sensor plates 5.

Each sensor plate 5 forms a first end of a corresponding electric field. The electric field is produced or received at the sensor plates 5. An area on the common plate 33 may form a second end of the corresponding electric field of each sensor plate 5. The common plate 33 has a length extending along one side of each of the sensor plates 5. The length of the common plate 33 is less than a collective linear dimension of the sensor plates 5. In some embodiments, the common plate 33 is coupled to a non-changing voltage. In some embodiments the common plate 33 is coupled to the circuit ground. In some embodiments the common plate 33 is coupled to an alternating signal.

In some embodiments each sensor plate 5 may be part of a group 7 or array of sensor plates 5. Each group 7 may include two or more sensor plates 5 and may also include an active shield plate 23. The sensor plates 5 and active shield plate 23 may be on different planes. Nevertheless, if they are driven simultaneously, in some embodiments, they may be part of the same group 7 of sensor plates 5. Each sensor plate 5 has a geometry that is defined by its shape. Each sensor plate 5 also has a perimeter. In some embodiments the perimeter may be composed of multiple segments. In some embodiments each segment of the perimeter is either an internal border 10 or an external border 11. In some embodiments, if a sensor plate 5 has a segment of the perimeter that is adjacent to the perimeter of the group 7, then said segment comprises an external border 11. In some embodiments, if a sensor plate 5 has a segment of the perimeter that is not adjacent to the perimeter of the group 7, then said segment comprises an internal border 10.

In some embodiments to sense the location of an obscured feature 3, a sensor plate 5 may be driven with a current source, and the obscured feature detector 1 measures the time it takes for the sensor plate 5 to reach a certain threshold voltage, thereby achieving a sensor reading. In other embodiments a charge-share mechanism, or sigma delta converter is used to achieve a sensor reading. Other sensing circuits may also be employed. In other embodiments a radio frequency signal is placed on the sensor plates 5 to achieve a sensor reading. In each of these embodiments a signal is driven on the sensor plate(s) 5 to be sensed.

In some embodiments, only a single sensor plate 5 may be driven at a time. In these embodiments the single sensor plate 5 may be alone in creating the sensing field.

In some embodiments, the group 7 of sensor plates 5 may all be driven with the same signal simultaneously. In these embodiments the group 7 of sensor plates 5 may create the sensing field. In some embodiments multiple sensor plates 5 may be driven simultaneously each with the same signal, although possibly only a single sensor plate 5 may be sensed. Advantageously driving multiple sensor plates 5 simultaneously may create field lines that go deeper into an obscured surface than may be possible if only a single sensor plate 5 is driven. Deeper field lines may make it possible to sense more deeply. In some embodiments the group 7 of sensor plates 5 and the active shield plate 23 may all be driven with the same signal simultaneously, which together would create the sensing field.

Each sensor plate 5 has a primary sensing field zone. In some embodiments the primary sensing field zone is a geometric three-dimensional volume of the sensing field and associated field lines where the individual sensor plate 5 is able to sense more strongly than the active shield plate 23 (if present) or any other sensor plate 5. In some embodiments it is desirable for each sensor plate 5 to have similar primary sensing field zones. In some embodiments it is desirable for each sensor plate 5 to have primary sensing field zones that are geometrically similar and to have similar sensing fields within their respective primary sensing field zones.

FIG. 3 illustrates thirteen sensor plates 5 arranged linearly to form a sensor array 7. Each of the sensor plates 5 is rectangular. Each sensor plate 5 is configured to take a sensor reading that varies based on the proximity of the sensor plate 5 to one or more surrounding objects and on a material property of each of the one or more surrounding objects.

In some embodiments, as shown in FIG. 3, the sensor array 7 may comprise sensor plates 5 that each have a similar geometry. In some embodiments the distance between adjacent sensor plates 5 may be approximately 2.0 mm. As shown, a shortened common plate 33 extends along the sensor array 7 along one side of each of the sensor plates 5. The length of the shortened common plate 33 is less than the collective linear dimension of the sensor array 7. In some embodiments, the shortened common plate 33 may not extend along a side of one or both of the end sensor plates.

In FIG. 3 a sensing field may be created collectively by the sensor plates 5. In some embodiments an active shield plate 23 may contribute to the sensing field. In the embodiment of FIG. 3 each of the sensor plates 5 may have similar primary sensing field zones. In this embodiment, the shortened common plate 33 causes each sensor plate 5 to have primary sensing zones that are more geometrically similar as explained in more detail with reference to FIGS. 12, 15, and 16. Likewise, each of the sensor plates 5 may also have similar sensing fields within their respective primary sensing field zones. As a result, an obscured feature detector 1 that is built with a configuration of FIG. 3 may offer improved performance. When the obscured feature detector 1 is moved from a thin surface to a thicker surface the sensor readings for each of the sensor plates 5 may have a similar increase in value.

In some embodiments a sawtooth-shape border or perimeter may have the same effective border as a straight-line border that does not have a sawtooth. In some embodiments a border with a very slight curve may have the same effective border as a straight-line border that does not have a slight curve. In some embodiments a sensor plate 5 with a slot in it has the same effective geometry as an otherwise equivalent sensor plate 5 without a slot. In some embodiments a sensor plate 5 with a small hole in it may have the same effective geometry as an equivalent sensor plate 5 without a hole. Many other geometries are possible that may be effectively equivalent to other substantially equivalent geometries. Many other borders are possible that may effectively be equivalent to other substantially equivalent borders. If a geometry or a border has a property that is effectively equivalent to another geometry or border, then the two may be considered to be similar.

In some embodiments the group 7 of sensor plates 5 is configured such that each sensor plate 5 in the group 7 has the same geometry. In some embodiments each of the sensor plates 5 in the group 7 is radially symmetrical.

The plurality of indicators 6 may be toggled between a deactivated state and an activated state to indicate a location of a region of relative high sensor reading. Activated indicators 4 can indicate the position of the obscured feature 3. Proximity indicators 39 can indicate that the obscured feature detector 1 may be near the obscured feature 3.

In FIGS. 1-3, the indicators 6 are positioned on a layer above the sensor plates 5. In some embodiments there may be an active shield plate 23 between the sensor plates 5 and the indicators 6 so that the indicators 6 do not interfere with the function of the sensor plates 5. In some embodiments it may be desirable to position the indicators 6 on a layer above the sensor plates 5.

In some embodiments, a layer of protective material is mounted to the bottom of the obscured feature detector housing, such that there is a layer of protective material between the surface 2 (e.g., sheetrock) and the obscured feature detector 1. In some embodiments, the protective material has the interior substantially filled such that it is substantially free from cavities. In some embodiments the protective material is unlike felt, Velcro, cloth, or other materials that have an interior with cavities. The layer of protective material may serve the purpose of protecting the bottom of the obscured feature detector 1 from damage due to knocks, bumps, and wear-and-tear. The protective material could be made from a solid piece of material, such as plastic or other solid non-conductive materials. A solid layer of plastic may provide a low friction surface that would allow the obscured feature detector 1 to slide across the wall. Although some embodiments of the obscured feature detector 1 do not require sliding to operate, a low friction surface may be useful to some users who may choose to move the obscured feature detector 1 from position to position by sliding it.

The protective layer of plastic may be mounted with a pressure sensitive adhesive, glue, or other means. The layer of protective material may be a complete layer that covers the entire surface; it may be rectangular strips, round pieces, or other layers of plastic with other geometries.

A protective material that is substantially filled such that it is substantially free from cavities may build up less static charge than prior art solutions and may advantageously provide for more consistent sensor readings.

In some embodiments the protective material is UHMW-PE (Ultra-High Molecular Weight Polyethylene). UHMW-PE has a low coefficient of friction. UHMW-PE also absorbs very little moisture which may provide increased immunity from changes in humidity, and may provide enhanced immunity from changes in humidity.

Figure 4:
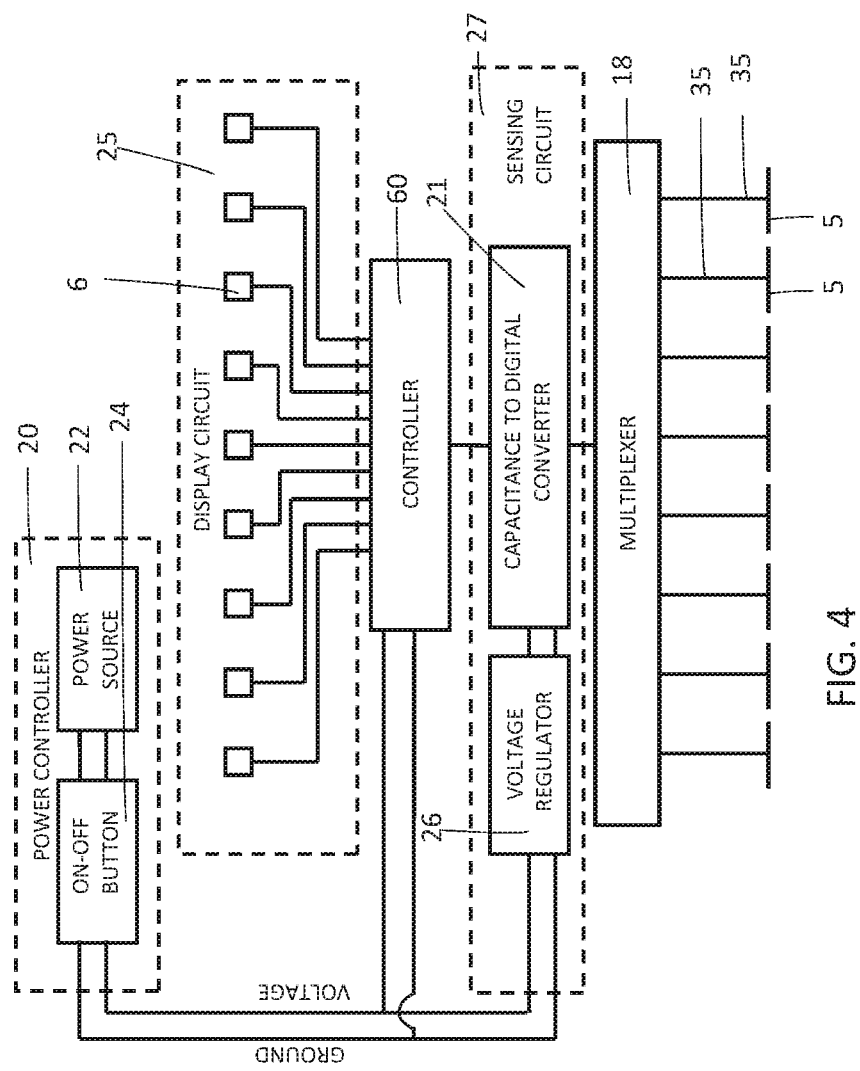
FIG. 4 is a diagram of a circuit of an obscured feature detector, according to one embodiment.

FIG. 4 is a diagram of a circuit of an obscured feature detector 1, according to one embodiment. The circuit includes a multiplexer 18, a power controller 20, a display circuit 25, a sensing circuit 27, and a controller 60.

The power controller 20 may include a power source 22 and an on-off button 24. The power source 22 can comprise an energy source for powering the indicators 6 and supplying power to a capacitance-to-digital converter 21, and the controller 60. In some embodiments, the power source 22 can comprise a DC battery supply. The on-off switch 24 can be used to activate the controller 60 and other components of the obscured feature detector 1. In some embodiments, the on-off switch 24 comprises a push-button mechanism that activates components of the obscured feature detector 1 for a selected time period. In some embodiments the push button activates the components such that the components remain activated until the button is released. In some embodiments the on-off switch 24 comprises a capacitive sensor that can sense the presence of a finger or thumb over the button. In some embodiments, the on-off switch 24 can comprise a toggle switch or other types of buttons or switches.

The display circuit 25 may include one or more indicators 6 that are electronically coupled to the controller 60.

The sensing circuit 27 may include a voltage regulator 26 and the capacitance-to-digital converter 21. In some embodiments, as shown in FIG. 4, the sensing circuit 27 comprises a plurality of sensors, the voltage regulator 26, and the capacitance-to-digital converter 21. The voltage regulator 26 may be used to condition the output of the power controller 20, as desired. In some embodiments the voltage regulator 26 is placed as near as possible to the capacitance-to-digital converter 21, which may provide a better power source 22 to the capacitance-to-digital converter 21. The sensing circuit 27 can be electrically coupled to the controller 60. One or more sensor plate traces 35, or electrically conductive paths on the PCB, may connect the individual sensor plates 5 to the capacitance-to-digital converter 21. The connection of the sensor plates 5 to the capacitance-to-digital converter 21 may be made via the multiplexer 18. The multiplexer 18 can individually connect the sensor plates 5 to the capacitance-to-digital converter 21.

In some embodiments the multiplexer 18 may connect a single sensor plate 5 to the sensing circuit 27. In some embodiments, the multiplexer 18 may connect more than one adjacent sensor plate 5 to the sensing circuit 27. In some embodiments, the multiplexer 18 may connect more than one non-adjacent sensor plate 5 to the sensing circuit 27. In some embodiments, the multiplexer 18 is configured so that the sensing circuit 27 measures the capacitance of one sensor plate 5. In some embodiments, the multiplexer 18 is configured so that the sensing circuit 27 measures the aggregate capacitance of two or more sensor plates 5.

Each individual sensor plate 5 of a group 7 can be independently connected to the capacitance-to-digital converter 21 via the multiplexer 18. In some embodiments, the group 7 itself is composed of layers of copper on a PCB.

In some embodiments a two-layer PCB is configured as a sensor plate board 40 (see FIG. 6). In some embodiments a first layer of the sensor plate board 40 comprises the sensor plates 5, and a second layer of the sensor plate board 40 comprises a shield. In some embodiments, the shield is composed of a layer of copper that covers the entire surface of the second layer of the PCB. In some embodiments the layer of copper is covered with a non-conductive layer of soldermask. In some embodiments there are holes in the layer of soldermask. In some embodiments, the holes in the layer of soldermask comprise solder pads that are suitable for making solder bonds.

In some embodiments a four-layer PCB is configured as an interconnection board that has interconnections suitable for connecting circuitry components. In some embodiments the interconnection board is configured with four layers of interconnections that are suitable for interconnecting the sensing circuit 27, the controller 60, and the display circuit 25. In some embodiments one side of the PCB is configured for mounting components, and a second side of the PCB is configured with solder pads.

In some embodiments the sensor plates 5 are arranged on a first PCB. In some embodiments the interconnection circuitry is arranged on a second PCB. In some embodiments the first PCB is bonded to the second PCB.

In some embodiments there are solder pads on the sensor plate board 40 that are complementary with solder pads on an interconnection board. In some embodiments the sensor plate board 40 and the interconnection board may be stacked on top of one another and bonded to each other. In some embodiments the bonding agent that bonds the two PCBs together may be solder. In some embodiments solder paste may be used to bond two PCBs together. In some embodiments, they may be bonded together with solder and the process to bond them together may be standard SMT (surface mount technology) processes. The standard SMT process may include using a stencil to place solder paste in the desired locations. The SMT process may include placing one PCB on top of another. In some embodiments pins may be used to ensure proper alignment of the two PCBs. In some embodiments the final step of the SMT process may involve running the stacked PCBs through a reflow oven.

In some embodiments the sensor plates 5, shield, and circuitry are placed on a single PCB. In some embodiments a six-layer PCB is used. In some embodiments the bottom layer, which is the sixth layer, of the PCB is configured with the sensor plates 5. The fifth layer may be an active shield. The top four layers may connect the balance of the circuitry.

In some embodiments the sensor plates 5, shield, and circuitry are placed on a single PCB. In some embodiments a four-layer PCB is used. First and second layers of the PCB are configured with interconnection circuitry. In some embodiments the bottom layer, which is the fourth layer, of the PCB is configured with the sensor plates 5. The third layer may be an active shield.

The PCB can be made from a variety of suitable materials, such as, for example, FR-4, FR-406, or more advanced materials used in radio frequency circuits, such as Rogers 4003C. Rogers 4003C, and other radio-frequency-class PCB substrates, may offer improved performance across a broader temperature and humidity range.

As used herein, the term "module" can describe any given unit of functionality that can perform in accordance with one or more embodiments of the present invention. For example, a module might by implemented using any form of hardware or software, or a combination thereof, such as, for example, one or more processors, controllers 60, ASICs, PLAs, logical components, software routines, or other mechanisms.

Different processes of reading a capacitance and converting it to a digital value, also known as a capacitance-to-digital conversion, are well-described in the prior art. The many different methods are not described here, and the reader is referred to the prior art for details about different capacitance-to-digital converter methods. Some embodiments use a sigma-delta capacitance-to-digital converter, such as the one that is built into the Analog Devices AD7747 integrated circuit. Some embodiments use a charge-sharing method of capacitance-to-digital conversion.

In some embodiments the voltage regulator 26 may comprise the ADP150-2.8 from Analog Devices, or the NCP702 from ON Semiconductor, which provide very low noise. In some embodiments, the controller 60 may comprise the C8051F317 from Silicon Laboratories, or any of many other microcontrollers.

Detecting obscured features 3 can require a high degree of accuracy, and may require more accuracy than the capacitance-to-digital converter 21 may be able to provide, if the native capacitance-to-digital converter 21 sensor readings are used alone. Native sensor readings are the raw values read from the capacitance-to-digital converter 21; they are the digital output of the capacitance-to-digital converter 21.

Some embodiments perform native reads multiple times, and combine the results of the multiple native reads, to create a reading. Some embodiments perform native reads multiple times, and combine the results of the multiple native reads, using a different configuration for two or more of the native reads to create a reading. Some embodiments perform native reads multiple times, and sum or average the results of the multiple native reads, to create a reading. In some embodiments this improves the signal-to-noise ratio. Each native read may involve reading one sensor plate 5. A native read could also involve reading a plurality of sensor plates 5, if multiple sensor plates 5 are multiplexed to the capacitance-to-digital converter 21. In some embodiments multiple native reads are combined to create a reading.

Summing or averaging multiple native reads may improve the signal-to-noise ratio, but may not reduce the effect of non-linearities in the capacitance-to-digital converter 21. The ideal capacitance-to-digital converter 21 is perfectly linear, which means that its native sensor readings increase in direct proportion to an increase in the capacitance being sensed. However, many capacitance-to-digital converters 21 may not be completely linear, such that a change in the input capacitance does not result in an exactly proportional increase in the native reading. These non-linearities may be small, but when a high degree of accuracy is desired it may be desirable to implement methods that reduce the effects of the non-linearities.

In some embodiments, the ill effects of the non-linearities may be mitigated by summing multiple native reads, using a slightly different configuration for each of the native reads. Some embodiments perform native reads using two or more different configurations.

For example, the bias current is one parameter that can be altered to create different configurations. The bias current could be set to normal, or normal +20%, normal +35%, or normal +50%. Different bias currents produce different native sensor readings, even if all other factors remain constant. Since each native reading has a different value, presumably each native reading may be subject to different non-linearities. Presumably summing or averaging sensor readings that are subject to different non-linearities may cause the non-linearities to partially cancel each other out, instead of being summed or multiplied.

In some embodiments there are two separate and independent capacitance-to-digital converters 21. In some embodiments each of them may have different non-linearities. Using both of the capacitance-to-digital converters 21, using the first converter for some of the reads and using the second converter for some of the reads, may mitigate the effect of any single non-linearity.

Some embodiments perform native reads on each of the sensor plates 5 using each of twelve different configurations.

After completing the sensor readings, in some embodiments, two different calibration algorithms may be performed: first an individual-plate calibration that adjusts for individual sensor plate 5 variations, and second a surface material calibration that adjusts the sensor readings so that they are tuned to the surface density/thickness. Other embodiments may only use one of the two calibration algorithms. Some embodiments may use other calibration algorithms. In some embodiments the calibration algorithms are performed by a calibration module.

In some embodiments, individual plate calibration is employed first. With individual plate calibration, each sensor plate 5 may have its own individual calibration value. In some embodiments, after the sensor readings are taken, an individual plate calibration value is added to, or subtracted from, each of the sensor readings. Other embodiments may use multiplication, division, or other mathematical functions to perform the individual plate calibration. In some embodiments, the individual plate calibration value is stored in non-volatile memory. Individual plate calibration compensates for individual sensor plate 5 irregularities, and is used to compensate for these irregularities. In some embodiments it is presumed that after performing individual plate calibration that the sensor readings will presumably have the same calibrated values, if the sensor plate sensor readings are taken while the obscured feature detector 1 is on the surface 2 that is similar to the surface 2 the obscured feature detector 1 was calibrated on. For example, if sensor readings are performed on ½" sheetrock 2, without any obscured features 3 present, and the individual calibration values were created for ½" sheetrock 2, then after performing individual plate calibration, it is presumed that all the sensor readings would be corrected to a common value. If sensor readings are performed on a thicker material (such as ⅝" sheetrock 2), a thinner material (such as ⅜" sheetrock 2) or a different material (such as ¾" plywood) then there may be some error in the values. Surface material calibration may help correct this error.

In some embodiments surface material calibration may be used.

In some embodiments, after calibrating the sensor plate sensor readings the obscured feature detector 1 decides if an obscured feature 3 is present. In some embodiments the lowest sensor plate reading is subtracted from the highest sensor plate reading. If the difference is greater than a threshold value then a determination is made that an obscured feature 3 is present.

If it is determined that no obscured features 3 are present, then all of the indicators 6 may be deactivated. If an obscured feature 3 is present then the obscured feature detector 1 begins the process of determining the position(s) and width(s) of the obscured feature(s) 3.

In some embodiments pattern matching may be employed to determine which LEDs to activate. In some embodiments a pattern matching module is used to determine the locations of the obscured features 3. The pattern matching module compares the calibrated and scaled sensor readings from the sensor plates 5 to several predetermined patterns. The pattern matching module determines which predetermined pattern best matches the sensor readings. Then the set of indicators 6 that corresponds to the best matching pattern is activated. Additional details about pattern matching are discussed in the prior art, such as in U.S. Pat. No. 8,884,633. Those details will not be repeated here; instead the reader is encouraged to refer to them directly.

In some embodiments the obscured feature detector 1 comprises a single capacitance-to-digital converter 21. In some embodiments the sensor plates 5 may be individually connected to the capacitance-to-digital converter 21. In some embodiments the sensor plates 5 may be individually connected to the capacitance-to-digital converter 21 via the multiplexer 18. In some embodiments more than one sensor plate 5 may be connected to the capacitance-to-digital converter 21 at a time. In some embodiments multiple adjacent sensor plates 5 may be electrically connected to the capacitance-to-digital converter 21. In some embodiments multiple non-adjacent sensor plates 5 may be connected to the capacitance-to-digital converter 21. The use of a multiplexer 18 to connect sensor plates 5 to a single capacitance-to-digital converter 21 may improve sensor plate 5 to sensor plate 5 consistency of the sensor readings, because the sensor readings from each of the sensor plates 5 may be equally affected by variations to the capacitance-to-digital converter 21. Factors that may affect the sensor readings from the capacitance-to-digital converter 21 may include, but are not limited to, process variations, temperature variations, voltage variations, electrical noise, aging, and others.

In some embodiments, the sensor plate traces 35 are routed such that each of the sensor plate traces 35 has substantially equal capacitance, resistance, and inductance. In some embodiments it is desirable for each of the sensor plate traces 35 to have the same electrical properties, so that each of the sensor plates 5 will respond equivalently to the same detected object(s).

In some embodiments each of the sensor plate traces 35 from the capacitance-to-digital converter 21 to each of the sensor plates 5 has substantially the same length. In some embodiments two or more of the sensor plate traces 35 from the capacitance-to-digital converter 21 to the sensor plates 5 have substantially the same length. In some embodiments sensor plate traces 35 with substantially the same length may have more equivalent capacitances, inductances, and resistances. Equal length sensor plate traces 35 may offer enhanced performance because they may improve the uniformity of the sensor readings, such that the sensor plates 5 respond more equivalently to the same detected objects, and may provide more immunity from environmental conditions, such as temperature and humidity.

In some embodiments each of the sensor plate traces 35, which comprises electrically conductive paths, has substantially the same width. In some embodiments, both the width and the length of each of the sensor plate traces 35 are substantially equivalent. In some embodiments the sensor plate traces 35 will have more than one segment. For example, a first segment of the traces may route the sensor plate traces 35 from a capacitance-to-digital converter 21 to a via. The via may take the sensor plate trace 35 to a different layer of the PCB, where there may be a second segment of the sensor plate trace 35. In some embodiments all of the sensor plate traces 35 will have the same length and width, in each segment, as the other traces in that segment. In some embodiments two or more of the sensor plate traces 35 will have the same width throughout a first segment. In some embodiments two or more of the sensor plate traces 35 will have the same width throughout a second segment. In some embodiments two or more of the sensor plate traces 35 will have the same length throughout a first segment. In some embodiments two or more of the sensor plate traces 35 will have the same length throughout a second segment.

In some embodiments the sensor plate traces 35 comprise multiple segments. In some embodiments a segment of a sensor plate trace 35 may be the wire bonds that are within the package of an integrated circuit that route the signals from the piece of silicon to the pins of the integrated circuit package. In some embodiments a segment of a sensor plate trace 35 may comprise a layer of copper on a first layer of a PCB. In some embodiments a segment of a sensor plate trace 35 may comprise a layer of copper on a second layer of a PCB.

In some embodiments the capacitance-to-digital converter 21 will read the sum of the capacitance on the sensor plates 5 and the capacitance on the sensor plate traces 35. In some embodiments, only detecting the sensor readings on the sensor plates 5, and not detecting the sensor plate traces 35, may be preferable. However, because the sensor plates 5 and sensor plate traces 35 are electrically coupled, a means of ensuring stable and uniform capacitance on the sensor plate traces 35 may be desired. For example, it may be desirable to configure the sensor plate traces 35 so that their capacitance is uniform and stable. Consequently, it may be preferred for the sensor plate traces 35 to be configured so that the sensor plate traces 35 do not change. In some embodiments it may be preferred that the sensor plate traces 35 do not change relative to each other, such that any change in the capacitance on one sensor plate trace 35 is reflected in each of the sensor plate traces 35.

In some embodiments it may be advantageous to shield the sensor plate traces 35. Sensor plate trace shielding may protect the sensor plate traces 35 from external electromagnetic fields. In some embodiments shielding the sensor plate traces 35 may also advantageously provide a more consistent environment for the sensor plate traces 35 by helping to ensure that each of the sensor plate traces 35 has an environment that is similar to each of the other sensor plate traces 35.

In some embodiments each of the sensor plate traces 35 from the capacitance-to-digital converter 21 to each of the sensor plates 5 has substantially the same surroundings. In some embodiments the sensor plate traces 35 are routed sufficiently far apart so that capacitive and inductive coupling between the sensor plate traces 35 is minimized, and may improve consistency because each of the sensor plate traces 35 may have surroundings that are more similar to the other sensor plate traces 35. In some embodiments each of the sensor plate traces 35 is shielded on one or both sides with an active shield trace.

In some embodiments a user may be electrically coupled to the sensing circuit 27. In some embodiments the quality of the sensor readings is increased when an electrically conductive point of the sensing circuit 27 is coupled to the user. Electrically coupling the user to the sensing circuit 27 may provide a stationary voltage level for the sensing circuit 27 and may result in higher quality sensor readings that have higher sensitivity. For example, a prior art obscured feature detector that drives the sensor plates 5 with a 3.0V may in reality only drive the sensor plates 5 with a 3.0V signal relative to ground. However, if the ground is floating, then driving the sensor plates 5 with 3.0V could result in a 1.5V signal on the sensor plates 5 and a −1.5V signal on the ground. In some embodiments the quality of the sensor readings is not increased when an electrically conductive point of the sensing circuit 27 is coupled to the user.

In some embodiments electrically coupling the user to the sensing circuit 27 may result in higher absolute voltage swings on the sensor plates 5, which may be due in part to the sensing circuit 27 being held at a stable level. In some embodiments electrically coupling the user to the sensing circuit 27 may also result in sensor readings that are more consistent.

In some embodiments the user is electrically coupled to the ground of the sensing circuit 27, as shown in FIG. 4. In some embodiments the user is electrically coupled to the voltage source of the sensing circuit 27. In some embodiments the user is electrically coupled to a different electrically conductive point of sensing circuit 27.

In some embodiments the hand of the user may be electrically coupled to the sensing circuit 27 by making direct contact with the sensing circuit 27. In some embodiments an electrically conductive material, such as a wire, may electrically couple the hand of the user to the sensing circuit 27. In some embodiments the button, which the user would need to touch to activate the obscured feature detector 1, may comprise an electrically conductive material which may be electrically coupled to the sensing circuit 27. In some embodiments the button may comprise aluminum or another electrically conductive material such as tin-plated steel. In some embodiments an aluminum button may be anodized, which may provide pleasing cosmetics.

In some embodiments the housing 19 (see FIG. 2) of the obscured feature detector 1 may comprise an electrically conductive material, such as an electrically conductive plastic. In some embodiments only a portion of the housing 19 may comprise electrically conductive plastic. The electrically conductive housing, or a portion of the electrically conductive housing, may be coupled to an electrically conductive point in the sensing circuit 27, thereby coupling the user to the sensing circuit 27.

In some embodiments mixing carbon black with the plastic resin may provide electrically conductive properties. Many thermoplastics, including polypropylene and polyethylene, become electrically conductive when a carbon black is mixed into the plastic resin. In some embodiments the conductivity increases as the concentration of carbon black is increased, advantageously making it possible to control the conductivity of the plastic. In some embodiments a plastic with a conductivity that is less than about 25,000 ohms-cm provides sufficiently high conductivity to effectively couple the user to the sensing circuit 27. In some embodiments a higher degree of conductivity may be desired. In some embodiments a lower degree of conductivity may be desired. In some embodiments it is advantageous for the user to be coupled to the sensing circuit by a path with less than about 50 mega-ohms.

In some prior art obscured feature detectors, a change in the position of the hand of the user can cause a change in the sensor readings. This may occur in some prior art obscured feature detectors because the hand may form a portion of the path between the sensor plates 5 and ground. As a result, a change in hand position can cause a change in the sensor readings of the sensor plates 5. Disadvantageously, this may reduce the accuracy of the sensor readings.

If it were possible for the size and position of the hand of the user to be constant, it may be possible to do a calibration adjustment to mathematically remove the effect of the hand of the user from the raw sensor readings. However, in practice this may not be feasible. In practice the size, shape, and position of hands of different users may vary too much to make a calibration adjustment practically possible.

To improve performance in light of the aforementioned issues, in some embodiments a conductive hand guard may be positioned between the hand of the user and the sensor plates 5. In some embodiments the hand guard may be grounded to the sensing circuit 27, as illustrated in FIG. 4.

Figure 5:
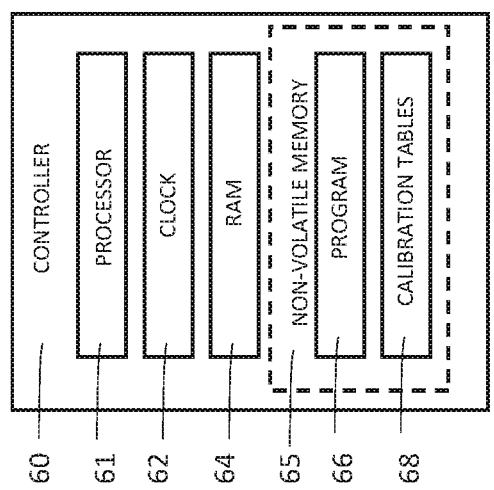
FIG. 5 is a diagram of a controller of an obscured feature detector, according to one embodiment.

FIG. 5 is a diagram of the controller 60, according to one embodiment. The controller 60 includes a processor 61, a clock 62, random access memory (RAM) 64, a non-volatile memory 65, and/or another computer-readable medium. The non-volatile memory 65 may include a program 66 (e.g., in the form of program code or computer-executable instructions for performing operations) and calibration tables 68. In operation, the controller 60 may receive the program 66 and may synchronize the functions of the capacitance-to-digital converter 21 and the display circuit 25 (see FIG. 4). The non-volatile memory 65 receives and stores the program 66 as well as look-up tables (LUT) and calibration tables 68. The program 66 can include a number of suitable algorithms, such as, for example, an initialization algorithm, a calibration algorithm, a pattern-matching algorithm, a multiplexing algorithm, a display management algorithm, an active sensor activation algorithm, and a non-active sensor management algorithm.

FIG. 6 is a cross-sectional view of an obscured feature detector, according to one embodiment, including a housing, with light pipes and a button, and a PCB. In some embodiments, as shown in FIG. 6, a housing 19 comprises an upper housing, an on-off switch 24, a handle 14, a plurality of light pipes 8, and a power supply compartment. In some embodiments a conforming core may be configured to flexibly couple the housing 19 to a sensor plate board 40. In some embodiments the sensor plate board 40 is a multi-layered PCB with a top layer 44, a second layer 43, a third layer 42, and a bottom layer 41. In some embodiments the sensor plate board 40 is a multi-layered PCB that couples a capacitance-to-digital converter 21, a display circuit 25, and a controller 60, as described above with reference to FIG. 4. In some embodiments, the housing 19 comprises plastic. In some embodiments, the housing 19 comprises ABS plastic. In some embodiments a conductive hand guard 56 shields the user's hand from the sensor plate board 40. In some embodiments the hand guard 56 is connected to the ground of a sensing circuit.

In some embodiments, the handle 14 comprises a gripping surface. In some embodiments a portion of the gripping surface comprises an elastomer that makes the handle 14 easier to grip. The handle 14 is preferably positioned so that the user's hand does not obscure a view of the indicators 6 when grasping the handle 14. In some embodiments, the power supply compartment comprises a cavity for holding a suitable power supply, such as batteries, and a battery cover for accessing the compartment.

In some embodiments the hand guard 56 may be configured so that there are no significant straight-line paths between the sensor plates and the user's hand. In some embodiments the housing 19 may be composed of an electrically conductive material which may comprise the hand guard 56. In some embodiments the conductive layer of material of the hand guard 56 may be a layer of conductive plastic. In some embodiments the conductive layer of material of the hand guard 56 may be a layer of a different conductive material, such as a conductive paint. In some embodiments the conductive layer of material of the hand guard 56 may be a sheet of metal that is hidden within the housing 19. In some embodiments the hand guard 56 may comprise segments of extruded aluminum that are soldered to the PCB. In some embodiments the hand guard 56 may comprise tin-plated steel, which may provide for quick, easy and reliable solder joints. In some embodiments an entire layer of a PCB may comprise the hand guard 56, such as the top layer of the PCB (printed circuit board). In some embodiments only a portion of a layer of a PCB may comprise the hand guard 56, because in some embodiments it may not be necessary to for the hand guard 56 to comprise an entire layer. For example, a ring around the outside of a PCB may be an effective hand guard 56.

In some embodiments the hand guard 56 is configured to minimize an effect of a size and position of the hand. In some embodiments the hand guard 56 is positioned so that it is near the hand because in some embodiments it may be most effective when it is nearest to the hand. In some embodiments the hand guard 56 may be electrically coupled to the ground of a sensing circuit 27 (see FIG. 4). In some embodiments the hand guard 56 may be coupled to the voltage of the sensing circuit 27. In some embodiments a different electrically conductive point of the sensing circuit 27 may be electrically coupled to the hand guard 56. In some embodiments an electrical wire comprises the electrical path between the hand guard 56 and the sensing circuit 27.

Figure 9:
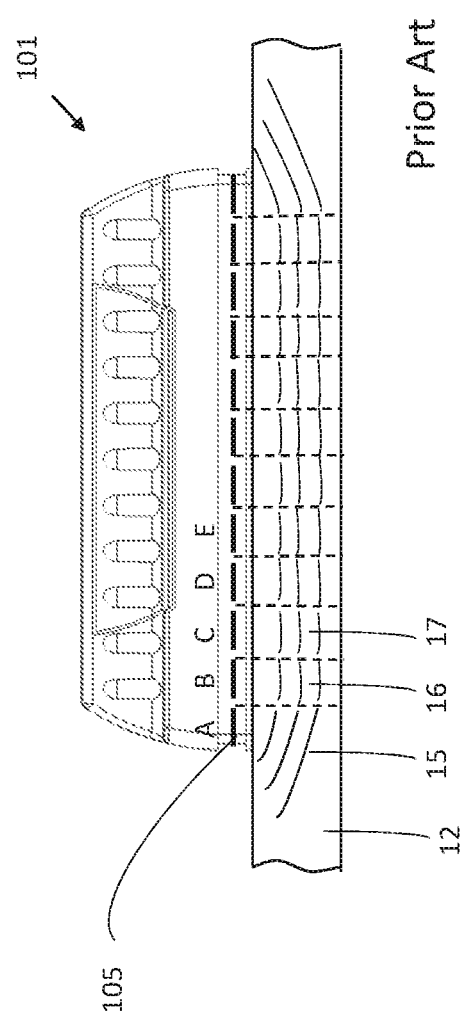
FIG. 9 shows a side view of a prior art obscured feature detector, illustrating primary sensing field zones for several sensor plates.

In prior art obscured feature detectors a set of identical sensor plates 105 are typically arranged in a linear fashion, such as is shown in FIGS. 7, 8, 9, and 10. FIG. 7 is a prior art obscured feature detector 101 placed on a comparatively thinner surface 12. FIG. 8 is the prior art obscured feature detector 101 placed on a comparatively thicker surface 13. FIG. 9 shows a side view of the prior art obscured feature detector 101, illustrating primary sensing field zones 15, 16, 17 for several sensor plates 105, including sensor plates A, B, C, D, E. FIG. 10 shows an elevation view of a bottom surface of the prior art obscured feature detector 101, illustrating the primary sensing field zones 15, 16, 17 for sensor plates A, B, C, D, E.

Referring generally and collectively to FIGS. 7-14, each of the sensor plates 105 performs a sensor reading of the surface 2. The sensor readings are then compared. The sensor plates 105 that have the highest sensor readings are interpreted to be the locations of obscured features. However, as shown in FIGS. 7 and 8, the sensor plates 105 that are near the ends of the group may not respond to obscured features in the same manner as the sensor plates 105 that are near the center. This issue may be particularly evident when the prior art obscured feature detector 101 is moved from the thinner, or less dense, surface 12, to a thicker, or more dense, surface 13.

FIG. 7 shows representative sensor readings of the prior art obscured feature detector 101 that is placed on the relatively thinner surface 12. The relatively thinner surface 12 could be 0.375-inch-thick sheetrock. FIG. 8 shows representative sensor readings of the prior art obscured feature detector 101 that is placed on a relatively thicker surface 13. The relatively thicker surface 13 could be 0.625-inch-thick sheetrock.

In FIG. 7, the prior art obscured feature detector 101 is placed on the relatively thinner surface 12. Each of the sensor plates 105 may have a calibration adjustment so that each has a calibrated reading of, for example, 100. If this same prior art obscured feature detector 101 is then moved to another surface 13 that is thicker, or to a surface that has a higher dielectric constant, the sensor readings would change. An image of the same prior art obscured feature detector 101 on the thicker surface 13 is shown in FIG. 8. Ideally, each of the sensor plates 105 on the thicker surface 13 would have similar sensor readings to each other, because they are all on the same thicker surface 13, with no obscured features present. However, it may be observed that the sensor readings of the sensor plates 105 near the ends may see a larger reading increase than the sensor plates 105 near the center. In FIG. 8, it may be seen that the sensor plates 105 near the center have sensor readings of 200, but the sensor plates 105 at the ends have sensor readings of 250.

In the prior art obscured feature detector 101 of FIG. 8, and other prior art obscured feature detectors, the sensor plates 105 that are at the ends are alone in creating electric fields 9 that extend beyond the edges of the group of sensor plates 105. As a result, the sensor plates 105 near the end may respond with a disproportionately higher reading when placed on a thicker surface 13.

Disadvantageously, the controller 60 may have difficulty determining if the elevated sensor readings are due to the presence of an obscured feature, or due to the prior art obscured feature detector 101 being placed on the thicker surface 13. The disclosed embodiments may address these and other challenges.

FIG. 9 illustrates the field lines for the prior art obscured feature detector 101 of FIGS. 7 and 8. FIG. 9 shows a group of sensor plates 105 and also shows a two-dimensional representation of the field lines for each of the sensor plates 105. The field lines are shown for illustrative purposes and are a representation of the actual sensing field. The field lines drawn are equipotential electric field lines. However, this drawing does not limit the scope of the disclosure to this type of field alone. Vector electric field lines or magnetic field lines could have been illustrated in the drawing and are within the scope of the disclosure. The sensing field may be an electric field, a magnetic field, or an electromagnetic field, which is a combination of an electric field and a magnetic field.

In FIG. 9 there are thirteen sensor plates 105. All of the sensor plates 105 may be driven with the same signal simultaneously, while one sensor plate 105 at a time is sensed. Because the sensor plates 105 are driven simultaneously, with the same signal, the sensing field is defined by the field created by the group of sensor plates 105, as illustrated in FIG. 9. An active shield plane is not illustrated in the figure, but an active shield may contribute to the sensing field in some embodiments. Five of the sensor plates 105 are labeled A, B, C, D, E. The field lines emanating from sensor plate E are primarily parallel to sensor plate E. However, the field lines emanating from sensor plate A are not very parallel to sensor plate A. Because the field lines do not have similar direction and strength at each point within the primary sensing field zone the sensor plates A and E do not have similar sensing fields within their primary sensing field zones.

In contrast, sensor plate D and sensor plate E have similar primary sensing field zones because the volume of the sensing field where they are able to sense effectively and the sensing field within that primary sensing field zone are similar. The sensing fields within a primary sensing field zone are similar if the direction of the sensing field and strength of the sensing field are similar at each point within the primary sensing field zone.

FIG. 10 illustrates the same concept from a different angle or perspective. In FIG. 10 the five sensor plates 105 are again labeled A, B, C, D, E. The approximate primary sensing field zones for each of the sensor plates 105 are highlighted. On the two-dimensional drawing of FIG. 10, the primary sensing field zone 15 for sensor plate A is indicated by the drawing of the sensing field lines for sensor plate A. On the two-dimensional drawing of FIG. 10, the primary sensing field zone 16 for sensor plate B is indicated by the drawing of sensing field lines for sensor plate B. On the two-dimensional drawing of FIG. 10, the primary sensing field zone 17 for sensor plate C is indicated by the drawing of sensing field lines for sensor plate C.

FIGS. 9 and 10 illustrate the primary sensing field zone with a two-dimensional drawing. However, in reality a three-dimensional primary sensing field zone may exist. There may be a three-dimensional zone for each sensor plate 105 that comprises the primary sensing field zone for each given sensor plate 105. In contrast to the prior art embodiment of FIGS. 9 and 10, in some embodiments of the present disclosure the sensor plates 105 may have an equivalent primary sensing field zone. Each sensor plate 105 in a group that has an equivalent primary sensing field zone may have an equivalent response to change in surfaces. This disclosure illustrates some configurations wherein each sensor plate 105 in a group may have an equivalent primary sensing field zone. In some embodiments each sensor plate 105 with a similar primary sensing field zone may have a similar change in sensor readings in response to a change in the detected surface.

Figure 11:
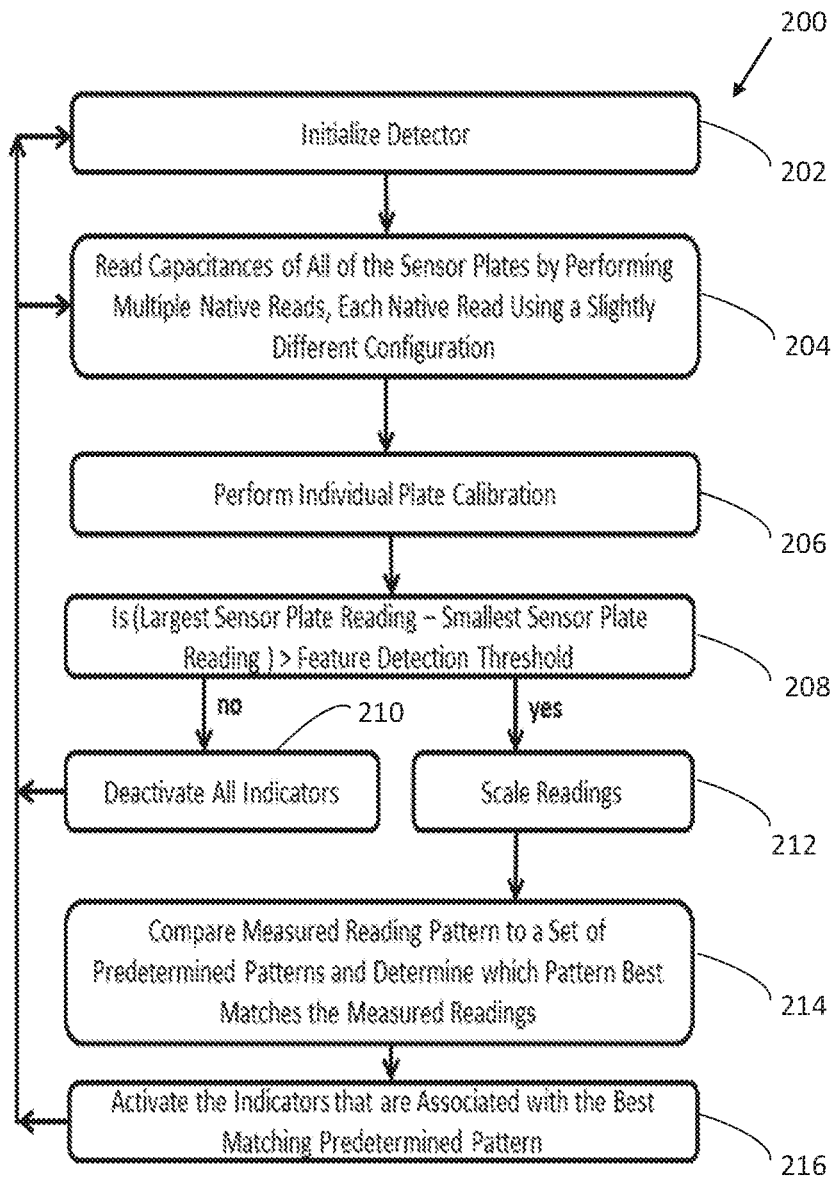
FIG. 11 is a flow diagram of a method of detecting an obscured feature behind a surface, according to one embodiment.

FIG. 11 is a flow diagram of a method 200 of detecting an obscured feature behind a surface, according to one embodiment. A first operation, as illustrated in the flow diagram in FIG. 11, may be to initialize a detector 202, which may involve running an initialization algorithm. The detector may be according to one of the embodiments described herein. After initialization, the sensor plates may be read 204. In some embodiments each of the sensor plates may be read multiple times, each time using a different configuration. The different configurations may comprise different drive currents, different voltage levels, different sensing thresholds, or other different configuration parameters. Each of these readings of the sensor plates may be referred to as native readings. In some embodiments multiple native readings may be added together to comprise a reading. In some embodiments there may be a separate reading for each sensor plate.

In some embodiments, each of these readings has a calibration 206 adjustment performed that is achieved by adding a predetermined calibration value to each reading. In some embodiments, after calibration, the readings for each of the sensor plates would be the same if the detector were to be placed on a uniform surface.

In some embodiments, the largest sensor plate reading is compared 208 to the lowest sensor plate reading. The difference is then compared 208 to a threshold value. In some embodiments, if the difference is less than a predetermined threshold value, then all of the indicators may be turned off 210, to indicate that no stud is present. If the difference is larger than a predetermined threshold value, then a determination may be made as to which indicators to activate. In certain embodiments, the readings may be scaled 212 to a predetermined range, which may involve setting the lowest value to a number such as 0 and scaling the largest reading to a value such as 100. Then all of the intermediate values would be scaled proportionately. The scaled readings may then be compared 214 to predetermined patterns which are scaled in a similar fashion.

In some embodiments there may be a set of predetermined patterns. The set of predetermined patterns may correspond to different combinations of hidden features that the detector may encounter. For example, the set of predetermined patterns may correspond to different positions for a single stud. In some embodiments, the set of predetermined patterns may include positional combinations of two studs. A pattern matching algorithm may be employed to determine which predetermined pattern best matches the reading pattern. The detector may then activate 216 the indicators that correspond to the best matching predetermined pattern.

In other embodiments, after calibrating the sensor plate readings, a determination is made if an obscured feature is present. The lowest sensor plate reading may be subtracted from the highest sensor plate reading. If the difference is greater than a threshold value, then a determination is made that an obscured feature is present. If it is determined that no obscured features are present, then all of the indicators may be deactivated. If an obscured feature is present then a process may begin to determine position(s) and/or width(s) of the obscured feature(s). In some embodiments, all of the current sensor plate readings may be scaled such that the lowest reading is scaled to a predetermined value (such as 0) and the maximum reading is scaled to a second predetermined value (such as 100). All intermediate values may be scaled proportionately. Scaled readings may be easier to compare to a set of predetermined patterns.

Figure 12:
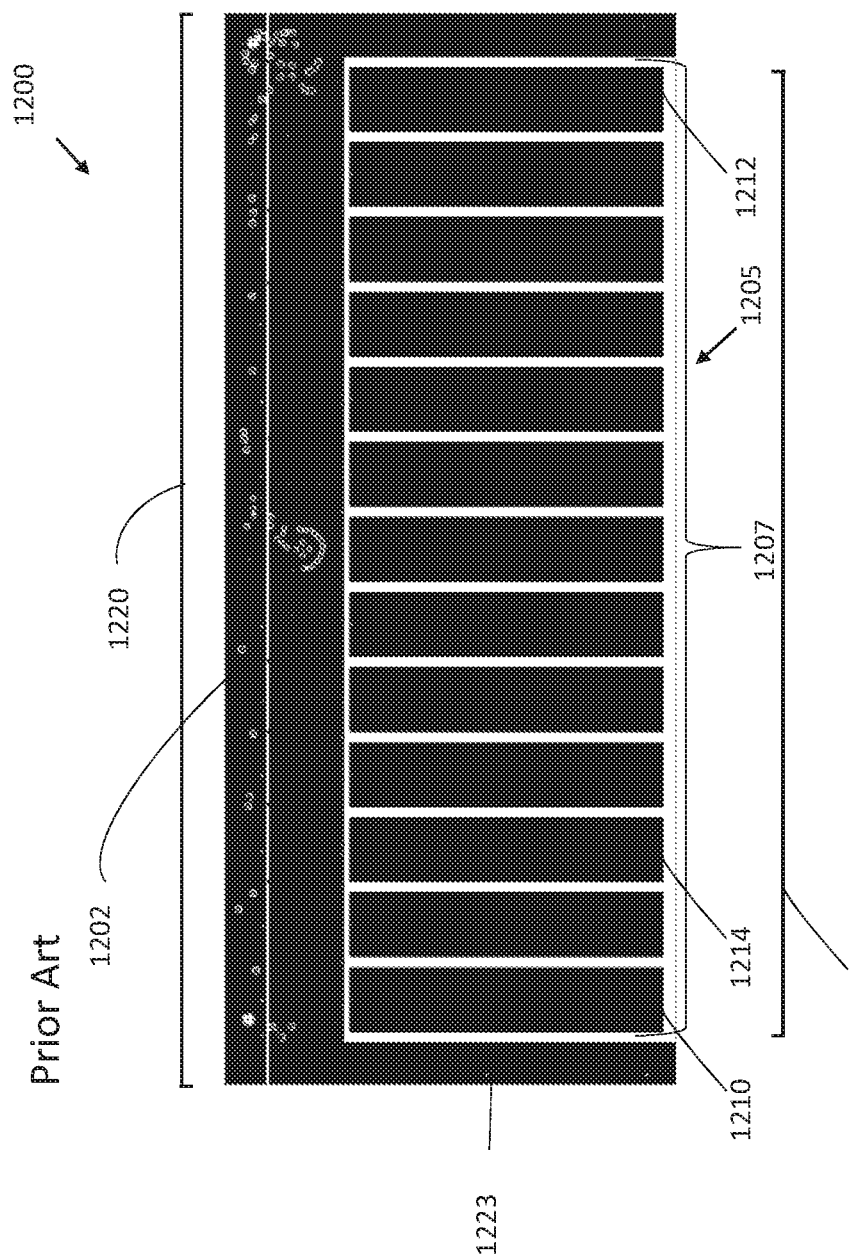
FIG. 12 is a prior art plate configuration for an obscured feature detector with a common plate.

FIG. 12 is a presently available obscured feature detector 1200 having a sensor plate group arranged in a typical plate configuration. As shown, the obscured feature detector 1200 may comprise three or more sensor plates 1205, a common plate 1202, and an active shield plate 1223.

The sensor plates 1205 of the obscured feature detector 1200 are arranged linearly to form a sensor array 1207. As shown, the sensor plates 1205 may have the same geometry and be evenly spaced. Each sensor plate 1205 has an internal border extending along at least a portion of an internal border of one or more other sensor plates 1205, and an external border disposed at an outer perimeter of the sensor array 1207. The linear sensor array includes two end sensor plates 1210, 1212 and at least one non-end sensor plate 1214.

Each sensor plate 1205 is configured to take a sensor reading that varies based on a proximity of the sensor plate 1205 to one or more surrounding objects and on a material property of each of the one or more surrounding objects. To facilitate the sensor reading, an area of each sensor plate 1205 may form a first end of a corresponding electric field.

The common plate 1202 may form a second end of the corresponding electric field of each sensor plate 1205. The common plate 1202 has a length 1220 extending along a length 1222 of the sensor array, such that the common plate 1202 extends along one external border of each of the sensor plates 1205. As shown, the common plate 1202 extends beyond an entire linear dimension of the sensor array 1207.

Common plates of presently available plate configurations are at least 17 mm longer than the sensor array, whether due to housing size or shape, shielding configurations, or other reasons. The electric fields of the end sensor plates formed with such longer common plates are non-uniform in comparison to the electric fields formed by non-end sensor plates with such longer common plates.

Figure 13:
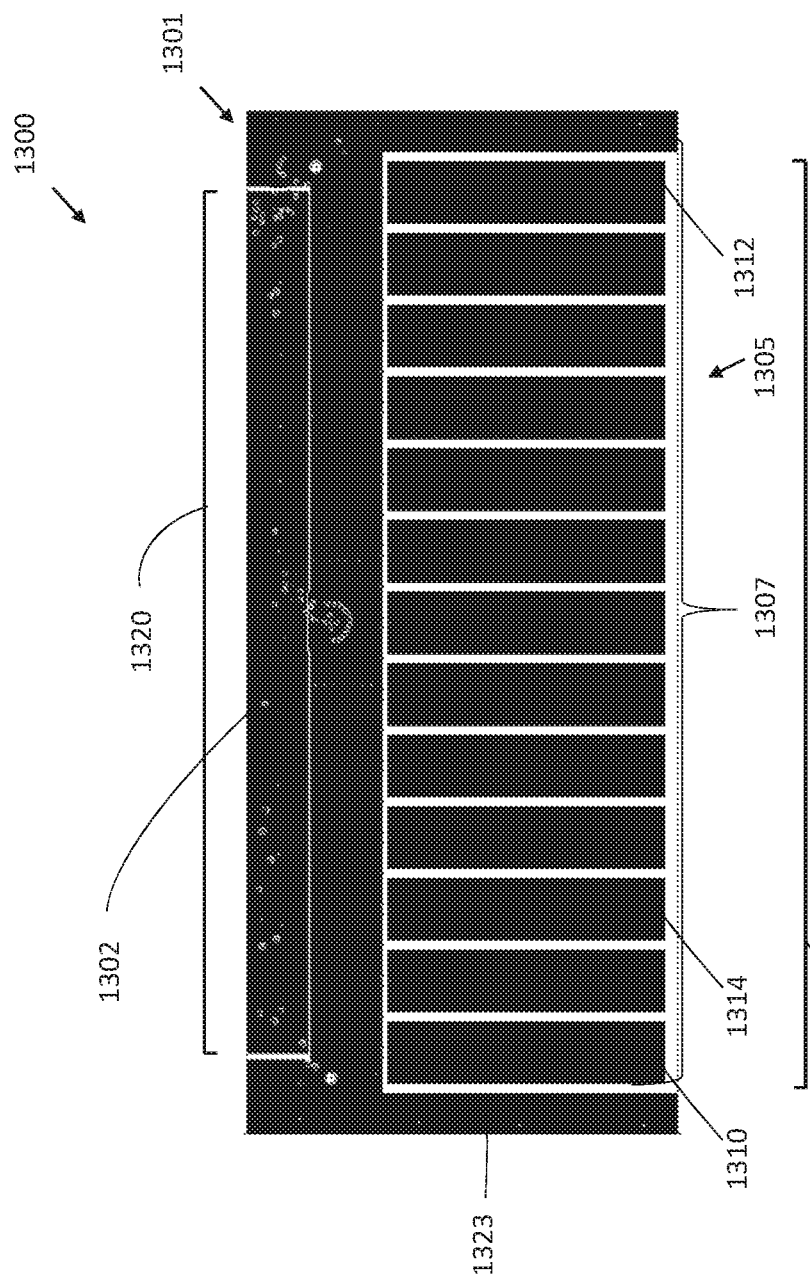
FIG. 13 is a plate configuration for an obscured feature detector with a shortened common plate.

FIG. 13 is a bottom elevation view of an obscured feature detector 1300 having sensor plate cluster 1301 arranged in an improved plate configuration with a shortened common plate 1302. As shown, the obscured feature detector 1300 may comprise three or more sensor plates 1305, the shortened common plate 1302, and an active shield plate 1323.

The sensor plates 1305 in the embodiment shown are arranged linearly to form a sensor array 1307. As shown, the sensor plates 1305 may have the same geometry and be evenly spaced. In other embodiments, the sensor plates 1305 may vary in size and/or shape, and may be spaced differently based on the position of the sensor plate 1305 in the sensor array 1307. The linear sensor array 1307 includes two end sensor plates 1310, 1312 and at least one non-end sensor plate 1314.

Each sensor plate 1305 is configured to take a sensor reading that varies based on a proximity of the sensor plate 1305 to one or more surrounding objects and on a material property of each of the one or more surrounding objects. To facilitate the sensor reading, an area of each sensor plate 1305 may form a first end of a corresponding electric field.

The shortened common plate 1302 may form a second end of the corresponding electric field of each sensor plate. The shortened common plate 1302 has a length 1320 extending along a length 1322 of the sensor array 1307 such that the shortened common plate 1302 extends along the sensor array 1307. In some embodiments, the shortened common plate 1302 may not extend along one or both of the end sensor plates 1310, 1312. In some embodiments the length 1320 of the shortened common plate 1302 is less than the length of the length of the sensor plate cluster 1301. In some embodiments the sensor plate cluster 1301 includes the sensor plates 1305. In some embodiments the sensor plate cluster 1301 includes the sensor plates 1305 and an active shield plate 1323. In some embodiments the sensor plate cluster 1301 also includes a common plate 1302 and may also include circuitry mounted on the side of the sensor plate cluster 1301 that is opposite the sensor plates 1305. In some embodiments the length 1320 of the shortened common plate 1302 is less than the length of the sensor array 1307. In some embodiments the length 1320 of the shortened common plate 1302 is less than the length of the length of the sensor plate cluster 1301. In some embodiments the length of the common plate is less than the collective length of the sensor plates 1305 and the active shield plate 1323. In the embodiment shown, the shortened common plate 1302 is centered along the sensor array 1307. In some embodiments the shortened common plate 1302 may be off-centered.

The active shield plate 1323 is disposed between and separates the sensor plates 1305 and the shortened common plate 1302. In the embodiment shown, the active shield plate 1323 surrounds the shortened common plate 1302 along three sides. In other embodiments the active shield plate 1323 may only run along the length 1320 of the shortened common plate 1302. However, having the active shield plate 1323 surround the common plate may decrease the complexity of manufacturing.

In some embodiments, one sensor plate 1305 may be sensed at a time. In some embodiments when one sensor plate 1305 is sensed, all of the sensor plates 1305, including the active shield plate 1323, are driven with the same signal as the sensed sensor plate 1305. The sensor array 1307, plus the active shield plate 1323, when driven together may push the field lines of the corresponding electric field deeper into the sensed surface than may be possible if just a single sensor plate 1305 was driven. In some embodiments this allows field lines from a single sensor plate 1305 to penetrate more deeply, and allows a single sensor plate 1305 to sense more deeply, than may be possible if a single sensor plate 1305 were driven alone.

Figure 14:
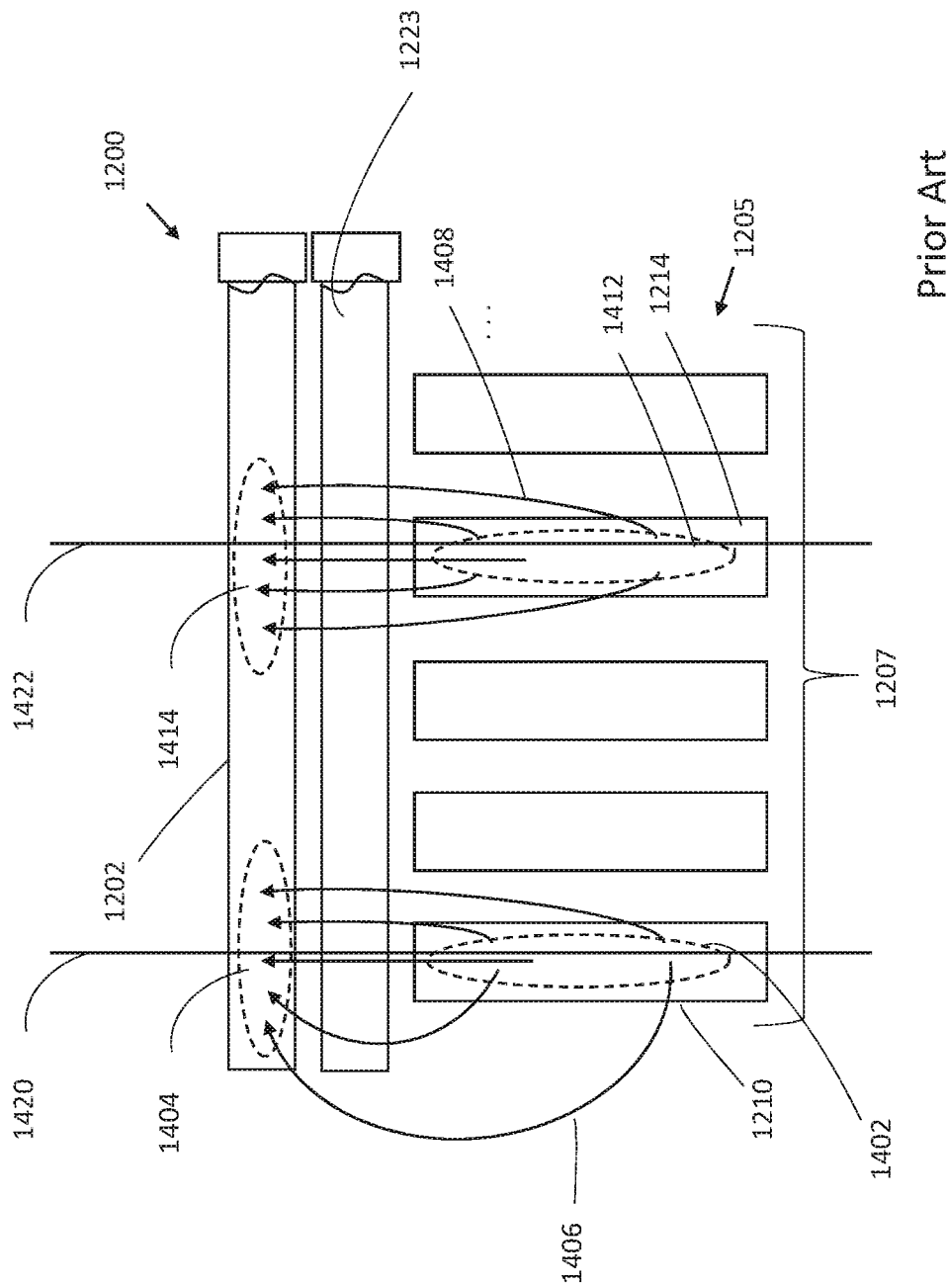
FIG. 14 illustrates the electric field lines for the prior art plate configuration of FIG. 12.

FIG. 14 illustrates the electric fields created by the prior art plate configuration of the obscured feature detector 1200 of FIG. 12. Each sensor plate 1205 is configured to provide a primary coupling area 1402, 1412 to form a first end of a corresponding electric field 1406, 1408. Further, the common plate 1202 is configured to provide a corresponding primary coupling area 1404, 1414 to correspond to a sensor plate 1205 and form a second end of the corresponding electric field 1406, 1408 of that sensor plate 1205.

The primary coupling area 1402, 1412 is the area of the sensor plate 1205 where the electric field 1406, 1408 primarily couples. In the illustrated prior art, the primary coupling area 1402 of the end sensor plate 1210 is on a line 1420 with the corresponding primary coupling area 1404 of the common plate 1202. Similarly, the primary coupling area 1404 of the non-end sensor plate 1214 is on a line 1422 with the corresponding primary coupling area 1414 of the common plate 1202. As shown, the line 1420 of the primary coupling area 1402 of the end sensor plate 1210 to the corresponding primary coupling area 1404 of the common plate 1202 is approximately parallel with the line 1422 of the corresponding primary coupling area 1404 of the non-end sensor plate 1214 to the corresponding primary coupling area 1414 of the common plate 1202.

As shown, the electric field 1406 formed from the end sensor plate 1210 in this configuration has a different geometry than the electric field 1408 formed from the non-end sensor plate 1214. The electric fields generated by surrounding sensor plates 1205 affect each other sensor plate 1205. The non-uniform electric field 1406 is a result of the end sensor plate 1210 not having sensor plates 1205 along both sides. The non-uniformity of the electric field 1406 may result in an inaccurate detection or a missed detection of obscured features. For example, the electric field 1406 generated by the end sensor plate 1210 may penetrate more broadly into a surface than the electric field 1408 generated by the non-end sensor plate 1214. Because of the different sensing areas, the end sensor plate 1210 may falsely identify an obscured feature.

Figure 15:
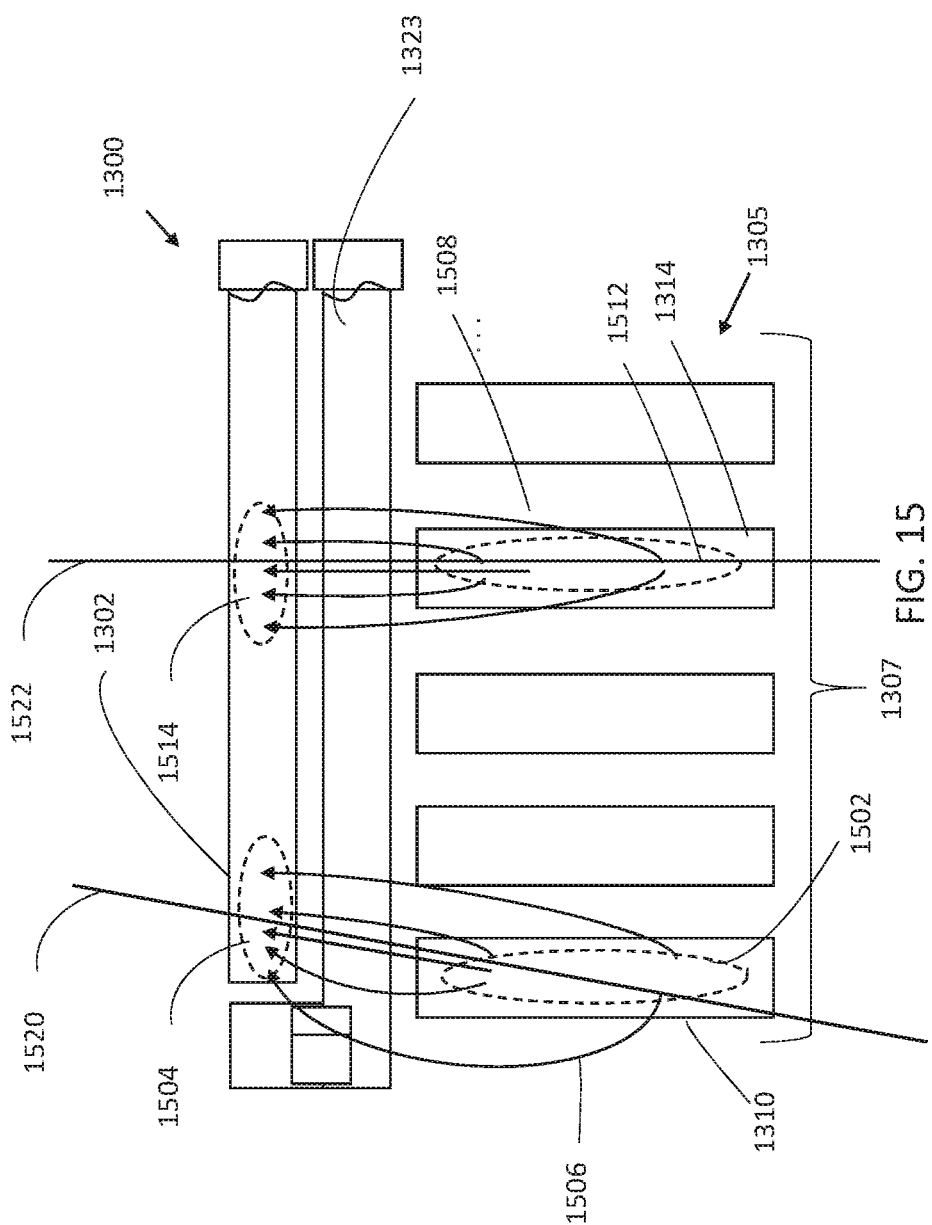
FIG. 15 illustrates the electric field lines for the plate configuration of FIG. 13.

FIG. 15 illustrates the electric fields 1506, 1508 created between an end sensor plate 1310 and a non-end sensor plate 1314 in the plate configuration of the obscured feature detector 1300 of FIG. 13. Primary coupling areas (e.g., 1502, 1512) may couple the sensor plates 1305 to the shortened common plate 1302. Each of the sensor plates 1305 is configured to provide a primary coupling area (e.g., 1502, 1512) to form a first end of a corresponding electric field. The common plate 1302 is configured to provide corresponding primary coupling areas (e.g., 1504, 1514) that each correspond to a sensor plate 1305 and forms a second end of the corresponding electric field of that sensor plate 1305.

For example, as shown, the end sensor plate 1310 is configured to provide the primary coupling area 1502 and the non-end sensor plate 1314 is configured to provide the primary coupling area 1512. The common plate 1302 is configured to provide a corresponding primary coupling area 1504 that corresponds to the primary coupling area 1502 of the end sensor plate 1310 and a corresponding primary coupling area 1514 that corresponds to the primary coupling area 1512 of the non-end sensor plate 1314.

As illustrated, the electric fields 1506, 1508 couple the primary coupling areas 1502, 1512 of the sensor plates 1305 to the corresponding primary coupling areas 1504, 1524 of the common plate 1302. The primary coupling area 1502 of the end sensor plate 1310 is on a first line 1520 with the corresponding primary coupling area 1504 of the common plate 1302. Further, the primary coupling area 1512 of the non-end sensor plate 1314 is on a second line 1522 with the corresponding primary coupling area 1514 of the common plate 1302.

To achieve similar electric fields, the first line 1520 and the second line 1522 between the coupling areas of the sensor plates 1305 and the common plate 1302 are non-parallel. The electric fields generated by neighboring sensor plates 1305 affect each other sensor plate 1305. Because the end sensor plate 1310 only has one neighboring sensor plate 1305, the electric field 1506 would naturally travel a greater distance than the electric field 1508 of the non-end sensor plate 1324. As shown in FIG. 14, the path of the greater distance may extend beyond the obscured feature detector. In contrast, as shown In FIG. 15, the shortened common plate 1302 pulls the electric field 1506 into near alignment with the electric field 1508. This may be because the sizing and placement of the shortened common plate 1302 causes the electric field 1506 from the end sensor plate 1310 to have more similarity to the electric field 1508 to the non-end sensor plate 1314, as compared to prior art obscured feature detectors.

In some embodiments the electric field 1506 that corresponds to the end sensor plates 1310 has a similar size, shape, direction, and/or geometry as the electric field 1508 that corresponds to the non-end sensor plate 1314. In some embodiments the electric fields that correspond to each of the sensor plates 1305 have the same size, shape, direction, and/or geometry as each of the other sensor plates 1305. In some embodiments, the electric fields that correspond to each of a group of sensor plates 1305 have the same size, shape, direction, and/or geometry.

In some embodiments similar electric field size, shape, direction, and/or geometry results in more consistent readings, because each sensor plate 1305 will respond more uniformly to a change to surface or to the object(s) being detected. The sensor plates 1305 that each respond similarly may be able to better detect obscured features that are deeper in a wall, or obscured features that may be harder to detect. With similar electric fields the result may be an obscured feature detector that can be used on a variety of different surfaces and may perform equally well on each of the variety of different surfaces. The result may also be an obscured feature detector that can sense more deeply, or more accurately, or both.

In some embodiments an obscured feature detector may have a common plate that is less than the collective linear dimension of the three or more sensor plates. This configuration may result in forming electric fields that have a similar size, shape, and/or geometry. In some embodiments an obscured feature detector may have a common plate that is less than the collective linear dimension of the three or more sensor plates plus 16 millimeters. This configuration of a common plate less than a length of the sensor array plus 16 millimeters may result in electric fields that have a similar size, shape, direction, and/or geometry. In other words, in some embodiments there may be a length that is defined as an array-plus length. This array-plus length may be at most 16 millimeters longer than the collective length of the sensor array. In some embodiments this array-plus length may be at most one and a half times a sensor width longer than the collective length of the sensor array. In other words, the length of the common plate may measure longer than the array by at most one and a half times a width of a sensor plate (e.g., a width of an end sensor plate). An obscured feature detector that has a common plate that is less than the array-plus length may be called a shortened common plate. In some embodiments an obscured feature detector that has a shortened common plate may have electric fields that each have a more similar size, shape, direction, and/or geometry.

A result of the increased similarity of the electric fields may be that the obscured feature detector can sense more accurately and more deeply into and/or through a surface.

An obscured feature detector with a shortened common plate may have electric fields that each have a more similar size, shape, direction, and/or geometry, as compared to obscured feature detectors with a common plate described in the prior art. More uniformity in the size, shape, direction, or geometry of the electric fields associated with each sensor plate may provide more uniform readings for each of the sensor plates. Sensor plates that each have similar electric fields may each respond in a more uniform manner to different surface materials and thicknesses. For example, one embodiment of an obscured feature detector with a shortened common plate may be placed on a particular surface, such as a surface of 0.25-inch-thick sheetrock. When placed on this surface each of the sensor plates may each have the same reading, such as a reading of 100 units, for example. In this example if the same obscured feature detector is placed on a different surface, such as 0.50-inch-thick sheetrock, each of the readings may change to a different value, but once again each of the sensor plate readings may be similar, such as a value of 200 units. When the readings from each of the sensor plates provide similar readings, independent of whatever surface the obscured feature detector is placed upon, any variation in sensor plate readings may be attributed to the presence of an obscured feature. Obscured feature detectors with shortened common plates may maintain a greater uniformity in the readings, across different surfaces, than prior art obscured feature detectors. Readings that are uniform, independent of the surface, may make it possible to sense more accurately and more deeply, identify feature width more accurately, and make it possible to sense two objects simultaneously more precisely. In some embodiments a shortened common plate may have the advantageous result of the sensing field for each sensor plate being positioned more precisely in the region near the sensor plate. As a result, the obscured feature detector may sense more accurately and more deeply.

In some presently available obscured feature detectors the common plate is less than 8.00 millimeters wide. In some embodiments of an improved obscured feature detector there may be improved performance if the common plate is more than 8.00 millimeters wide. Obscured feature detectors that have a common plate that is more than 8.00 millimeters wide may have electric fields that each have a more similar size, shape, direction, and/or geometry, as compared to obscured feature detectors with a common plate described in the prior art.

As shown in FIG. 15, the obscured feature detector 1300 may have a primary coupling area 1502 of the end sensor plate 1310 of the sensor array 1307 on a first line 1520 with the corresponding primary coupling area 1504 of the one or more common plates. The obscured feature detector 1300 may also have a primary coupling area 1512 of the non-end sensor plate 1314 of the sensor array 1307 on a second line 1522 with a corresponding primary coupling area 1514 of the one or more common plates. In some embodiments, the first line 1520 and the second line 1522 are non-parallel. This may result in electric fields that have a more—similar size, shape, direction, and geometry.

In other words, if the origin and termination of the electric field corresponding to the non-end sensor plate 1314 is on the first line 1520, and if the origin and termination of the electric field corresponding to the end sensor plate 1310 is on the second line 1522, and if the first line 1520 and the second line 1522 are non-parallel, then the electric fields 1506 corresponding to the end sensor plates 1310 may be more similar to the electric fields 1508 corresponding to non-end sensor plates 1314 than would be the case if the first and second lines 1520, 1522 were parallel. The result may be that each of the sensor plates 1305 may have a more uniform response to changes in the surface or object being detected. As a result, the obscured feature detector 1300 may sense more accurately and more deeply.

For example, if the presence of an obscured feature causes one of the sensor plates 1305 to have a particular reading when an object is placed in proximity to the sensor plate 1305, it would be desirable for each of the sensor plates 1305 to have the same reading when the obscured feature is placed in the same position relative to the sensor plate 1305. The uniform response just described may make it possible to sense more independently of the surface material or thickness. The result may be that studs are sensed more accurately, independent of the surface material or thickness.

The plate configuration of the embodiment of an obscured feature detector 1300 of FIG. 15 causes the electric field 1506 formed from an end sensor plate 1310 and the electric field 1508 formed from a non-end sensor plate 1314 to have a similar size, shape, or orientation. This is in contrast with the electric fields shown in FIG. 14. The uniformity of the electric fields may increase the accuracy of an obscured feature detector. The increased accuracy may be a result of the electric fields of each sensor plate 1305 taking a similar reading (e.g., a reading covering a similar depth and width).

Figure 16:
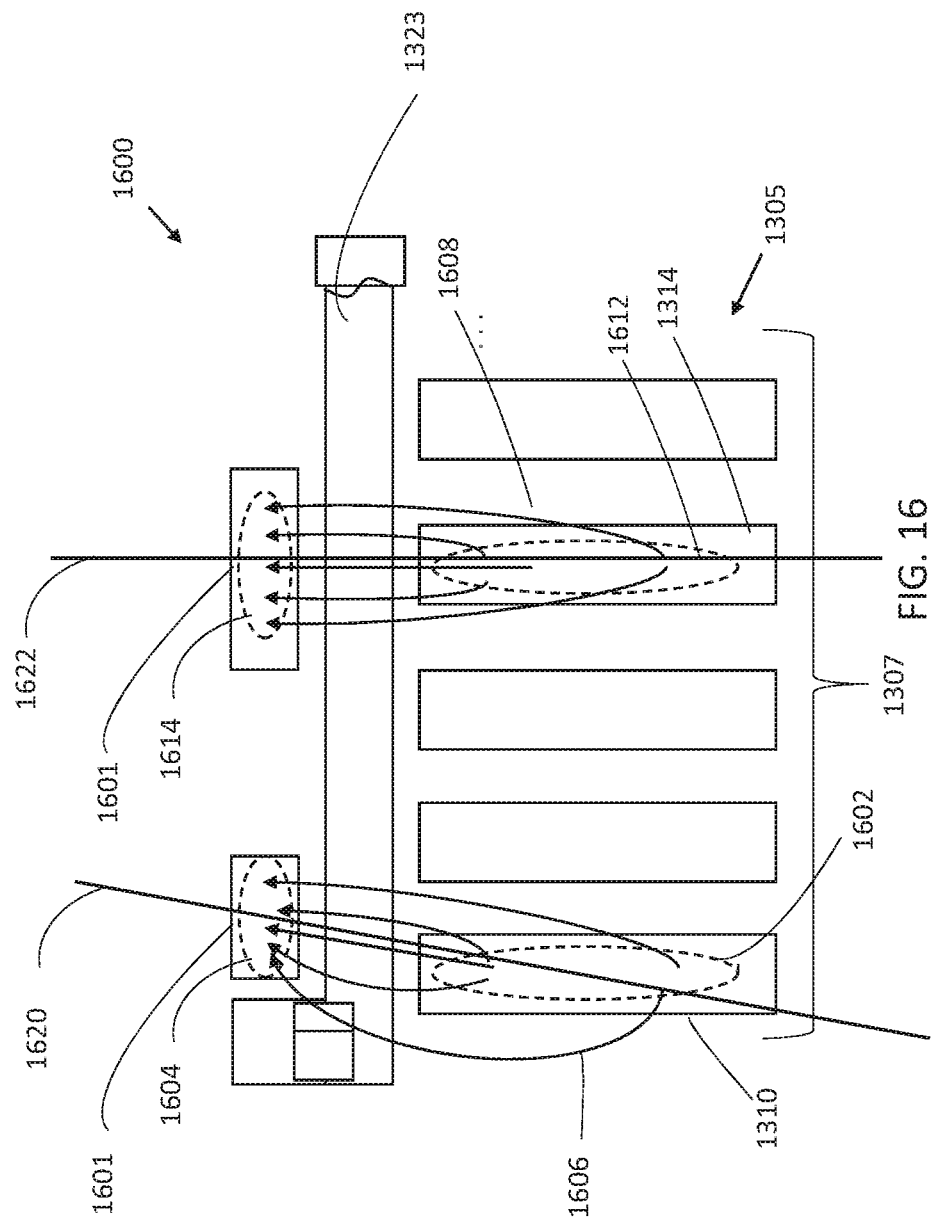
FIG. 16 illustrates the electric field lines for a sensor plate array with multiple common plates.

FIG. 16 illustrates the electric fields 1606, 1608 emitted from an end sensor plate 1310 and a non-end sensor plate 1314 for a plate configuration of an obscured feature detector 1600 with multiple common plates 1601. As shown, the multiple common plates 1601 may be sized, configured, and aligned to cause the electric field 1606 formed from an end sensor plate 1310 to have a similar size, shape, and/or orientation to the electric field 1608 formed from a non-end sensor plate 1314. The multiple common plates 1601 may be arranged linearly to extend along the length of the sensor array 1307.

Just as in FIG. 15, a primary coupling area 1602 of the end sensor plate 1310 of the sensor array 1307 is on a first line 1620 with a corresponding primary coupling area 1604 of the multiple common plates 1601. Further, a primary coupling area 1612 of a non-end sensor plate 1314 of the sensor array 1307 is on a second line 1622 with the corresponding primary coupling area 1614 of the multiple common plates 1601. Due to the positioning of the multiple common plates 1601, the first line 1620 and the second line 1622 are non-parallel causing the electric field 1606 formed from the end sensor plate 1310 to have a similar geometry to the electric field 1608 formed from the non-end sensor plate 1314. The uniformity of the electric fields 1606, 1608 may increase the accuracy of the obscured feature detector 1600. Each of the multiple common plates 1601 may be independently activated. In some embodiments the multiple common plates 1601 may be activated by being coupled to an unchanging voltage level, such as 0 volts, or 3 volts, or any other unchanging voltage level. In some embodiments the multiple common plates 1601 may be activated by being driven with an alternating voltage.

Figure 17:
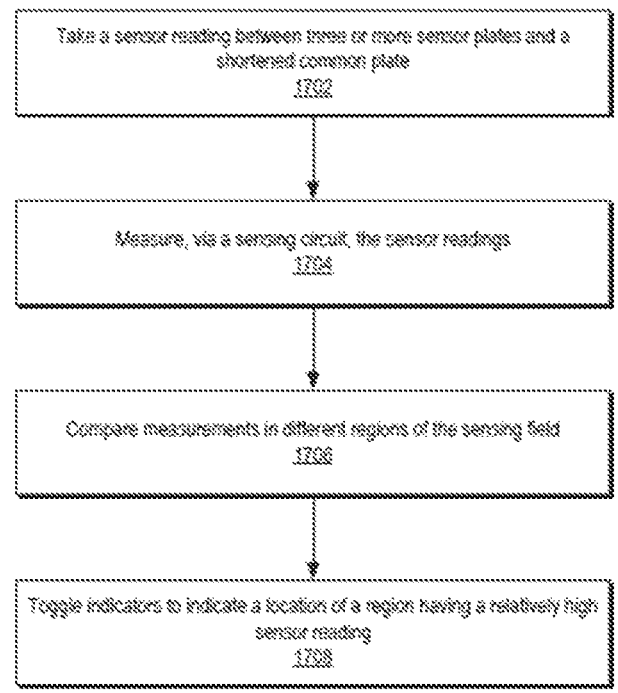
FIG. 17 is a flow chart illustrating a method of detecting an obscured feature behind a surface with a plate configuration with a shortened ground plane, according to one embodiment.

FIG. 17 is a flow chart illustrating a method 1700 of detecting an obscured feature behind a surface. The method may include taking 1702 a sensor reading between the three or more sensor plates and a shortened common plate of an obscured feature detector. The three or more sensor plates may be arranged linearly in a sensor array. The sensor reading may be of a region of a sensing field formed between the three or more sensor plates and a common plate of the obscured feature detector. The common plate may be less than a dimension of the sensor array.

The method may further include measuring 1704, via a sensing circuit, the sensor readings of the three or more sensor plates, and comparing 1706 measurements of sensor readings in different regions of the sensing field. The measured sensor reading may be a capacitive reading or an electromagnetic reading. Further, the method may toggle 1708 indicators from a deactivated state to an activated state to indicate a location of a region of the sensing field having a relatively high sensor reading.

Figure 18:
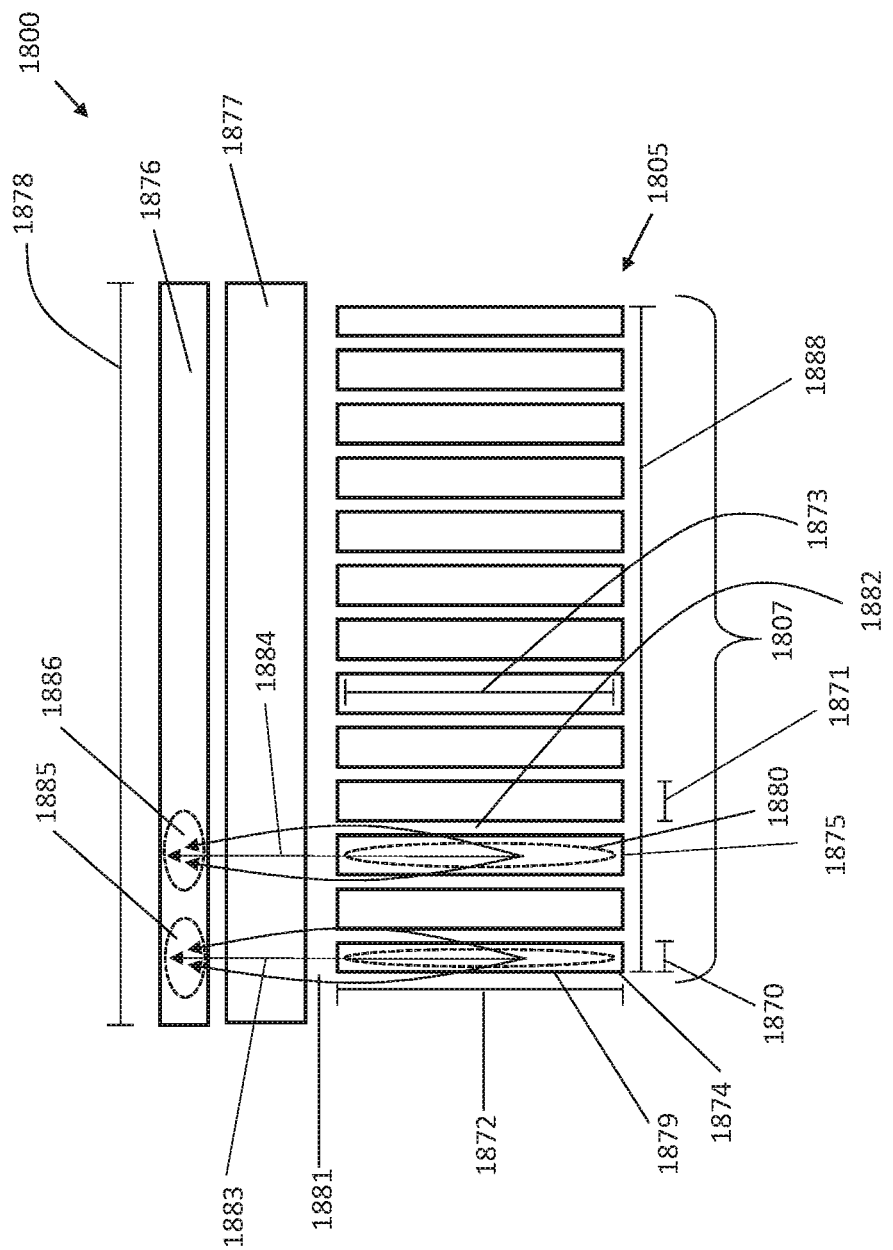
FIG. 18 illustrates the electric field lines for a sensor plate array with narrow end-plates.

FIG. 18 illustrates an obscured feature detector 1800, according to another embodiment of the present disclosure, with an alternative configuration of a plurality of sensor plates 1805. The obscured feature detector 1800 includes an end sensor plate 1874 of a sensor array 1807 that has less area than the non-end sensor plates. In this embodiment the end sensor plate 1874 is narrower than the non-end sensor plate 1875 of the sensor array 1807. Each sensor plate 1805 in the sensor array 1807 is configured to be electrically coupled to a common plate 1876 via an electric field 1881, 1882. Each sensor plate 1805 in the sensor array 1807 is configured to provide a primary coupling area 1879, 1880 that may form a first end of the electric field 1881, 1882. Further, the common plate 1876 is configured to provide a corresponding primary coupling area 1885, 1886 to correspond to each of the end sensor plates 1874 and the non-end sensor plates 1875 and form a second end of the corresponding electric field 1881, 1882 of each sensor plate 1805.

The primary coupling area 1879 of the end sensor plate 1874 is on a first line 1883 that extends from the primary coupling area 1879 of the end sensor plate 1874 to the primary coupling area 1885 of the common plate 1876. The primary coupling area 1880 of a non-end sensor plate 1875 is on a second line 1884 that reaches from the primary coupling area 1880 of the non-end sensor plate 1875 to the primary coupling area 1886 of the common plate 1876.

In the configuration of FIG. 18, the common plate 1876 has a length 1878 that is greater than the length 1888 of the sensor array 1807. In some embodiments the length 1878 of the common plate 1876 may be equal (or closely similar) to the length of the shielding plate 1877 located between the common plate 1876 and the sensor array 1807. The non-end sensor plates 1875 each have a length 1873 and width 1871 that are identical (or closely similar) to the length and width of the other non-end sensor plates 1875 in the sensor array 1807. The end sensor plates 1874 have lengths 1872 that are equal (or closely similar) to the lengths 1873 of the non-end sensor plates 1875, but widths 1870 that are smaller than the widths 1871 of the non-end sensor plates 1875.

As can be appreciated, the total area of the end sensor plate 1874 is less than that of a non-end sensor plate 1875. The smaller sensor area may make the end sensor plates less responsive to changes in the surface 2, such that the responsiveness of the end sensor plates more closely matches the responsiveness of the non-end sensor plates. In some prior art obscured feature detectors the end sensor plates and the non-end sensor plates each have different responses to changing surfaces 2, or to changing obscured features 3. This is responsiveness issue is discussed in the dialog surrounding FIG. 7 and FIG. 8. The end sensor plate 1879 may have less area may be less responsive to different surfaces and to different obscured features, as a result it may have a response that is more similar to the non-end sensor plates 1875. Further, the electric field 1881 formed between an end sensor plate 1874 and the common plate 1876 will be smaller than were the width 1870 of the end sensor plate 1874 identical (or closely similar) to the width 1871 of the non-end sensor plates 1875. In other words, the narrower width 1870 of the end sensor plate 1874 results in a smaller electric field 1881 that is more similar in shape (including more similar in depth into the surface of detection) to the electric field 1882 between a non-end sensor plate 1875 and the common plate 1876. In contrast to the electric field 1406 in FIG. 14 that couples a wide end sensor plate 1210 to the common plate 1202, the electric field 1881 in FIG. 18 between the coupling areas 1879, 1880 of a narrow end sensor plate 1874 and the common plate 1876 does not diverge as drastically as an end sensor plate having the same width as a non-end sensor plate 1875. The electric fields 1881 between the end sensor plates 1874 and the common plate 1876 are more similar to the electric fields between non-end sensor plates 1875 and the common plate 1876. As noted previously, the more similar shape of the electric field 1881, 1882 translates in more predictable readings of the sensor plates, and thereby more accurate detections of obscured features.

In various embodiments according to the configuration illustrated by FIG. 18, if the electric fields 1881, 1882 are relatively similar in size, shape, direction, and/or geometry between sensor plates 1874, 1875 in a sensor array 1807, the sensor plates 1874, 1875 may each respond similarly to an obstruction in the path of their electric fields 1881, 1882. Stated another way, greater uniformity of the end electric fields 1881 with the non-end electric fields 1882 enables more consistent readings, because each of the sensor plates 1805 will respond more uniformly to a change to a surface or to the object(s) being detected. Sensor plates 1805 that each respond similarly may be able to better detect obscured features that are deeper in a wall, or obscured features that may be harder to detect. With similar electric fields 1881, 1882, an obscured feature detector may result that can be used on a variety of different surfaces and may perform equally well on each of the variety of different surfaces. The obscured feature detector 1800 with uniform end electric fields 1881 and non-end electric fields 1882 can sense more deeply, or more accurately, or both.

Figure 19:
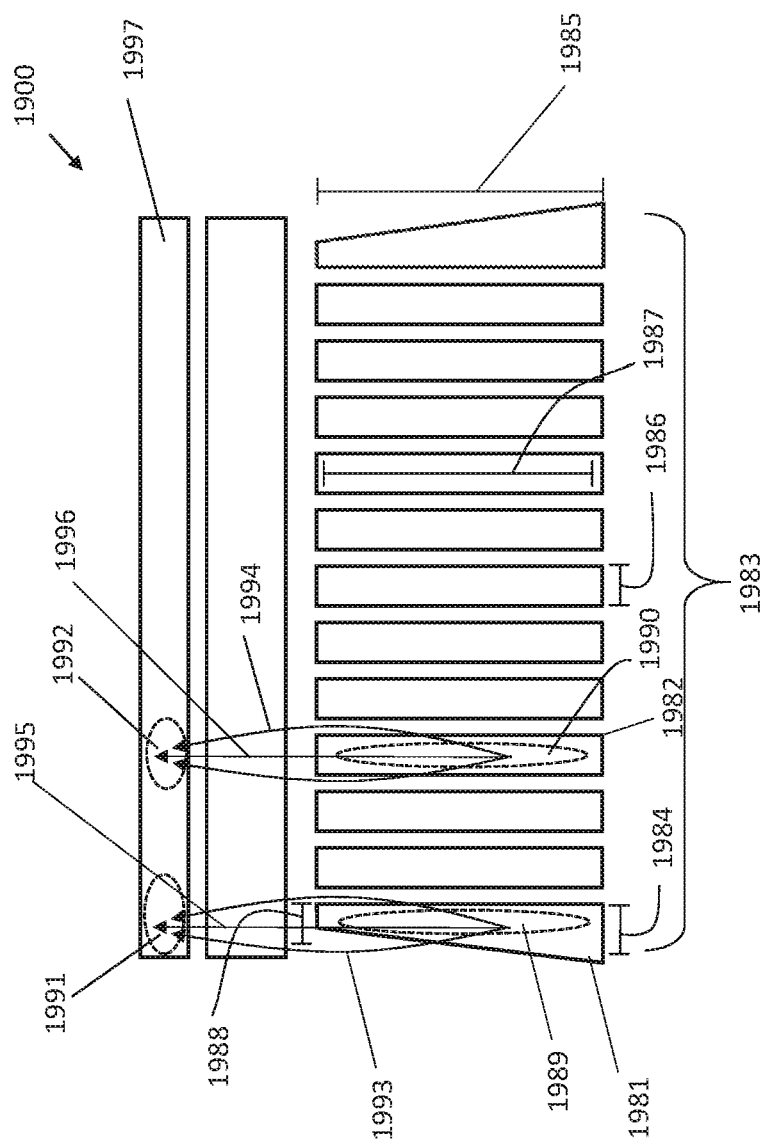
FIG. 19 illustrates the electric field lines for a sensor plate array with trapezoidal end-plates.

FIG. 19 illustrates an obscured feature detector 1900, according to another embodiment of the present disclosure, that is similar to FIG. 18 and with an alternative end sensor plate configuration. The end sensor plates 1981 have a different shape than the other sensor plates. In the obscured feature detector 1900 of FIG. 19, the end sensor plates 1981 have a trapezoidal shape. In some embodiments, the end sensor plates 1981 of a shape different than other sensor plates may enable the end sensor plates 1981 to detect obscured features more similarly to non-end sensor plates.

The end sensor plates 1981 may have the same length 1985 as the non-end sensor plates 1982, but the lower width 1984 is wider than the upper width 1988. In some embodiments, the lower width 1984 of the end sensor plates 1981 may be equal to the lower width 1986 of the non-end sensor plates 1982, and the upper width 1988 of the end sensor plates 1981 may be smaller. In some embodiments, the lower width 1984 of the end sensor plates 1981 may be greater than the width 1986 of the non-end sensor plates 1982, and the upper width 1988 of the end sensor plates 1981 may be equal to the width 1986 of the non-end sensor plates 1982. In some embodiments both the upper 1988 and lower widths 1984 may be greater than the width 1986 of the non-end sensor plates 1982, and the lower width 1984 of the end sensor plates 1981 is greater than the upper width 1988 of the end sensor plates 1981. In some embodiments both the upper 1988 and lower widths 1984 may be smaller than the width 1986 of the non-end sensor plates 1982, and the lower width 1984 of the end sensor plates 1981 is greater than the upper width 1988 of the end sensor plates 1981.

Figure 20:
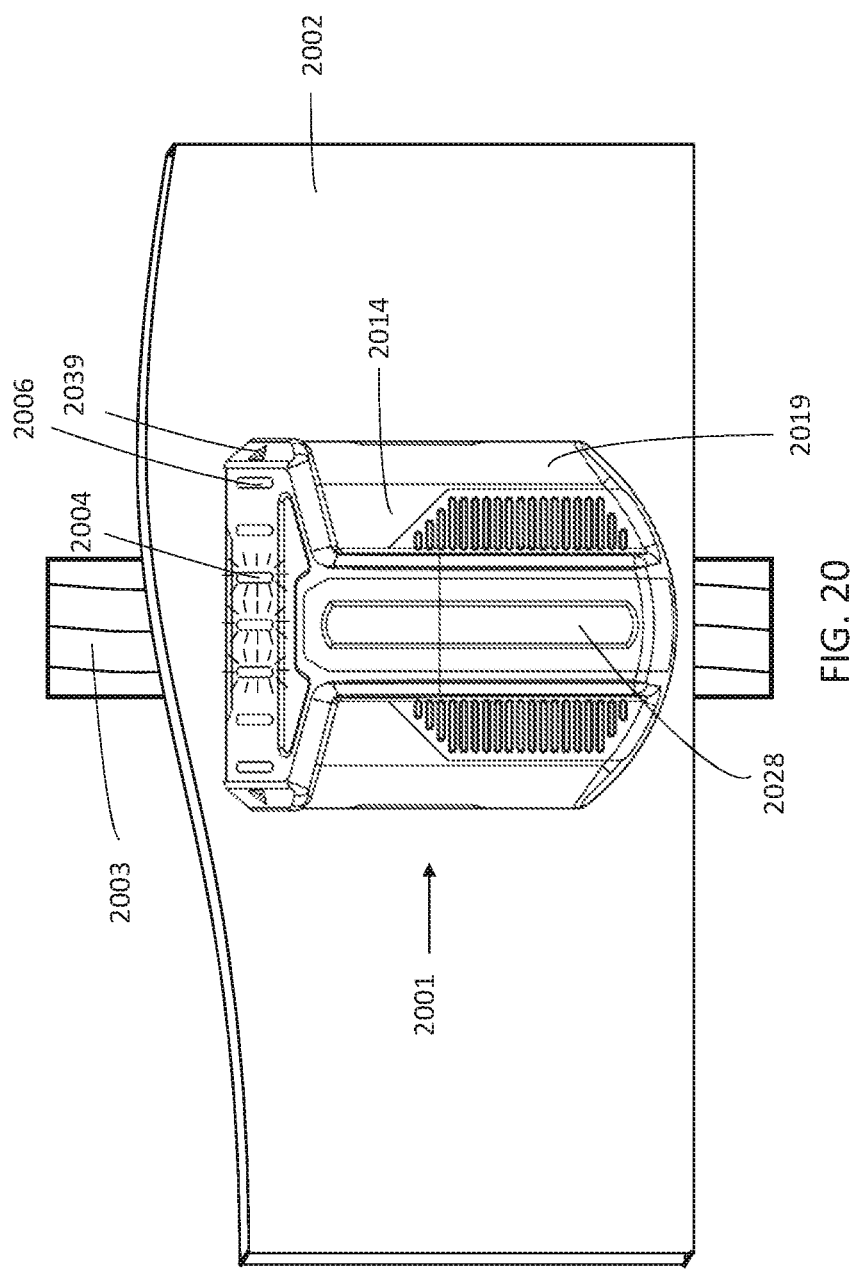
FIG. 20 illustrates an obscured feature detector, according to one embodiment, positioned on a piece of sheetrock and detecting an obscured feature.
Figure 21:
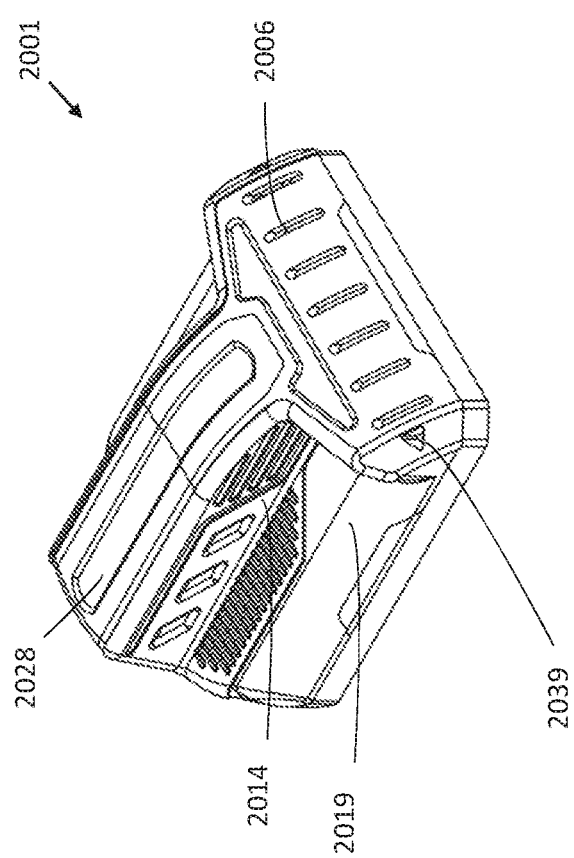
FIG. 21 is a perspective view of the obscured feature detector of FIG. 20.
Figure 22:
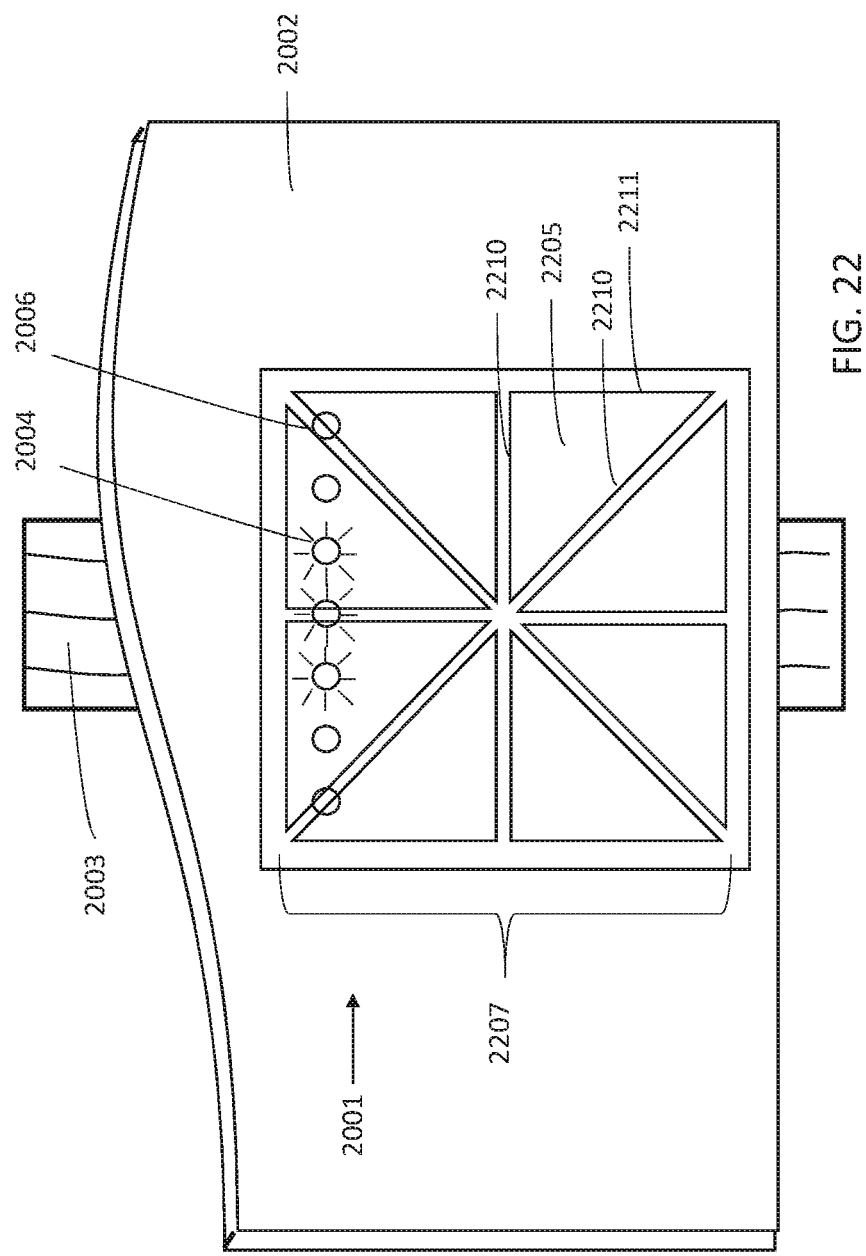
FIG. 22 is an illustrative drawing that shows sensor plates and activated indicators of the obscured feature detector of FIG. 20, with the activated indicators signaling a position of the hidden obscured feature.

FIG. 20 illustrates an obscured feature detector 2001, according to one embodiment, placed on a piece of sheetrock 2002 (or similar surface) and detecting an obscured feature 2003. FIG. 21 is a perspective view of the obscured feature detector 2001 of FIG. 20. FIG. 22 shows a sensor side of the obscured feature detector 2001, which includes a plurality of sensor plates 2205.

With reference to FIGS. 20-22, generally and collectively, the obscured feature detector 2001 includes three or more sensor plates 2205, a sensing circuit (see FIG. 23), one or more indicators 2006, one or more proximity indicators 2039, and a housing 2019 to provide or otherwise accommodate a handle 2014, an active shield plate 2623 (see FIG. 26), and a battery cover 2028.

The three or more sensor plates 2205 each can take a sensor reading that varies based on a proximity of the sensor plate 2205 to one or more surrounding objects and on a material property of each of the one or more surrounding objects. The three or more sensor plates 2205 collectively create a sensing field. Each individual sensor plate 2205 of the three or more sensor plates 2205 creates a corresponding primary sensing field zone that may be a geometric three-dimensional volume within the sensing field where the individual sensor plate 2205 contributes more strongly to the sensing field than any other of the three or more sensor plates 2205. The three or more sensor plates 2205 all create primary sensing field zones that are geometrically similar. The sensing circuit couples to the three or more sensor plates 2205 to measure the sensor readings of the three or more sensor plates 2205.

In some embodiments each sensor plate 2205 may be part of a group 2207 of sensor plates 2205. Each group 2207 may include two or more sensor plates 2205 and may also include an active shield plate 2623. The sensor plates 2205 and active shield plate 2623 may be on different planes. Nevertheless, if they are driven simultaneously, in some embodiments, they may be part of the same group 2207 of sensor plates 2205. Each sensor plate 2205 has a geometry that is defined by its shape. Each sensor plate 2205 also has a perimeter. In some embodiments the perimeter may be composed of multiple segments. In some embodiments each segment of the perimeter is either an internal border 2210 or an external border 2211. In some embodiments, if a sensor plate 2205 has a segment of the perimeter that is adjacent to the perimeter of the group 2207, then said segment comprises an external border 2211. In some embodiments, if a sensor plate 2205 has a segment of the perimeter that is not adjacent to the perimeter of the group 2207, then said segment comprises an internal border 2210.

In some embodiments to sense the location of an obscured feature 2003, a sensor plate 2205 may be driven with a current source, and the obscured feature detector 2001 measures the time it takes for the sensor plate 2205 to reach a certain threshold voltage, thereby achieving a sensor reading. In other embodiments a charge-share mechanism is used to achieve a sensor reading. In other embodiments a radio frequency signal is placed on the sensor plates 2205 to achieve a sensor reading. In each of these embodiments a signal is driven on the sensor plate(s) 2205 to be sensed.

In some embodiments, only a single sensor plate 2205 may be driven at a time. In these embodiments the single sensor plate 2205 may be alone in creating the sensing field.

In some embodiments, a group 2207 of sensor plates 2205 may all be driven with the same signal simultaneously. In these embodiments the group 2207 of sensor plates 2205 may create the sensing field. In some embodiments multiple sensor plates 2205 may be driven simultaneously each with the same signal, although possibly only a single sensor plate 2205 may be sensed. Advantageously driving multiple sensor plates 2205 simultaneously may create field lines that go deeper into an obscured surface than may be possible if only a single sensor plate 2205 is driven. Deeper field lines may make it possible to sense more deeply. In some embodiments a group 2207 of sensor plates 2205 and an active shield plate 2623 may all be driven with the same signal simultaneously, which together would create the sensing field.

Each sensor plate 2205 has a primary sensing field zone. In some embodiments the primary sensing field zone is a geometric three-dimensional volume of the sensing field and associated field lines where the individual sensor plate 2205 is able to sense more strongly than the active shield plate 2623 (if present) or any other sensor plate 2205. In some embodiments it is desirable for each sensor plate 2205 to have similar primary sensing field zones. In some embodiments it is desirable for each sensor plate 2205 to have primary sensing field zones that are geometrically similar and to have similar sensing fields within their respective primary sensing field zones.

FIG. 22 illustrates a group 2207 of eight sensor plates 2205. Each of the eight sensor plates 2205 is triangular. Each triangular sensor plate 2205 has two segments that each have internal borders 2210. Each sensor plate 2205 also has one segment that has an external border 2211.

In some embodiments, as shown in FIG. 22, the group 2207 may comprise eight triangular sensor plates 2205 that each have a similar geometry. The group 2207 of sensor plates 2205 may be arranged within a square area, wherein each side of the square area is approximately 3 inches long. In some embodiments, each of the sensor plates 2205 may be in the shape of an isosceles triangle. In some embodiments the sensor plates 2205 may be arranged such that the hypotenuse of two triangular sensor plates 2205 may be adjacent to each other, as shown in FIG. 22. In some embodiments two sensor plates 2205 with adjacent hypotenuses may approximate a square and fit within one quadrant of the group 2207 of sensor plates 2205. In some embodiments there may be two such triangles positioned in each quadrant such that the entire group 2207 comprises eight sensor plates 2205, as shown in FIG. 22. In some embodiments the distance between adjacent sensor plates 2205 may be approximately 2.0 mm.

In FIG. 22 a sensing field may be created collectively by the eight sensor plates 2205. In some embodiments an active shield plate 2623 may contribute to the sensing field. In the embodiment of FIG. 22 each of the sensor plates 2205 may have similar primary sensing field zones. In this embodiment, the radial symmetry of the sensor plates 2205 may provide each sensor plate 2205 with primary sensing zones that are geometrically similar. Likewise, each of the sensor plates 2205 may also have similar sensing fields within their respective primary sensing field zones. As a result, an obscured feature detector 2001 that is built with a configuration of FIG. 22 may offer improved performance. When the obscured feature detector 2001 is moved from a thin surface to a thicker surface the sensor readings for each of the sensor plates 2205 may have a similar increase in value.

In some embodiments a sawtooth-shape border or perimeter may have the same effective border as a straight-line border that does not have a sawtooth. In some embodiments a border with a very slight curve may have the same effective border as a straight-line border that does not have a slight curve. In some embodiments a sensor plate 2205 with a slot in it has the same effective geometry as an otherwise equivalent sensor plate 2205 without a slot. In some embodiments a sensor plate 2205 with a small hole in it may have the same effective geometry as an equivalent sensor plate 2205 without a hole. Many other geometries are possible that may be effectively equivalent to other substantially equivalent geometries. Many other borders are possible that may effectively be equivalent to other substantially equivalent borders. If a geometry or a border has a property that is effectively equivalent to another geometry or border, then the two may be considered to be similar.

In some embodiments a group 2207 of sensor plates 2205 is configured such that each sensor plate 2205 in the group 2207 has the same geometry. In some embodiments each of the sensor plates 2205 in the group 2207 is radially symmetrical.

The plurality of indicators 2006 may be toggled between a deactivated state and an activated state to indicate a location within the sensing field of a region of relative high sensor reading. Activated indicators 2004 can indicate the position of the obscured feature 2003. Proximity indicators 2039 can indicate that the obscured feature detector 2001 may be near the obscured feature 2003.

In FIGS. 20-22, the indicators 2006 are positioned on a layer above the sensor plates 2205. In some embodiments there may be an active shield plate 2623 between the sensor plates 2205 and the indicators 2006 so that the indicators 2006 do not interfere with the function of the sensor plates 2205. In some embodiments it may be desirable to position the indicators 2006 on a layer above the sensor plates 2205 so that each of the sensor plates 2205 may have a similar distance from the sensor plate 2205 to the edge of a corresponding PCB.

In some embodiments, a layer of protective material is mounted to the bottom of the obscured feature detector 2001, such that there is a layer of protective material between the surface 2002 and the obscured feature detector 2001. In some embodiments, the protective material has the interior substantially filled such that it is substantially free from cavities. In some embodiments the protective material is unlike felt, Velcro, cloth, or other materials that have an interior with cavities. The layer of protective material may serve the purpose of protecting the bottom of the obscured feature detector 2001 from damage due to knocks, bumps, and wear-and-tear. The protective material could be made from a solid piece of material, such as plastic or other solid non-conductive materials. A solid layer of plastic may provide a low friction surface that would allow the obscured feature detector 2001 to slide across the wall. Although some embodiments of the obscured feature detector 2001 do not require sliding to operate, a low friction surface may be useful to some users who may choose to move the obscured feature detector 2001 from position to position by sliding it.

The protective layer of plastic may be mounted with a pressure sensitive adhesive, glue, or other means. The layer of protective material may be a complete layer that covers the entire surface; it may be rectangular strips, round pieces, or other layers of plastic with other geometries.

A protective material that is substantially filled such that it is substantially free from cavities may build up less static charge than prior art solutions and may advantageously provide for more consistent sensor readings.

In some embodiments the protective material is UHMW-PE (Ultra-High Molecular Weight Polyethylene). UHMW-PE has a low coefficient of friction. UHMW-PE also absorbs very little moisture which may provide increased immunity from changes in humidity, and may provide enhanced immunity from changes in humidity.

Figure 23:
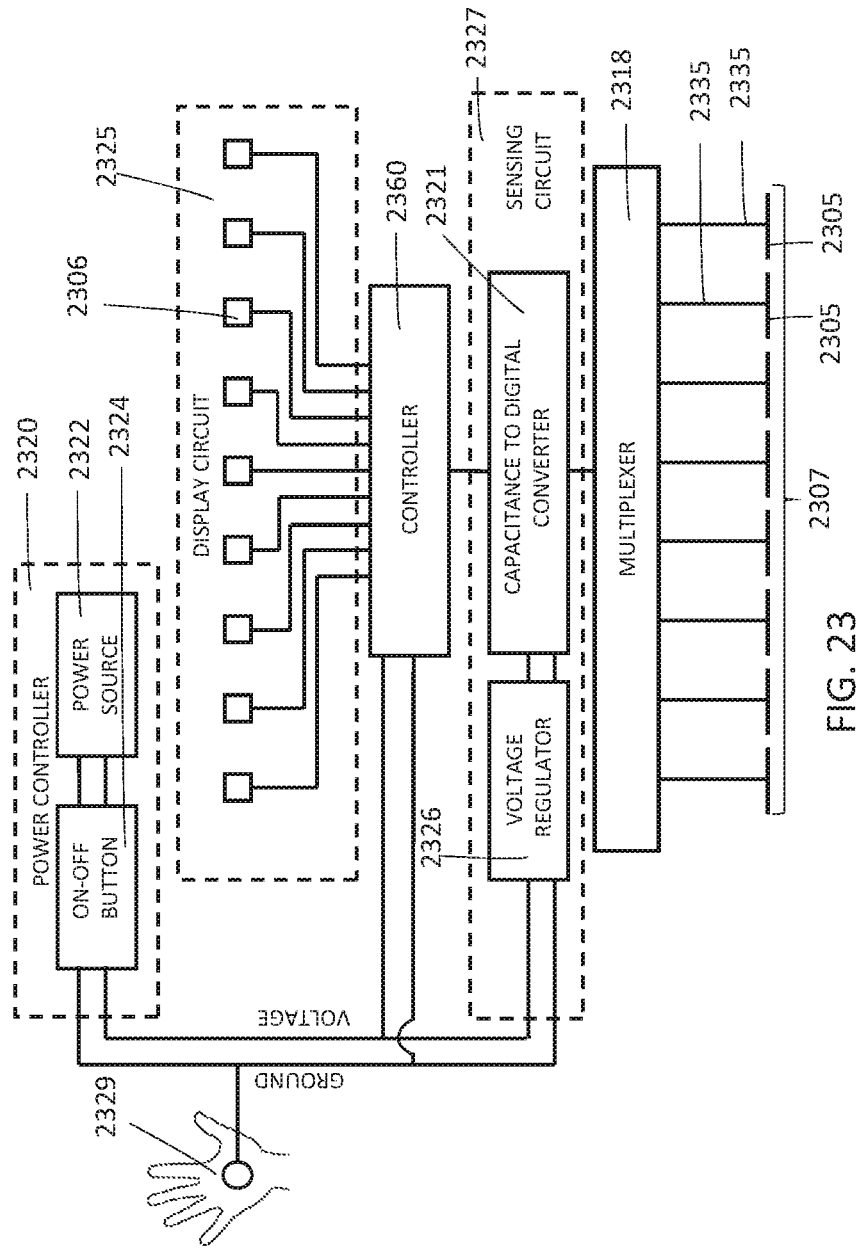
FIG. 23 is a diagram of a circuit of an obscured feature detector, according to one embodiment.

FIG. 23 is a diagram of a circuit of an obscured feature detector 2301, according to one embodiment. The circuit includes a multiplexer 2318, a power controller 2320, a display circuit 2325, a sensing circuit 2327, and a controller 2360.

The power controller 2320 may include a power source 2322 and an on-off button 2324. The power source 2322 can comprise an energy source for powering the indicators 2306 and supplying power to a capacitance-to-digital converter 2321, and the controller 2360. In some embodiments, the power source 2322 can comprise a DC battery supply. The on-off switch 2324 can be used to activate the controller 2360 and other components of the obscured feature detector 2001. In some embodiments, the on-off switch 2324 comprises a push-button mechanism that activates components of the obscured feature detector 2001 for a selected time period. In some embodiments the push button activates the components such that the components remain activated until the button is released. In some embodiments the on-off switch 2324 comprises a capacitive sensor that can sense the presence of a finger or thumb over the button. In some embodiments, the on-off switch 2324 can comprise a toggle switch or other types of buttons or switches.

The display circuit 2325 may include one or more indicators 2306 that are electronically coupled to the controller 2360.

The sensing circuit 2327 may include a voltage regulator 2326 and the capacitance-to-digital converter 2321. In some embodiments, as shown in FIG. 23, the sensing circuit 2327 comprises a plurality of sensors, the voltage regulator 2326, and the capacitance-to-digital converter 2321. The voltage regulator 2326 may be used to condition the output of the power controller 2320, as desired. In some embodiments the voltage regulator 2326 is placed as near as possible to the capacitance-to-digital converter 2321, which may provide a better power source 2322 to the capacitance-to-digital converter 2321. The sensing circuit 2327 can be electrically coupled to the controller 2360. One or more sensor plate traces 2335, or electrically conductive paths on the PCB, may connect the individual sensor plates 2305 to the capacitance-to-digital converter 2321. The connection of the sensor plates 2305 to the capacitance-to-digital converter 2321 may be made via the multiplexer 2318. The multiplexer 2318 can individually connect the sensor plates 2305 to the capacitance-to-digital converter 2321.

In some embodiments the multiplexer 2318 may connect a single sensor plate 2305 to the sensing circuit 2327. In some embodiments, the multiplexer 2318 may connect more than one adjacent sensor plate 2305 to the sensing circuit 2327. In some embodiments, the multiplexer 2318 may connect more than one non-adjacent sensor plate 2305 to the sensing circuit 2327. In some embodiments, the multiplexer 2318 is configured so that the sensing circuit 2327 measures the capacitance of one sensor plate 2305. In some embodiments, the multiplexer 2318 is configured so that the sensing circuit 2327 measures the aggregate capacitance of two or more sensor plates 2305.

Each individual sensor plate 2305 of a group 2307 can be independently connected to the capacitance-to-digital converter 2321 via the multiplexer 2318. In some embodiments, the group 2307 itself comprises layers of copper on a PCB.

Figure 27:
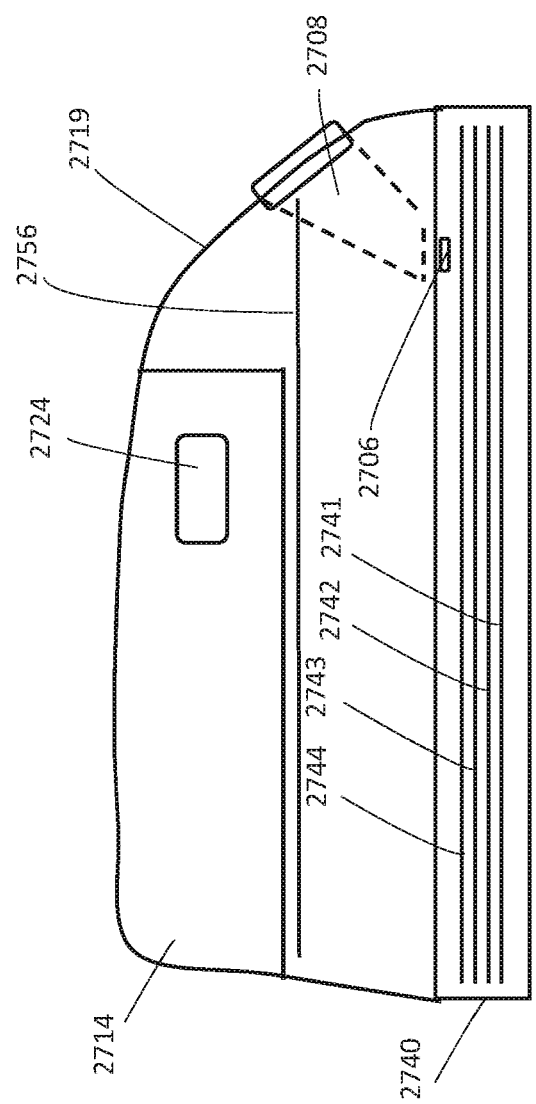
FIG. 27 is a cross-sectional view of an obscured feature detector, according to one embodiment, including a housing, with light pipes and a button, and a printed circuit board.
Figure 37:
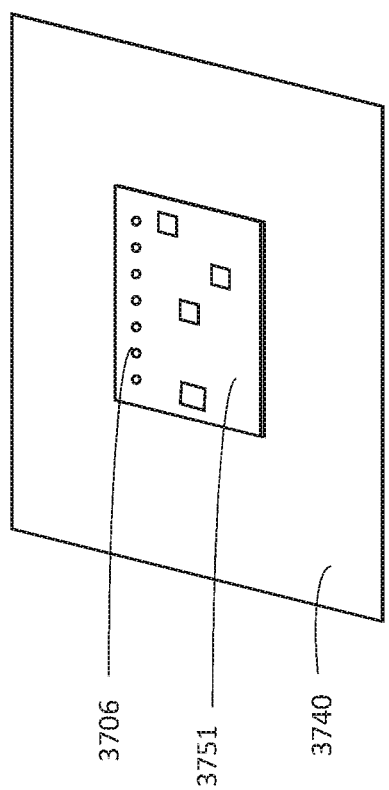
FIG. 37 illustrates two different printed circuit boards in a stacked configuration.

In some embodiments a two-layer PCB is configured as a sensor plate board 2740 (see FIGS. 27 and 37). In some embodiments a first layer of the sensor plate board 2740 comprises the sensor plates 2305, and a second layer of the sensor plate board 2740 comprises a shield. In some embodiments, the shield comprises a layer of copper that covers the entire surface of the second layer of the PCB. In some embodiments the layer of copper is covered with a non-conductive layer of soldermask. In some embodiments there are holes in the layer of soldermask. In some embodiments, the holes in the layer of soldermask comprise solder pads that are suitable for making solder bonds.

In some embodiments a four-layer PCB is configured as an interconnection board that has interconnections suitable for connecting circuitry components. In some embodiments the interconnection board is configured with four layers of interconnections that are suitable for interconnecting the sensing circuit 2327, the controller 2360, and the display circuit 2325. In some embodiments one side of the PCB is configured for mounting components, and a second side of the PCB is configured with solder pads.

In some embodiments the sensor plates 2305 are arranged on a first PCB. In some embodiments the interconnection circuitry is arranged on a second PCB. In some embodiments the first PCB is bonded to the second PCB.

In some embodiments there are solder pads on the sensor plate board 2740 that are complementary with solder pads on an interconnection board. In some embodiments the sensor plate board 2740 and the interconnection board 3751 may be stacked on top of one another and bonded to each other (e.g., FIG. 37). In some embodiments the bonding agent that bonds the two PCBs together may be solder. In some embodiments solder paste may be used to bond two PCBs together. In some embodiments, they may be bonded together with solder and the process to bond them together may be standard SMT processes. The standard SMT process may include using a stencil to place solder paste in the desired locations. The SMT process may include placing one PCB on top of another. In some embodiments pins may be used to ensure proper alignment of the two PCBs. In some embodiments the final step of the SMT process may involve running the stacked PCBs through a reflow oven (e.g., FIG. 37 illustrates an interconnection board 3751 stacked on top of a sensor plate board 2740).

In some embodiments the sensor plates 2305, shield, and circuitry are placed on a single PCB. In some embodiments a six-layer PCB is used. In some embodiments the bottom layer, which is the sixth layer, of the PCB is configured with sensor plates 2305. The fifth layer may be an active shield. The top four layers may connect the balance of the circuitry.

In some embodiments the sensor plates 2305, shield, and circuitry are placed on a single PCB. In some embodiments a four-layer PCB is used. First and second layers of the PCB are configured with interconnection circuitry. In some embodiments the bottom layer, which is the fourth layer, of the PCB is configured with sensor plates 2305. The third layer may be an active shield.

The PCB can be made from a variety of suitable materials, such as, for example, FR-4, FR-406, or more advanced materials used in radio frequency circuits, such as Rogers 4003C. Rogers 4003C, and other radio-frequency-class PCB substrates, may offer improved performance across a broader temperature and humidity range.

As used herein, the term "module" can describe any given unit of functionality that can perform in accordance with one or more embodiments of the present invention. For example, a module might by implemented using any form of hardware or software, or a combination thereof, such as, for example, one or more processors, controllers 2360, ASICs, PLAs, logical components, software routines, or other mechanisms.

Different processes of reading a capacitance and converting it to a digital value, also known as a capacitance-to-digital conversion, are well-described in the prior art. The many different methods are not described here, and the reader is referred to the prior art for details about different capacitance-to-digital converter methods. Some embodiments use a sigma-delta capacitance-to-digital converter, such as the one that is built into the Analog Devices AD7747 integrated circuit. Some embodiments use a charge-sharing method of capacitance-to-digital conversion.

In some embodiments the voltage regulator 2326 may comprise the ADP150-2.65 from Analog Devices, or the NCP702 from ON Semiconductor, which provide very low noise. In some embodiments, the controller 2360 may comprise the C8051F317 from Silicon Laboratories, or any of many other microcontrollers.

Detecting obscured features 2003 can require a high degree of accuracy, and may require more accuracy than the capacitance-to-digital converter 2321 may be able to provide, if the native capacitance-to-digital converter 2321 sensor readings are used alone. Native sensor readings are the raw values read from the capacitance-to-digital converter 2321; they are the digital output of the capacitance-to-digital converter 2321.

Some embodiments perform native reads multiple times, and combine the results of the multiple native reads, to create a reading. Some embodiments perform native reads multiple times, and combine the results of the multiple native reads, using a different configuration for two or more of the native reads to create a reading. Some embodiments perform native reads multiple times, and sum or average the results of the multiple native reads, to create a reading. In some embodiments this improves the signal-to-noise ratio. Each native read may involve reading one sensor plate 2305. A native read could also involve reading a plurality of sensor plates 2305, if multiple sensor plates 2305 are multiplexed to the capacitance-to-digital converter 2321. In some embodiments multiple native reads are combined to create a reading.

Summing or averaging multiple native reads may improve the signal-to-noise ratio, but may not reduce the effect of non-linearities in the capacitance-to-digital converter 2321. The ideal capacitance-to-digital converter 2321 is perfectly linear, which means that its native sensor readings increase in direct proportion to an increase in the capacitance being sensed. However, many capacitance-to-digital converters 2321 may not be completely linear, such that a change in the input capacitance does not result in an exactly proportional increase in the native reading. These non-linearities may be small, but when a high degree of accuracy is desired it may be desirable to implement methods that reduce the effects of the non-linearities.

In some embodiments, the ill effects of the non-linearities may be mitigated by summing multiple native reads, using a slightly different configuration for each of the native reads. Some embodiments perform native reads using two or more different configurations.

For example, the bias current is one parameter that can be altered to create different configurations. The bias current could be set to normal, or normal +20%, normal +35%, or normal +50%. Different bias currents produce different native sensor readings, even if all other factors remain constant. Since each native reading has a different value, presumably each native reading may be subject to different non-linearities. Presumably summing or averaging sensor readings that are subject to different non-linearities may cause the non-linearities to partially cancel each other out, instead of being summed or multiplied.

In some embodiments there are two separate and independent capacitance-to-digital converters 2321. In some embodiments each of them may have different non-linearities. Using both of the capacitance-to-digital converters 2321, using the first converter for some of the reads and using the second converter for some of the reads, may mitigate the effect of any single non-linearity.

Some embodiments perform native reads on each of the sensor plates 2305 using each of twelve different configurations.

After completing the sensor readings, in some embodiments, two different calibration algorithms may be performed: first an individual-plate calibration that adjusts for individual sensor plate 2305 variations, and second a surface material calibration that adjusts the sensor readings so that they are tuned to the surface density/thickness. Other embodiments may only use one of the two calibration algorithms. Some embodiments may use other calibration algorithms. In some embodiments the calibration algorithms are performed by a calibration module.

In some embodiments, individual plate calibration is employed first. With individual plate calibration, each sensor plate 2305 may have its own individual calibration value. In some embodiments, after the sensor readings are taken, an individual plate calibration value is added to, or subtracted from, each of the sensor readings. Other embodiments may use multiplication, division, or other mathematical functions to perform the individual plate calibration. In some embodiments, the individual plate calibration value is stored in non-volatile memory. Individual plate calibration compensates for individual sensor plate 2305 irregularities, and is used to compensate for these irregularities. In some embodiments it is presumed that after performing individual plate calibration that the sensor readings will presumably have the same calibrated values, if the sensor plate sensor readings are taken while the obscured feature detector 2301 is on a surface that is similar to the surface 2002 the obscured feature detector 2001 was calibrated on (see e.g., FIG. 22). For example, if sensor readings are performed on ½" sheetrock 2002, without any obscured features 2003 present, and the individual calibration values were created for ½" sheetrock 2002, then after performing individual plate calibration, it is presumed that all the sensor readings would be corrected to a common value. If sensor readings are performed on a thicker material (such as ⅝" sheetrock 2002), a thinner material (such as ⅜" sheetrock 2002), or a different material (such as ¾" plywood) then there may be some error in the values. Surface material calibration may help correct this error.

In some embodiments surface material calibration may be used.

In some embodiments, after calibrating the sensor plate sensor readings the obscured feature detector 2301 decides if an obscured feature 2003 is present. In some embodiments the lowest sensor plate reading is subtracted from the highest sensor plate reading. If the difference is greater than a threshold value then a determination is made that an obscured feature 2003 is present.

If it is determined that no obscured features 2003 are present, then all of the indicators 2306 may be deactivated. If an obscured feature 2003 is present then the obscured feature detector 2301 begins the process of determining the position(s) and width(s) of the obscured feature(s) 2003.

In some embodiments pattern matching may be employed to determine which LEDs to activate. In some embodiments a pattern matching module is used to determine the locations of the obscured features 2003. The pattern matching module compares the calibrated and scaled sensor readings from the sensor plates 2305 to several predetermined patterns. The pattern matching module determines which predetermined pattern best matches the sensor readings. Then the set of indicators 2306 that corresponds to the best matching pattern is activated. Additional details about pattern matching are discussed in the prior art, such as in U.S. Pat. No. 8,884,633. Those details will not be repeated here; instead the reader is encouraged to refer to them directly.

In some embodiments the obscured feature detector 2301 comprises a single capacitance-to-digital converter 2321. In some embodiments the sensor plates 2305 may be individually connected to the capacitance-to-digital converter 2321. In some embodiments the sensor plates 2305 may be individually connected to the capacitance-to-digital converter 2321 via the multiplexer 2318. In some embodiments more than one sensor plate 2305 may be connected to the capacitance-to-digital converter 2321 at a time. In some embodiments multiple adjacent sensor plates 2305 may be electrically connected to the capacitance-to-digital converter 2321. In some embodiments multiple non-adjacent sensor plates 2305 may be connected to the capacitance-to-digital converter 2321. The use of the multiplexer 2318 to connect sensor plates 2305 to a single capacitance-to-digital converter 2321 may improve sensor plate 2305 to sensor plate 2305 consistency of the sensor readings, because the sensor readings from each of the sensor plates 2305 may be equally affected by variations to the capacitance-to-digital converter 2321. Factors that may affect the sensor readings from the capacitance-to-digital converter 2321 may include, but are not limited to, process variations, temperature variations, voltage variations, electrical noise, aging, and others.

In some embodiments, the sensor plate traces 2335 are routed such that each of the sensor plate traces 2335 has substantially equal capacitance, resistance, and inductance. In some embodiments it is desirable for each of the sensor plate traces 2335 to have the same electrical properties, so that each of the sensor plates 2305 will respond equivalently to the same detected object(s).

Figure 25:
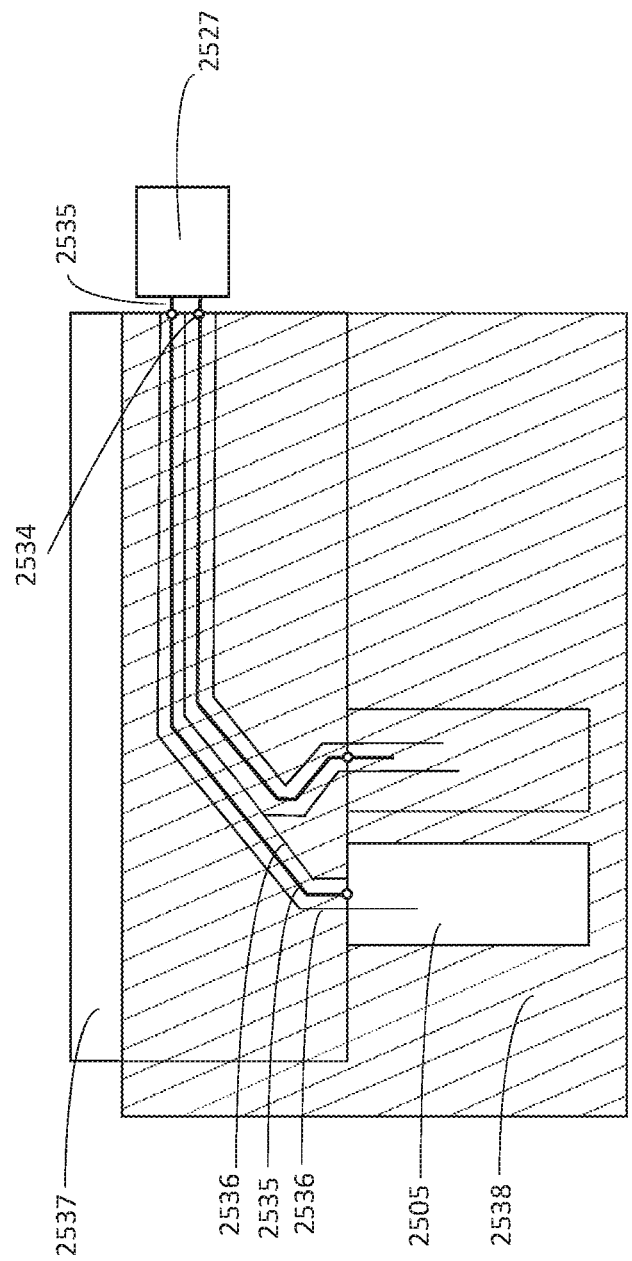
FIG. 25 illustrates a routing of sensor plate traces of an obscured feature detector, according to one embodiment. In the illustrated embodiment, each of the sensor plate traces has substantially similar trace length and the traces are surrounded by an active shield.

In some embodiments each of the sensor plate traces 2335 from the capacitance-to-digital converter 2321 to each of the sensor plates 2305 has substantially the same length (see, e.g., FIG. 25). In some embodiments two or more of the sensor plate traces 2335 from the capacitance-to-digital converter 2321 to the sensor plates 2305 have substantially the same length. In some embodiments sensor plate traces 2335 with substantially the same length may have more equivalent capacitances, inductances, and resistances. Equal length sensor plate traces 2335 may offer enhanced performance because they may improve the uniformity of the sensor readings, such that the sensor plates 2305 respond more equivalently to the same detected objects, and may provide more immunity from environmental conditions, such as temperature and humidity.

In some embodiments each of the sensor plate traces 2335, which comprises electrically conductive paths, has substantially the same width. In some embodiments, both the width and the length of each of the sensor plate traces 2335 are substantially equivalent. In some embodiments the sensor plate traces 2335 will have more than one segment. For example, a first segment of the traces may route the sensor plate traces 2335 from a capacitance-to-digital converter 2321 to a via. The via may take the sensor plate trace 2335 to a different layer of the PCB, where there may be a second segment of the sensor plate trace 2335. In some embodiments all of the sensor plate traces 2335 will have the same length and width, in each segment, as the other traces in that segment. In some embodiments two or more of the sensor plate traces 2335 will have the same width throughout a first segment. In some embodiments two or more of the sensor plate traces 2335 will have the same width throughout a second segment. In some embodiments two or more of the sensor plate traces 2335 will have the same length throughout a first segment. In some embodiments two or more of the sensor plate traces 2335 will have the same length throughout a second segment.

In some embodiments the sensor plate traces 2335 comprise multiple segments. In some embodiments a segment of a sensor plate trace 2335 may be the wire bonds that are within the package of an integrated circuit that route the signals from the piece of silicon to the pins of the integrated circuit package. In some embodiments a segment of a sensor plate trace 2335 may comprise a layer of copper on a first layer of a PCB. In some embodiments a segment of a sensor plate trace 2335 may comprise a layer of copper on a second layer of a PCB.

In some embodiments the capacitance-to-digital converter 2321 will read the sum of the capacitance on the sensor plates 2305 and the capacitance on the sensor plate traces 2335. In some embodiments, only detecting the sensor readings on the sensor plates 2305, and not detecting the sensor plate traces 2335, may be preferable. However, because the sensor plates 2305 and sensor plate traces 2335 are electrically coupled, a means of ensuring stable and uniform capacitance on the sensor plate traces 2335 may be desired. For example, it may be desirable to configure the sensor plate traces 2335 so that their capacitance is uniform and stable. Consequently, it may be preferred for the sensor plate traces 2335 to be configured so that the sensor plate traces 2335 do not change. In some embodiments it may be preferred that the sensor plate traces 2335 do not change relative to each other, such that any change in the capacitance on one sensor plate trace 2335 is reflected in each of the sensor plate traces 2335.

In some embodiments it may be advantageous to shield the sensor plate traces 2335. Sensor plate trace shielding may protect the sensor plate traces 2335 from external electromagnetic fields. In some embodiments shielding the sensor plate traces 2335 may also advantageously provide a more consistent environment for the sensor plate traces 2335 by helping to ensure that each of the sensor plate traces 2335 has an environment that is similar to each of the other sensor plate traces 2335.

In some embodiments each of the sensor plate traces 2335 from the capacitance-to-digital converter 2321 to each of the sensor plates 2305 has substantially the same surroundings. In some embodiments the sensor plate traces 2335 are routed sufficiently far apart so that capacitive and inductive coupling between the sensor plate traces 2335 is minimized, and may improve consistency because each of the sensor plate traces 2335 may have surroundings that are more similar to the other sensor plate traces 2335. In some embodiments each of the sensor plate traces 2335 is shielded on one or both sides with an active shield trace (see, e.g., FIG. 25).

In some embodiments a user 2329 may be electrically coupled to the sensing circuit 2327. In some embodiments the quality of the sensor readings is increased when an electrically conductive point of the sensing circuit 2327 is coupled to the user 2329. Electrically coupling the user 2329 to the sensing circuit 2327 may provide a stationary voltage level for the sensing circuit 2327 and may result in higher quality sensor readings that have higher sensitivity. For example, a prior art obscured feature detector that drives the sensor plates 2305 with a 3.0V may in reality only drive the sensor plates 2305 with a 3.0V signal relative to ground. However, if the ground is floating, then driving the sensor plates 2305 with 3.0V could result in a 1.5V signal on the sensor plates 2305 and a −1.5V signal on the ground.

In some embodiments electrically coupling the user 2329 to the sensing circuit 2327 may result in higher absolute voltage swings on the sensor plates 2305, which may be due in part to the sensing circuit 2327 being held at a stable level. In some embodiments electrically coupling the user 2329 to the sensing circuit 2327 may also result in sensor readings that are more consistent.

In some embodiments the user 2329 is electrically coupled to the ground of the sensing circuit 2327, as shown in FIG. 23. In some embodiments the user 2329 is electrically coupled to the voltage source of the sensing circuit 2327. In some embodiments the user 2329 is electrically coupled to a different electrically conductive point of sensing circuit 2327.

In some embodiments the hand of the user 2329 may be electrically coupled to the sensing circuit 2327 by making direct contact with the sensing circuit 2327. In some embodiments an electrically conductive material, such as a wire, may electrically couple the hand of the user 2329 to the sensing circuit 2327. In some embodiments the button, which the user 2329 would need to touch to activate the obscured feature detector 2301, may comprise an electrically conductive material which may be electrically coupled to the sensing circuit 2327. In some embodiments the button may comprise aluminum or another electrically conductive material such as tin-plated steel. In some embodiments an aluminum button may be anodized, which may provide pleasing cosmetics.

In some embodiments the housing 2019 (see FIG. 21) of the obscured feature detector 2301 may comprise an electrically conductive material, such as an electrically conductive plastic. In some embodiments only a portion of the housing 2019 may comprise electrically conductive plastic. The electrically conductive housing, or a portion of the electrically conductive housing, may be coupled to an electrically conductive point in the sensing circuit 2327, thereby coupling the user 2329 to the sensing circuit 2327.

In some embodiments mixing carbon black with the plastic resin may provide electrically conductive properties. Many thermoplastics, including polypropylene and polyethylene, become electrically conductive when a carbon black is mixed into the plastic resin. In some embodiments the conductivity increases as the concentration of carbon black is increased, advantageously making it possible to control the conductivity of the plastic. In some embodiments a plastic with a conductivity that is less than about 25,000 ohms-cm provides sufficiently high conductivity to effectively couple the user 2329 to the sensing circuit 2327. In some embodiments a higher degree of conductivity may be desired. In some embodiments a lower degree of conductivity may be desired. In some embodiments it is advantageous for the user 2329 to be coupled to the sensing circuit by a path with less than about 50 mega-ohms.

In some prior art obscured feature detectors, a change in the position of the hand of the user 2329 can cause a change in the sensor readings. This may occur in some prior art obscured feature detectors because the hand may form a portion of the path between the sensor plates 2305 and ground. As a result, a change in hand position can cause a change in the sensor readings of the sensor plates 2305. Disadvantageously, this may reduce the accuracy of the sensor readings.

If it were possible for the size and position of the hand of the user 2329 to be constant, it may be possible to do a calibration adjustment to mathematically remove the effect of the hand of the user 2329 from the raw sensor readings. However, in practice this may not be feasible. In practice the size, shape, and position of hands of different users 2329 may vary too much to make a calibration adjustment practically possible.

To improve performance in light of the aforementioned issues, in some embodiments a conductive hand guard may be positioned between the hand of the user 2329 and the sensor plates 2305. In some embodiments the hand guard may be grounded to the sensing circuit 2327, as illustrated in FIG. 23.

Figure 24:
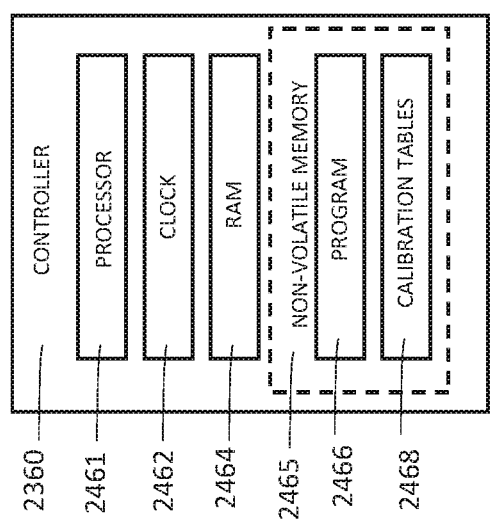
FIG. 24 is a diagram of a controller of an obscured feature detector, according to one embodiment.

FIG. 24 is a diagram of the controller 2360, according to one embodiment. The controller 2360 includes a processor 2461, a clock 2462, random access memory (RAM) 2464, a non-volatile memory 2465, and/or another computer-readable medium. The non-volatile memory 2465 may include a program 2466 (e.g., in the form of program code or computer-executable instructions for performing operations) and calibration tables 2468. In operation, the controller 2360 may receive the program 2466 and may synchronize the functions of the capacitance-to-digital converter 2321 and the display circuit 2325 (see FIG. 23). The non-volatile memory 2465 receives and stores the program 2466 as well as LUT and calibration tables 2468. The program 2466 can include a number of suitable algorithms, such as, for example, an initialization algorithm, a calibration algorithm, a pattern-matching algorithm, a multiplexing algorithm, a display management algorithm, an active sensor activation algorithm, and a non-active sensor management algorithm.

FIG. 25 illustrates a routing of sensor plate traces 2535 of an obscured feature detector, according to one embodiment. In the illustrated embodiment of FIG. 25, each of the sensor plate traces 2535 has substantially similar trace length and the sensor plate traces 2535 are surrounded by an active shield trace 2536. In some embodiments, as shown in FIG. 25, each of the sensor plate traces 2535 is shielded on one or both sides with the active shield trace 2536. In some embodiments the active shield trace 2536 is routed at a uniform distance from the sensor plate traces 2535 on both sides of each sensor plate trace 2535. In some embodiments, the active shield traces 2536 are substantially parallel to the sensor plate traces 2535. In some embodiments, the active shield traces 2536 are positioned such that the active shield traces 2536 shield the sensor plate traces 2535 from external electromagnetic fields. In some embodiments, the sensor plate traces 2535 and active shield traces 2536 are positioned such that the capacitance between each sensor plate trace 2535 and each respective active shield trace 2536 is substantially the same for each sensor plate trace 2535 and its respective active shield trace 2536. In some embodiments a sensor plate trace 2535 is accompanied by two active shield traces 2536, such that one active shield trace 2536 is positioned on each side of the sensor plate trace 2535. In some embodiments, a sensor plate trace 2535 and an active shield trace 2536 are positioned such that there is a constant distance between a sensor plate trace 2535 and the respective active shield trace 2536, along their length. In some embodiments each of the active shield traces 2536 is positioned at a uniform distance away from the respective sensor plate trace 2535. In some embodiments a segment of each sensor plate trace 2535 and a segment of each active shield trace 2536 comprise copper traces on a PCB. In some embodiments, the sensor plate traces 2535 and active shield traces 2536 are both located on the same layer of a PCB. In some embodiments, the active shield traces 2536 are driven at a fixed voltage level. In some embodiments, the active shield traces 2536 are driven at a voltage that is similar to the voltage driven on the sensor plate traces 2535.

In some embodiments the active shield traces 2536 may be routed at a distance of approximately 0.6 mm from each sensor plate trace 2535, along as much of the length of the sensor plate trace 2535 as is possible. In some embodiments the sensor plate traces 2535 are approximately 0.15 mm wide throughout one segment of the sensor plate trace 2535.

In some embodiments a shield is configured such that there is a shield layer above each sensor plate trace 2535 and a shield layer below each sensor plate trace 2535. A shield layer in some embodiments is a layer of copper on an adjacent layer of a PCB. As a result the sensor plate traces 2535 may shield both on a layer above the sensor plate traces 2535 and on a layer below the sensor plate traces 2535, as well as shielding on either side of the sensor plate traces 2535. In some embodiments the shielding above the sensor plate trace 2535, below the sensor plate trace 2535, and on either side of the sensor plate trace 2535 are all electrically coupled to each other.

In some embodiments the shield is an active shield. An active shield is a shield that is driven with the same voltage potential as the sensed sensor plate(s). In some embodiments the voltage wave that is driven on the sensor plates 2505 and shield may have a triangular shape. In some embodiments the voltage wave that is driven on the sensor plates 2505 and shield may have a sinusoidal shape. In some embodiments the voltage that is driven on the sensor plates 2505 and shield may have a different wave shape.

Presently available obscured feature detectors may include sensor plate traces to connect a sensing circuit to sensor plates. In some presently available obscured feature detectors no shielding is used to shield the sensor plate traces from interferences. These detectors may be configured to keep potential interferences a safe distance away from the sensor plate traces.

Figure 38:
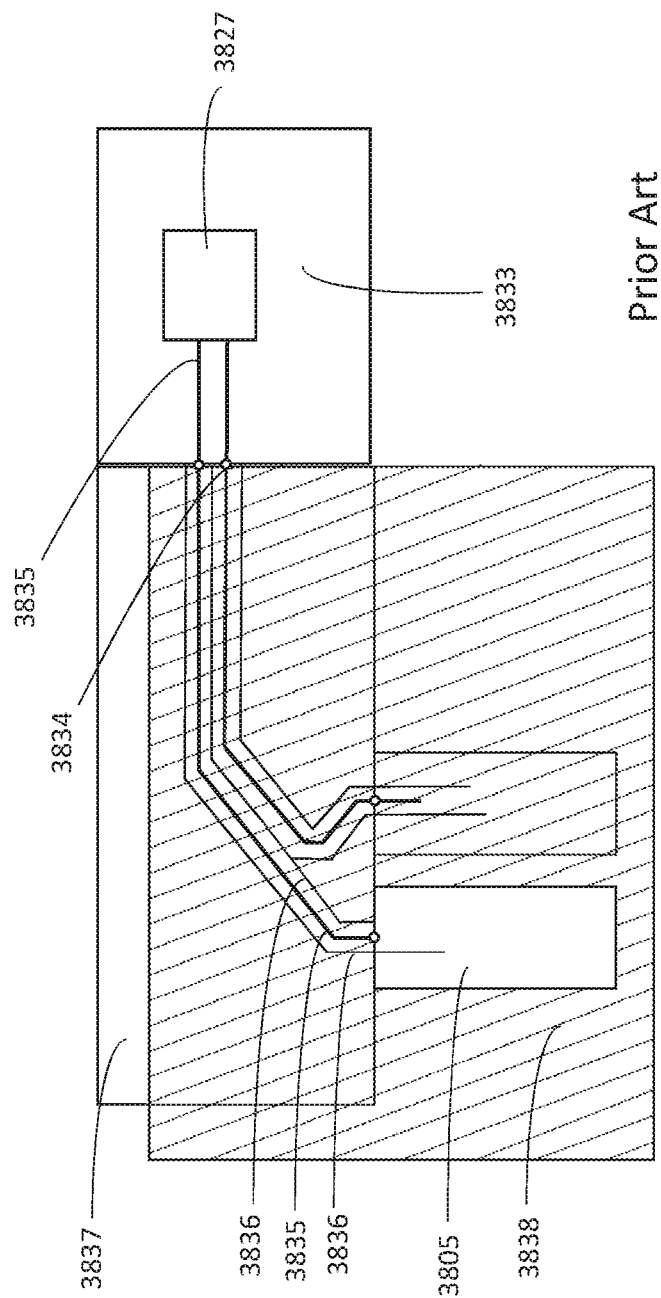
FIG. 38 illustrates a prior art configuration for routing and shielding the sensor plate traces from the controller to the sensor plates.

Other presently available obscured feature detectors may have shielding which may shield the sensor plate traces for a portion of the length of the sensor plate trace. In some presently available obscured feature detectors up to 82% of the sensor plate trace's length may be shielded. An example of a presently available obscured feature detector with shielding is shown in FIG. 38. In presently available obscured feature detectors with shielding, a trace may be routed such that there is a ground plane on a PCB layer that is beneath the sensor plate trace and a via that connects the segment of the sensor plate trace that is on the top layer of the PCB with a segment of the sensor plate trace that is on a lower layer of the PCB. For the segment of the sensor plate trace that is on a lower layer of the PCB, there is a first active shield plane on a layer of the PCB above the sensor plate trace and a second active shield plane on a PCB layer below sensor plate trace. The first active shield plane, the second active shield plane, and the shield traces are all coupled together and are all driven as an active shield. The active shielding may comprise up to 82% of the length of the sensor plate trace.

In these presently available obscured feature detectors, the material that is between the trace and the ground plane may absorb humidity. The material under some of the traces may absorb more humidity than the material that is under other traces. As a result, exposure to humidity may cause the relative sensor readings of the sensor plate traces to change. In other words, when exposed to humidity some of the sensor readings may change more than other sensor plate sensor readings, as a result of the humidity. Undesirably, the change is the result of the humidity being absorbed between the trace and ground—not as a result of an obscured feature being present.

The present disclosure provides improved obscured feature detectors with shielding that may shield the sensor plate traces for more than 82% of the length of the sensor plate trace.

FIG. 25 also illustrates an improved method of routing the sensor plate traces 2535 that may result in better performance. In FIG. 25 there is a very short sensor plate trace 2535 that connects the sensing circuit 2527 to a via 2534. This sensor plate trace 2535 may be only one or two millimeters long. It is made as short as is practicably possible. The via 2534 connects the segment of the sensor plate trace 2535 that is on the top layer of the PCB with a segment of the sensor plate trace 2535 that is on a lower layer of the PCB. For the segment of the sensor plate trace 2535 that is on a lower layer of the PCB, there is a first active shield plane 2537 on a layer of the PCB above the sensor plate trace 2535 and a second active shield plane 2538 on a PCB layer below sensor plate trace 2535. The first active shield plane 2537, the second active shield plane 2538, and the shield traces are all coupled together and are all driven as an active shield.

When the sensor plate trace 2535 and the active shield trace 2536 are both driven with the same signal, then they are the same voltage potential, and the capacitance between them may become unimportant. As a result, as the PCB absorbs humidity and the dielectric constant of the PCB changes, these changes in the dielectric constant of the PCB may not have an effect upon the sensor readings. Changes in the capacitance between the sensor plate trace 2535 and the active shielding (e.g., the active shield trace 2536) do not affect the sensor readings. The result may be that the sensor plate traces 2535 are able to maintain their calibration values better, and the obscured feature detector may be able to determine the locations of the obscured features better.

Figure 26:
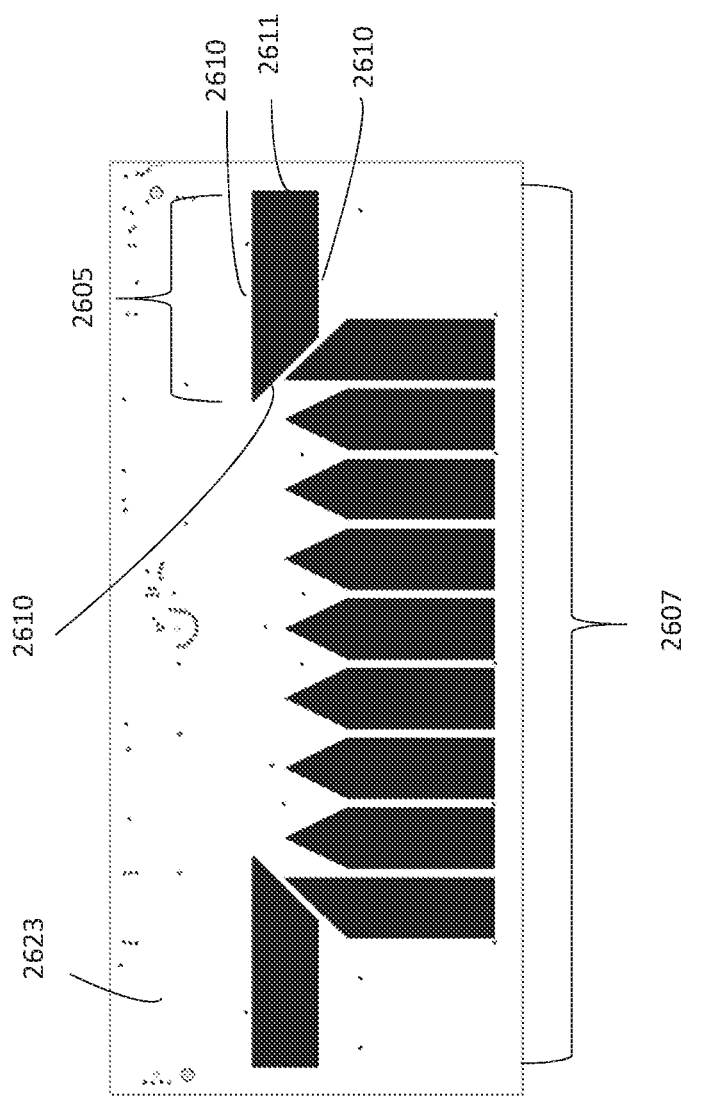
FIG. 26 is a diagram of a sensor plate configuration of an obscured feature detector, according to another embodiment.

FIG. 26 is a diagram of sensor plate configuration of an obscured feature detector, according to one embodiment. In this illustrated arrangement each of the eleven different sensor plates 2605 have similar primary sensing field zones. FIG. 26 illustrates a sensor plate group 2607 that includes eleven sensor plates 2605 and an active shield plate 2623. In this embodiment the group 2607 of eleven sensor plates 2605 are on a bottom layer (e.g., a fourth layer) of a PCB. In this embodiment the active shield plate 2623 covers the entire third layer of the PCB. In some embodiments, one sensor plate 2605 may be sensed at a time. In some embodiments when one sensor plate 2605 is sensed, all of the sensor plates 2605, including the active shield plate 2623, are driven with the same signal as the sensed sensor plate 2605.

The group 2607, plus the active shield plate 2623, when driven together may push the field lines deeper into the sensed surface than may be possible if just a single sensor plate 2605 was driven. In some embodiments this allows field lines from a single sensor plate 2605 to penetrate more deeply, and allows a single sensor plate 2605 to sense more deeply, than may be possible if a single sensor plate 2605 were driven alone.

In the embodiment of FIG. 26, the sensing field may be created by the combination of the group 2607 and the active shield plate 2623 when they are both driven with the same signal. In this embodiment the similarities in the configuration of each of the eleven sensor plates 2605 may provide each sensor plate 2605 with primary sensing zones that are geometrically similar. Likewise, each of the sensor plates 2605 may also have similar sensing fields within its respective primary sensing field zones.

The configuration of the sensor plates 2605 and the active shield plate 2623 in FIG. 26 helps provide similar primary electric field zones for each of the sensor plates 2605. Each of the eleven sensor plates 2605 has a similar external border 2611. They also each have a similar area and a similar internal border 2610. They also each have similar electrical surroundings. Each sensor plate 2605 is surrounded on either side by either another sensor plate 2605 or the active shield plate 2623. Both the active shield plate 2623 and adjacent sensor plates 2605 may be driven similarly, and as a result they may each provide equivalent electrical surroundings. The result may be that each of the eleven sensor plates 2605 in FIG. 26 has a primary sensing field zone that is geometrically similar.

The shapes of the eleven the sensor plates 2605 in FIG. 26 are not identical. Although it may be ideal for the sensor plates 2605 to be identical, an adjustment was made to four of the sensor plates 2605 (two sensor plates 2605 at each end), so that more similar primary sensing field zones may be obtained. In this embodiment achieving more equivalent primary sensing field zones may be more desirable than having identical sensor plate geometries. Nevertheless, all of the eleven sensor plates 2605 may have substantially the same area, same external border 2611, similar internal border 2610 configuration, and similar electrical surroundings. This configuration with these similarities may give each sensor plate 2605 an equivalent primary sensing field zone.

In some embodiments it may be beneficial to have similar electrical surroundings that extend beyond the internal borders 2610 of a sensor plate 2605 for 1× to 1.5× the desired sensing depth. For example, if a 1-inch sensing depth is desired it may be beneficial to have similar electrical surroundings around each sensor plate 2605 for at least 1 inch to 1.5 inches beyond the internal borders 2610 of each sensor plate 2605.

FIG. 27 is a cross-sectional view of an obscured feature detector, according to one embodiment, including a housing 2719, with light pipes 2708 and a button 2724, and a PCB 2740. In some embodiments, as shown in FIG. 27, a housing 2719 comprises an upper housing, an on-off switch 2724, a handle 2714, a plurality of light pipes 2708, and a power supply compartment. In some embodiments a conforming core (see conforming core apparatus 3449 in FIG. 34) may be configured to flexibly couple the housing 2719 to a sensor plate board 2740. In some embodiments the sensor plate board 2740 is a multi-layered PCB with a top layer 2744, a second layer 2743, a third layer 2742, and a bottom layer 2741. In some embodiments the sensor plate board 2740 is a multi-layered PCB that couples a capacitance-to-digital converter 2321, a display circuit 2325, and a controller 2360, as described above with reference to FIG. 23. In some embodiments, the housing 2719 comprises plastic. In some embodiments, the housing 2719 comprises ABS plastic. In some embodiments a conductive hand guard 2756 shields the user's hand from the sensor plate board 2740. In some embodiments the hand guard 2756 is connected to the ground of a sensing circuit.

In some embodiments, the handle 2714 comprises a gripping surface. In some embodiments a portion of the gripping surface comprises an elastomer that makes the handle 2714 easier to grip. The handle 2714 is preferably positioned so that the user's hand does not obscure a view of the indicators 2706 when grasping the handle 2714. In some embodiments, the power supply compartment comprises a cavity for holding a suitable power supply, such as batteries, and a battery cover for accessing the compartment.

In some embodiments the hand guard 2756 may be configured so that there are no significant straight-line paths between the sensor plates and the user's hand. In some embodiments the housing 2719 may be composed of an electrically conductive material which may comprise the hand guard 2756. In some embodiments the conductive layer of material of the hand guard 2756 may be a layer of conductive plastic. In some embodiments the conductive layer of material of the hand guard 2756 may be a layer of a different conductive material, such as a conductive paint. In some embodiments the conductive layer of material of the hand guard 2756 may be a sheet of metal that is hidden within the housing 2719. In some embodiments the hand guard 2756 may comprise tin-plated steel, which may provide for quick, easy and reliable solder joints. In some embodiments an entire layer of a PCB may comprise the hand guard 2756. In some embodiments only a portion of a layer of a PCB may comprise the hand guard 2756, because in some embodiments it may not be necessary for the hand guard 2756 to comprise an entire layer. For example, a ring around the outside of a PCB may be an effective hand guard 2756.

In some embodiments the hand guard 2756 is configured to minimize an effect of a size and position of the hand. In some embodiments the hand guard 2756 is positioned so that it is near the hand because in some embodiments it may be most effective when it is nearest to the hand. In some embodiments the hand guard 2756 may be electrically coupled to the ground of a sensing circuit 2327 (see FIG. 23). In some embodiments the hand guard 2756 may be coupled to the voltage of the sensing circuit 2327. In some embodiments a different electrically conductive point of the sensing circuit 2327 may be electrically coupled to the hand guard 2756. In some embodiments an electrical wire comprises the electrical path between the hand guard 2756 and the sensing circuit 2327.

Figure 28:
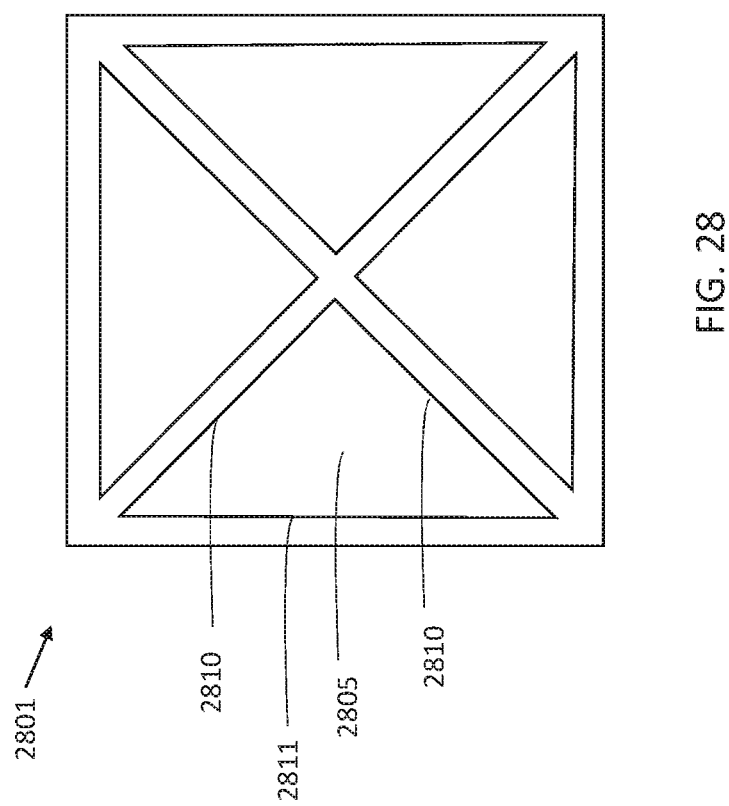
FIG. 28 illustrates a sensor plate group with four sensor plates.

FIG. 28 illustrates a sensor plate group 2801 with four sensor plates 2805. In some embodiments, as shown in FIG. 28, the sensor plate group 2801 may comprise four similar sensor plates 2805. In the embodiment shown in FIG. 28, each triangular sensor plate 2805 has two sides of a triangle that each form internal borders 2810 and one side of the triangle that forms an external border 2811. The four sensor plates 2805 in FIG. 28 are each radially symmetrical. From these four sensor plates 2805, three different sensing zones may be possible. For example, if a vertical stud were disposed at some arbitrary position relative to the sensor plates 2805, three different readings might appear, each reading relative to one sensing zone of the three zones. The first zone might correspond to the sensor plate on the left.

The second zone might correspond to the top and bottom sensor plates (e.g. as can be appreciated, the top and bottom sensor plates would have the same reading because they would each sense the same portion of the vertical stud.) The third zone might correspond to the right sensor plate. The relative readings for each of the three zones could be used to determine the location of the vertical stud.

FIG. 29 illustrates a sensor plate group 2901 with six sensor plates 2905. In some embodiments, as shown in FIG. 29, the sensor plate group 2901 may include six similar sensor plates 2905. In the embodiment shown in FIG. 29, each sensor plate 2905 has two straight sides that each form internal borders 2910 and a straight side that forms an external border 2911. In some embodiments each of the sensor plates 2905 have substantially the same area.

Figure 32:
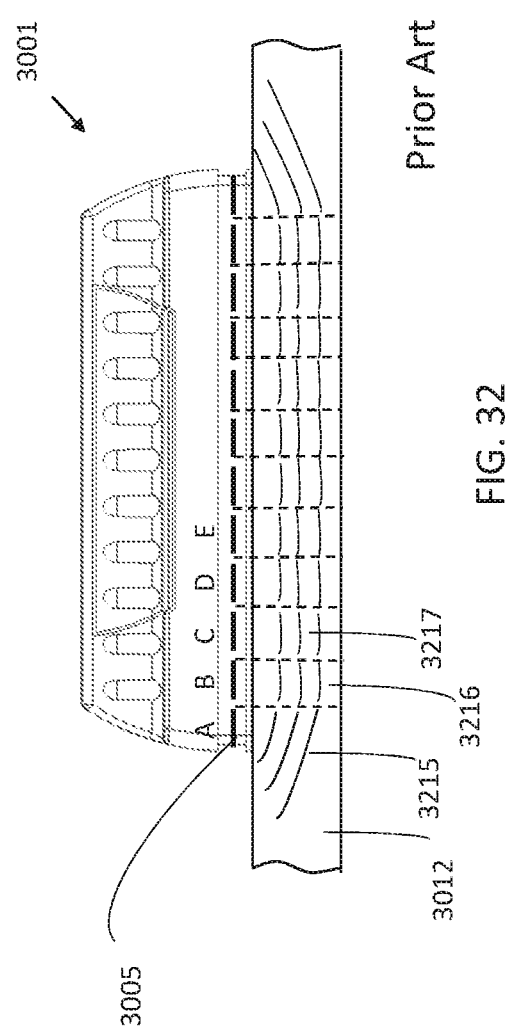
FIG. 32 shows a side view of a prior art obscured feature detector, illustrating primary sensing field zones for several sensor plates.
Figure 33:
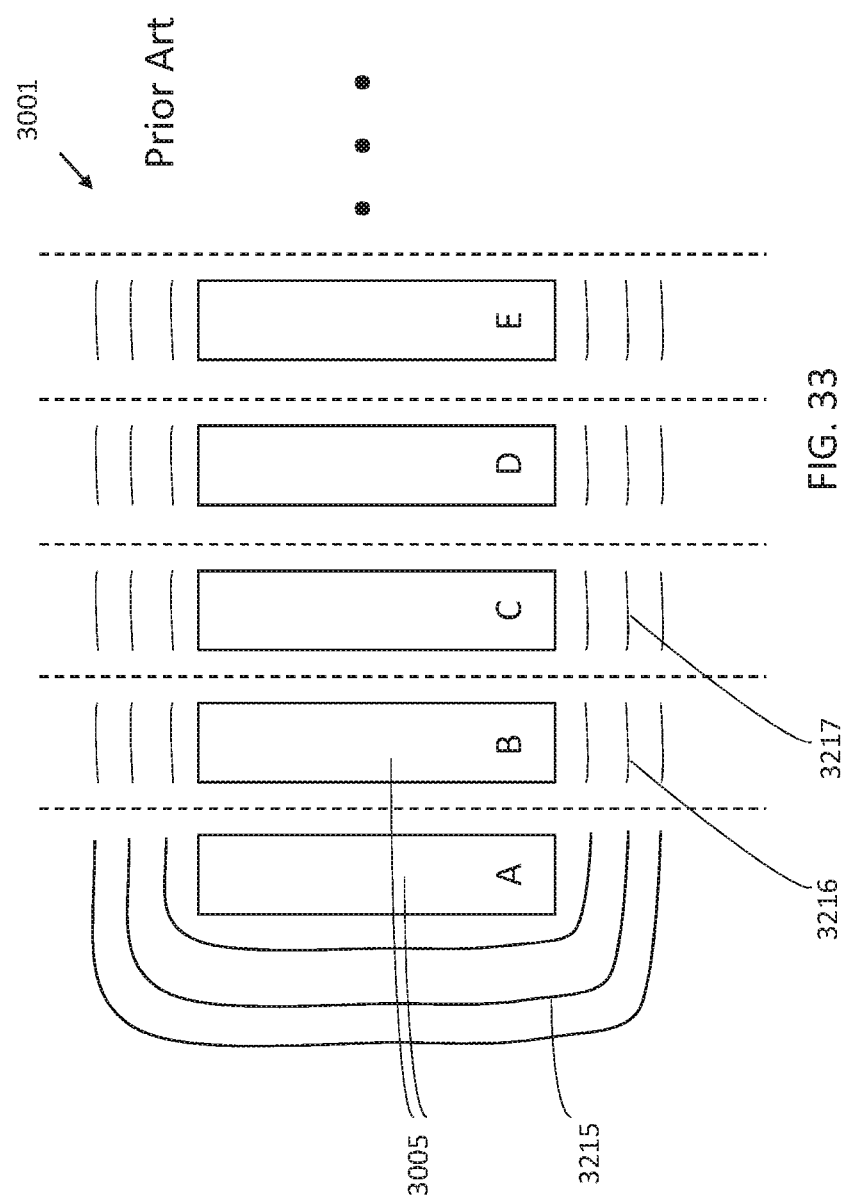
FIG. 33 shows an elevation view of a bottom surface of a prior art obscured feature detector, illustrating the primary sensing field zones for several sensor plates.

FIGS. 30-32 are views of a prior art obscured feature detector. In prior art obscured feature detectors a set of identical sensor plates 3005 are typically arranged in a linear fashion, such as shown in FIGS. 30, 31, 32, and 33. FIG. 30 is a prior art obscured feature detector 3001 placed on a comparatively thinner surface 3012. FIG. 31 is the prior art obscured feature detector 3001 placed on a comparatively thicker surface 3113. FIG. 32 shows a side view of the prior art obscured feature detector 3001, illustrating primary sensing field zones 3215, 3216, 3217 for several sensor plates 3005, including sensor plates A, B, C, D, E. FIG. 33 shows an elevation view of a bottom surface of the prior art obscured feature detector 3001, illustrating the primary sensing field zones 3215, 3216, 3217 for sensor plates A, B, C, D, E.

Referring generally and collectively to FIGS. 30-33, each of the sensor plates 3005 performs a sensor reading of a surface to detect an obscured feature behind the surface. The sensor readings are then compared. The sensor plates 3005 that have the highest sensor readings are interpreted to be the locations of obscured features. However, as shown in FIGS. 30 and 31, the sensor plates 3005 that are near the ends of the group may not respond to obscured features in the same manner as the sensor plates 3005 that are near the center. This issue may be particularly evident when the prior art obscured feature detector 3001 is moved from the thinner, or less dense, surface 3012 to an thicker, or more dense, surface 3113.

FIG. 30 shows representative sensor readings of the prior art obscured feature detector 3001 that is placed on the relatively thinner surface 3012. The relatively thinner surface 3012 could be 0.375-inch-thick sheetrock. FIG. 31 shows representative sensor readings of the prior art obscured feature detector 3001 that is placed on a relatively thicker surface 3113. The relatively thicker surface 3113 could be 0.625-inch-thick sheetrock.

In FIG. 30, the prior art obscured feature detector 3001 is placed on the relatively thinner surface 3012. Each of the sensor plates 3005 may have a calibration adjustment so that each has a calibrated reading of, for example, 100. If this same prior art obscured feature detector 3001 is then moved to another surface 3113 that is thicker, or to a surface that has a higher dielectric constant, the sensor readings would change. An image of the same prior art obscured feature detector 3001 on the thicker surface 3113 is shown in FIG. 31. Ideally, each of the sensor plates 3005 on the thicker surface 3113 would have similar sensor readings to each other, because they are all on the same thicker surface 3113, with no obscured features present. However, it may be observed that the sensor readings of the sensor plates 3005 near the ends may see a larger reading increase than the sensor plates 3005 near the center. In FIG. 31, it may be seen that the sensor plates 3005 near the center have sensor readings of 200, but the sensor plates 3005 at the ends have sensor readings of 250.

In the prior art obscured feature detector 3001 of FIG. 31, and other prior art obscured feature detectors, the sensor plates 3005 that are at the ends are alone in creating electric fields 3009 that extend beyond the edges of the group of sensor plates 3005. As a result, the sensor plates 3005 near the end may respond with a disproportionately higher reading when placed on a thicker surface 3113. Disadvantageously, the controller 2360 may have difficulty determining if the elevated sensor readings are due to the presence of an obscured feature, or due to the prior art obscured feature detector 3001 being placed on the thicker surface 3113. The disclosed embodiments may address these and other challenges.

FIG. 32 illustrates the field lines for the prior art obscured feature detector 3001 of FIGS. 30 and 31. FIG. 32 shows a group of sensor plates 3005 and also shows a two-dimensional representation of the field lines for each of the sensor plates 3005. The field lines are shown for illustrative purposes and are a representation of the actual sensing field. The field lines drawn are equipotential electric field lines. However, this drawing does not limit the scope of the disclosure to this type of field alone. Vector electric field lines or magnetic field lines could have been illustrated in the drawing and are within the scope of the disclosure. The sensing field may be an electric field, a magnetic field, or an electromagnetic field, which is a combination of an electric field and a magnetic field.

In FIG. 32 there are thirteen sensor plates 3005. All of the sensor plates 3005 may be driven with the same signal simultaneously, while one sensor plate 3005 at a time is sensed. Because the sensor plates 3005 are driven simultaneously, with the same signal, the sensing field is defined by the field created by the group of sensor plates 3005, as illustrated in FIG. 32. An active shield plane is not illustrated in the figure, but an active shield may contribute to the sensing field in some embodiments. Five of the sensor plates 3005 are labeled A, B, C, D, E. The field lines emanating from sensor plate E are primarily parallel to sensor plate E. However, the field lines emanating from sensor plate A are not very parallel to sensor plate A. Because the field lines do not have similar direction and strength at each point within the primary sensing field zone the sensor plates A and E do not have similar sensing fields within their primary sensing field zones.

In contrast, sensor plate D and sensor plate E have similar primary sensing field zones because the volume of the sensing field where they are able to sense effectively and the sensing field within that primary sensing field zone are similar. The sensing fields within a primary sensing field zone are similar if the direction of the sensing field and strength of the sensing field are similar at each point within the primary sensing field zone.

FIG. 33 illustrates the same concept from a different angle or perspective. In FIG. 33 the five sensor plates 3005 are again labeled A, B, C, D, E. The approximate primary sensing field zones for each of the sensor plates 3005 are highlighted. On the two-dimensional drawing of FIG. 33, the primary sensing field zone 3215 for sensor plate A is indicated by the drawing of the sensing field lines for sensor plate A. On the two-dimensional drawing of FIG. 33, the primary sensing field zone 3216 for sensor plate B is indicated by the drawing of sensing field lines for sensor plate B. On the two-dimensional drawing of FIG. 33, the primary sensing field zone 3217 for sensor plate C is indicated by the drawing of sensing field lines for sensor plate C.

FIGS. 32 and 33 illustrate the primary sensing field zone with a two-dimensional drawing. However, in reality a three-dimensional primary sensing field zone may exist. There may be a three-dimensional zone for each sensor plate 3005 that comprises the primary sensing field zone for each given sensor plate 3005. In contrast to the prior art embodiment of FIGS. 32 and 33, in some embodiments of the present disclosure the sensor plates 3005 may have an equivalent primary sensing field zone. Each sensor plate 3005 in a group that has an equivalent primary sensing field zone may have an equivalent response to change in surfaces. This disclosure illustrates some configurations wherein each sensor plate 3005 in a group may have an equivalent primary sensing field zone. In some embodiments each sensor plate 3005 with a similar primary sensing field zone may have a similar change in sensor readings in response to a change in the detected surface. In some embodiments the sensor plates 3005 in a group of sensor plates 3005 are each radially symmetrical.

Figure 34:
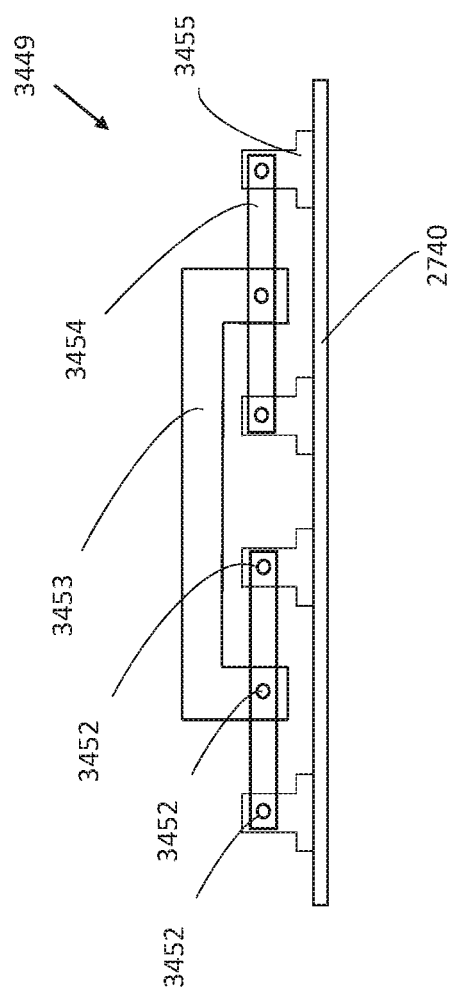
FIG. 34 illustrates a diagrammatic side view of a chassis of a core apparatus of a surface-conforming obscured feature detector, according to one embodiment.
Figure 35:
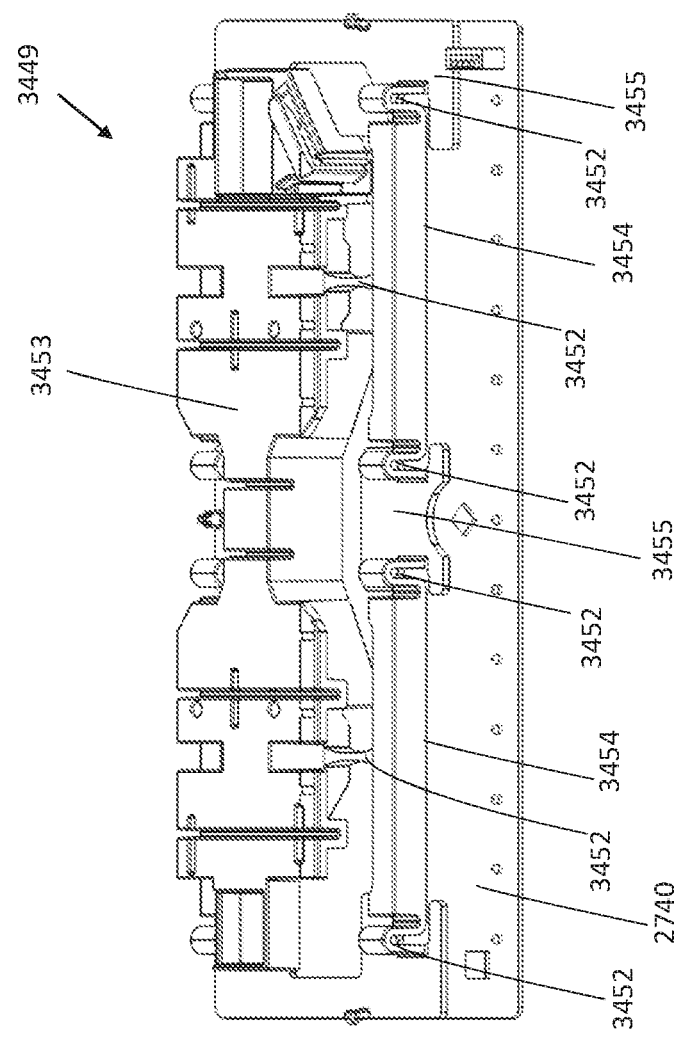
FIG. 35 is a perspective view of the chassis of the core apparatus of FIG. 34.

FIG. 34 illustrates a diagrammatic side view of a chassis of a conforming core apparatus 3449 of a surface-conforming obscured feature detector, according to one embodiment. FIG. 35 is a perspective view of the chassis of the conforming core apparatus 3449 of FIG. 34.

The present disclosure provides various embodiments of a surface-conforming obscured feature detector. Conventional detectors have sensor plates 2205 that are rigidly connected together, and as a result the size of obscured feature detectors typically remains relatively small to function on the curved surfaces that are typical of many architectural surfaces. The surface-conforming obscured feature detectors disclosed herein conform to the contour of a surface, minimize air gaps, and are able to be larger feature detectors that can offer a variety of performance improvements. The improvements described in the present disclosure are applicable to both conventional detectors that are relatively small and to larger feature detectors.

In some embodiments, the obscured feature detector has one or more flexible PCBs, such as a sensor plate board 2740, that can bend to match the contour of the surface to be detected. The flexible PCBs comprise a flexible substrate. Other flexible substrates can also be used that can be made of wood, paper, plastic, or other flexible materials. Rigid flex PCBs can also be used.

The one or more PCBs can be flexibly connected to the housing 2019 using a flexible medium such as foam rubber, springs, gel, hinges, pivot points, an encapsulated fluid such as air, or other suitable compressible or flexible media. In some embodiments the housing 2019 is able to flex. In some embodiments the housing 2019 is partially flexible. In some embodiments the housing 2019 has integrated plastic leaf springs or other types of springs or features that provide flexibility. In some embodiments of the obscured feature detector 2001, the sensor plates 2205 can be mounted on a PCB that is mounted external to the housing 2019. In some embodiments the PCB is connected to the housing 2019 via a foam rubber ring. In some embodiments, the foam rubber ring is about 7 mm thick and is formed approximately in the shape of a ring that is about 6 mm wide along the long side and about 5 mm thick along the short side, and approximately follows the perimeter of the housing 2019. A permanent adhesive, such as a pressure sensitive acrylic adhesive, can be used to bond the foam rubber ring to the housing 2019 and to the PCB.

In some embodiments, the foam rubber ring is compressible and the PCB is flexible, allowing the obscured feature detector 2001 to conform to curvature and irregularities of the surface 2002 against which it is placed. A variety of flexible and/or compressible materials can be suitable for the flexible medium. Ethylene propylene diene monomer (EPDM) foam rubber that is rated for 25% compression under about 1.5 pounds per square inch of pressure can be used. Other types of foam rubber such as polyurethane foam or silicon rubber foam can also be used. In some embodiments it is desirable that the flexible medium attached between the PCB substrate and the housing 2019 not be electrically conductive or partially conductive, at least not to the extent that it would interfere with operation of the obscured feature detector 2001.

In some embodiments, the conforming core apparatus 3449, such as shown in FIGS. 34 and 35, can flexibly connect the housing 2019 to the PCB. In some embodiments the conforming core apparatus 3449 may have two or more pivots 3452. In some embodiments the pivots 3452 are flexible joints. In some embodiments the pivots 3452 are ball joints. In some embodiments the pivots 3452 are hinges. In some embodiments the pivots 3452 are living hinges. A living hinge is a thin flexible hinge made from the same material as the two rigid pieces it connects. In some embodiments the pivots 3452 may be any of many other flexible mechanisms.

Figure 36:
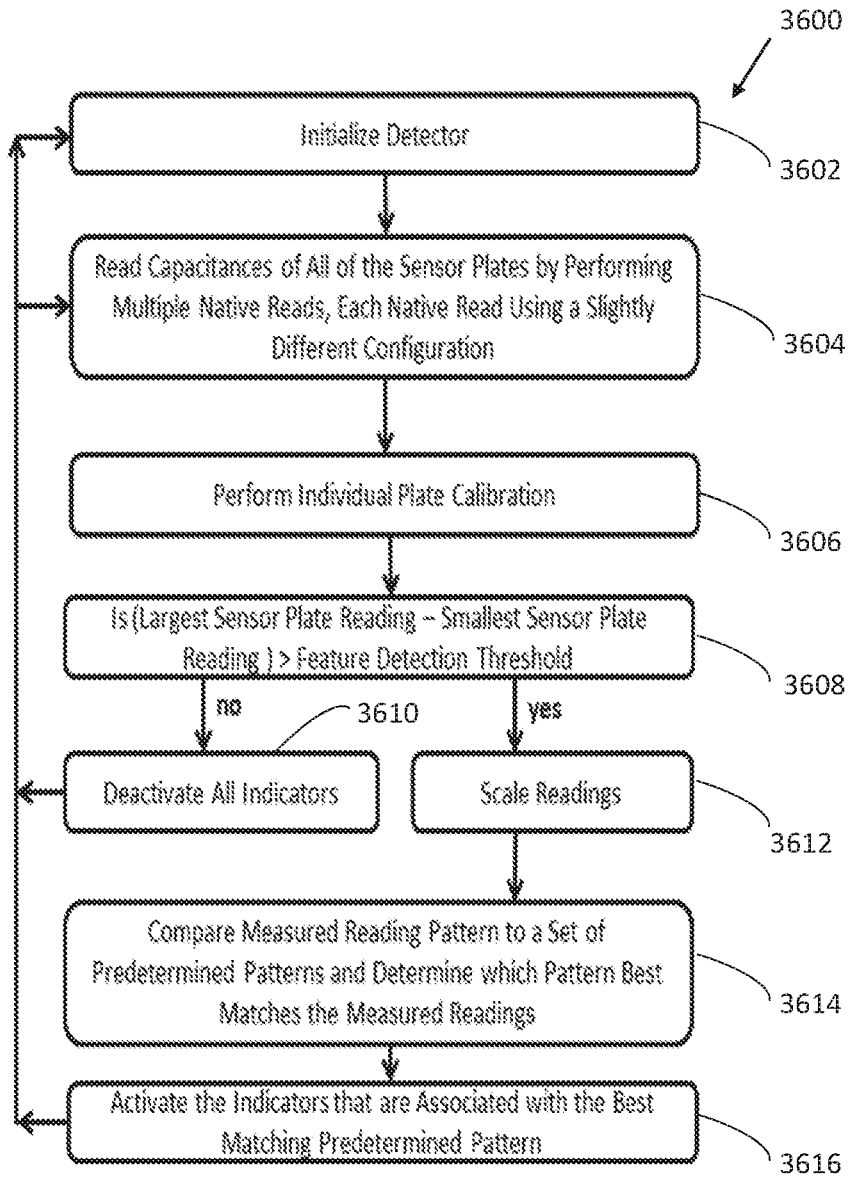
FIG. 36 is a flow diagram of a method of detecting an obscured feature behind a surface, according to one embodiment.

In some embodiments the conforming core apparatus 3449 comprises a main shaft 3453, as illustrated in FIGS. 34 and 36. In some embodiments the main shaft 3453 comprises a shaft member. In some embodiments the main shaft 3453 comprises a shaft member and two pivots 3452. In some embodiments each pivot 3452 of the main shaft 3453 couples the main shaft 3453 to a minor shaft 3454. In some embodiments each minor shaft 3454 comprises a shaft member and three pivots 3452. In some embodiments of the minor shaft 3454 there is one pivot 3452 near the center of each minor shaft 3454 and there are two additional pivots 3452, one at each end of the minor shaft 3454. In some embodiments there are four feet 3455 coupled to the main shaft 3453. In some embodiments each foot 3455 has a pivot 3452. In some embodiments the pivots 3452 at each of the ends of the two minor shafts 3454 are coupled to a pivot 3452 in each of the four feet 3455. In some embodiments each foot 3455 is coupled to the PCB. In some embodiments the PCB can flex to match the contour of the surface 2002.

In some embodiments the feet 3455 couple the PCB to the minor shaft 3454 as shown in FIGS. 34 and 35.

In some embodiments the conforming core apparatus 3449 comprises the main shaft 3453, two minor shafts 3454, and four feet 3455. In some embodiments there are six pivots 3452 in the conforming core apparatus 3449. In some embodiments there are more than six pivots 3452. In some embodiments there are less than six pivots 3452.

In some embodiments, as shown in FIG. 35, all of the pivots 3452 are living hinges, such that the entire conforming core apparatus 3449 comprises one single piece of injection molded plastic.

FIG. 36 is a flow diagram of a method 3600 of detecting an obscured feature behind a surface, according to one embodiment. A first operation, as illustrated in the flow diagram in FIG. 36, may be to initialize 3602 a detector, which may involve running an initialization algorithm. The detector may be according to one of the embodiments described herein. After initialization, the sensor plates may be read 3604. In some embodiments each of the sensor plates may be read multiple times, each time using a different configuration. The different configurations may comprise different drive currents, different voltage levels, different sensing thresholds, or other different configuration parameters. Each of these readings of the sensor plates may be referred to as native readings. In some embodiments multiple native readings may be added together to comprise a reading. In some embodiments there may be a separate reading for each sensor plate.

In some embodiments, each of these readings has a calibration 3606 adjustment performed that is achieved by adding a predetermined calibration value to each reading. In some embodiments, after calibration, the readings for each of the sensor plates would be the same if the detector were to be placed on a uniform surface.

In some embodiments, the largest sensor plate reading is compared 3608 to the lowest sensor plate reading. The difference is then compared 3608 to a threshold value. In some embodiments, if the difference is less than a predetermined threshold value, then all of the indicators may be turned off 3610, to indicate that no stud is present. If the difference is larger than a predetermined threshold value, then a determination may be made as to which indicators to activate. In certain embodiments, the readings may be scaled 3612 to a predetermine range, which may involve setting the lowest value to a number such as 0 and scaling the largest reading to a value such as 100. Then all of the intermediate values would be scaled proportionately. The scaled readings may then be compared 3614 to predetermined patterns which are scaled in a similar fashion.

In some embodiments there may be a set of predetermine patterns. The set of predetermined patterns may correspond to different combinations of hidden features that the detector may encounter. For example, the set of predetermined patterns may correspond to different positions for a single stud. In some embodiments, the set of predetermined patterns may include positional combinations of two studs. A pattern matching algorithm may be employed to determine which predetermined pattern best matches the reading pattern. The detector may then activate 3616 the indicators that correspond to the best matching predetermined pattern.

In other embodiments, after calibrating the sensor plate readings, a determination is made if an obscured feature is present. The lowest sensor plate reading may be subtracted from the highest sensor plate reading. If the difference is greater than a threshold value, then a determination is made that an obscured feature is present. If it is determined that no obscured features are present, then all of the indicators may be deactivated. If an obscured feature is present then a process may begin to determine position(s) and/or width(s) of the obscured feature(s). In some embodiments, all of the current sensor plate readings may be scaled such that the lowest reading is scaled to a predetermined value (such as 0) and the maximum reading is scaled to a second predetermined value (such as 100). All intermediate values may be scaled proportionately. Scaled readings may be easier to compare to a set of predetermined patterns.

FIG. 37 illustrates two different PCBs in a stacked configuration, according to one embodiment of the present disclosure. A sensor plate board 3740 and an interconnection board 3751 may be stacked on top of one another and bonded to each other. The sensor plate board 3740 may include one or more sensor plates. The interconnection board 3751 may include the plurality of indicators 3706. The sensor plate board 3740 and/or the interconnection board 3751 may be PCBs or otherwise integrated into a PCB. In some embodiments the bonding agent that bonds the two PCBs 3740, 3751 together may be solder. In some embodiments solder paste may be used to bond the two PCBs 3740, 3751 together. In some embodiments, they may be bonded together with solder and the process to bond them together may be standard SMT processes. The SMT process may include placing one PCB on top of another. In some embodiments, pins may be used to ensure proper alignment of the two PCBs 3740, 3751. In some embodiments the final step of the SMT process may involve running the stacked PCBs 3740, 3751 through a reflow oven.

In other embodiments, both the sensor plates and the circuitry may be assembled on a single PCB. A 1.6-mm-thick PCB with four layers of copper can be used. In some embodiments the first layer of copper is on the upper surface and all of the electrical components are soldered to this layer. The second layer of copper can be at a position that is about 0.35 mm below the first layer of copper, such that there is about 0.35 mm of PCB substrate between the first and second layers of copper. The third layer of copper can be at a position that is about 0.1 mm below the second layer of copper, such that there is about 0.1 mm of PCB substrate between the second and third layers of copper. A fourth layer of copper can be at a position that is about 0.35 mm below the third layer of copper, such that there is about 0.1 mm of PCB substrate between the third and fourth layers of copper. In some embodiments vias can be drilled to selectively connect the four layers of copper.

In some embodiments a final layer of substrate material that is 0.8 mm thick can be placed to cover the fourth layer of copper. In some embodiments, no holes are drilled through the 0.8-mm-thick layer of substrate. The 0.8-mm-thick layer of substrate may help protect the circuit from electrostatic discharge. Alternatively, a layer of plastic, or other non-conductive material, can be used to shield the circuit from electrostatic discharge and to physically protect the PCB. In some embodiments, a layer of plastic can be used in addition to a protective layer of circuit board substrate. It is to be understood that the layers and thicknesses indicated here are only exemplary of one embodiment. Other combinations of layers and thicknesses, and materials, can also be used.

In some embodiments the sensor plates can be placed on the fourth layer of copper. A shield to electrically protect the sensor plates from electrical interference from ambient conditions, including the user's hand, may be used. In some embodiments the shield may be placed on the first layer of copper. In some embodiments, a solid shield may cover substantially all of the shield's area, instead of using a mesh, stripes, or another pattern that may provide less than substantially all of the shield's area.

In some embodiments the electrically conductive paths that link the sensor plates to the capacitance-to-digital converter comprise sensor plate traces. In some embodiments the sensor plate traces are placed primarily on the second layer of copper, and shields for the signals are placed on the first and fourth layers of copper.

In some embodiments, the interconnection boards 3751 that are soldered to the sensor plate board 3740 are covered with a layer of epoxy, a glob of epoxy, or another conformal coating which may improve the reliability of solder joints. In some embodiments the interconnection boards 3751 on the sensor plate board 3740 are wire bonded to the PCB with chip-on-board technology. The chip-on-board technology may involve the steps of (1) attaching bare die to the PCB, (2) wire bonding (electrically connecting signals on the bare die to the PCB), and (3) covering the bare die and wire bonds with a coating of epoxy or other appropriate material. The chip-on-board technology may improve the reliability of solder joints.

In some embodiments integrated circuits that have packages with external leads are used such as QFP packages, TSOP packages, SOIC packages, QSOP packages, or others. Components that have external leads may improve solder joint reliability.

FIG. 38 illustrates a prior art configuration for routing and shielding sensor plate traces 3835 from the controller of a sensing circuit 3827 to sensor plates 3805. In this prior art, the sensor plate trace 3835 is routed such that there is a ground plane 3833 on a PCB layer that is beneath the sensor plate trace 3835. A via 3834 connects the segment of the sensor plate trace 3835 that is on the top layer of the PCB with a segment of the sensor plate trace 3835 that is on a lower layer of the PCB. For the segment of the sensor plate trace 3835 that is on a lower layer of the PCB, there is a first active shield plane 3837 on a layer of the PCB above the sensor plate trace 3835 and a second active shield plane 3838 on a PCB layer below sensor plate trace 3835. The first active shield plane 3837, the second active shield plane 3838, and shield traces 3836 are all coupled together and are all driven as an active shield. In the prior art the active shielding may comprise up to 82% of the length of the sensor plate trace 3835.

In these prior art detectors, the material that is between the sensor plate trace 3835 and the ground plane 3833 may absorb humidity. The material under some of the sensor plate traces 3835 may absorb more humidity than the material that is under other sensor plate traces 3835. As a result, exposure to humidity may cause the relative sensor readings of the sensor plate traces 3835 to change. In other words, when exposed to humidity some of the sensor plate 3805 sensor readings may change more than other sensor plate 3805 sensor readings, as a result of the humidity. Undesirably, the change is the result of the humidity being absorbed between the sensor plate trace 3835 and ground—not as a result of an obscured feature being present. Improved obscured feature detectors, according to the present disclosure, may shield the sensor plate traces 3835 for more than 82% of the length of the sensor plate trace 3835.

Figure 39:
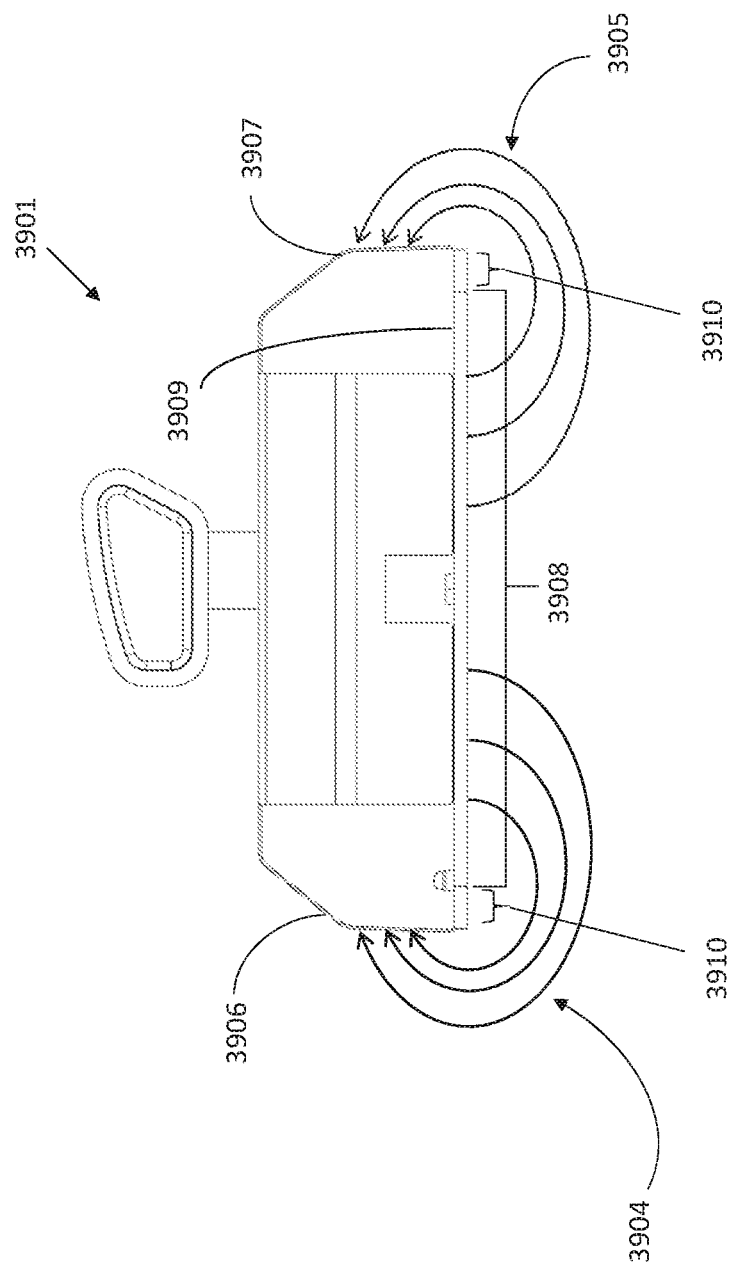
FIG. 39 is a cross-sectional view of an obscured feature detector, according to one embodiment, illustrating electric field patterns.

FIG. 39 is a cross-sectional view of an obscured feature detector 3901, according to another embodiment, illustrating electric field patterns. FIG. 39 shows an orientation of the electric field lines 3904, 3905 according to previously mentioned embodiments, where the electric field lines 3904, 3905 curve around the side of the obscured feature detector 3901. FIG. 39 shows an obscured feature detector 3901 that has the electric field lines 3904, 3905 extending from the sensor plates 3908 and ending on a common plate(s) 3906, 3907. There the sensor plates 3908 are located on the bottom of the obscured feature detector 3901 and the common plate(s) 3906, 3907 is located on the sides of the obscured feature detector 3901. A shielding plate 3909 (e.g. an active shield) is disposed between the sensor plates 3908 and the common plate(s) 3906, 3907, causing the electric field lines 3904, 3905 to extend down, outward, and up around the sides of the obscured feature detector 3901.

The common plate(s) 3906, 3907 may comprise a single plate or a number of different plates that are electrically connected, thereby maintaining a uniform voltage while extending along various sides of the obscured feature detector 3901. To ensure that the electric field lines 3904, 3905 do not extend in a straight line from the sensor plates 3908 to the common plate(s) 3906, 3907 or otherwise penetrate the obscured feature detector 3901, a shielding plate 3909 may be positioned between the sensor plates 3908 and the common plate(s) 3906, 3907. The shielding plate 3909 may hold the same charge or voltage as the sensor plates 3908 so that the capacitance between them may become unimportant. If the shielding plate 3909 has the same voltage or charge as the sensor plates 3908, the electric field lines 3904, 3905 coming from the sensor plates 3908 will not be drawn to the shielding plate 3909, and will curve around it in order to reach a plate with a different potential such as the common plate(s) 3906, 3907. The shielding plate 3909 may be positioned advantageously to cause the electric field lines 3904, 3905 to be directed around the edges or sides of the obscured feature detector 3901. For example, in some embodiments the shielding plate 3909 may be located on a layer directly above the sensor plates 3908 and cover the entire area of the sensor plates 3908. In some embodiments, the shielding plate 3909 may then extend around the ends (or extremes) of the sensor plates 3908 and lower itself until the portion of the shielding plate 3909 that extends beyond the area of the sensor plates 3908 lies on the same plane as the sensor plates 3908. The portion of the shielding plate 3909 that is on the same plane as the sensor plates 3908 may then extend to the extreme ends of the obscured feature detector 3901, thereby forming a lip 3910 around the sensor plates 3908. Ideally, the shielding plate 3909 would cause the electric field lines 3904, 3905 to reach from the sensor plates 3908 to the common plate(s) 3906, 3907 only by curving around the sides of the obscured feature detector 3901.

In some applications, it may be desirable to have the electric field lines 3904, 3905 diverge from the obstructed feature detector 3901 such that they circle around the side of the obscured feature detector 3901. If the electric field lines 3904, 3905 are allowed to curve around the sides of the obscured feature detector 3901, they may be able to penetrate further into a surface than were they confined to the area directly in front of the sensor plates, which may cause the sensor plates 3908 to yield more accurate or consistent readings. In some applications, it may be desirable to sense around the sides of the obscured feature detector 3901, rather than only directly in front of the sensor plates 3908.

Figure 40:
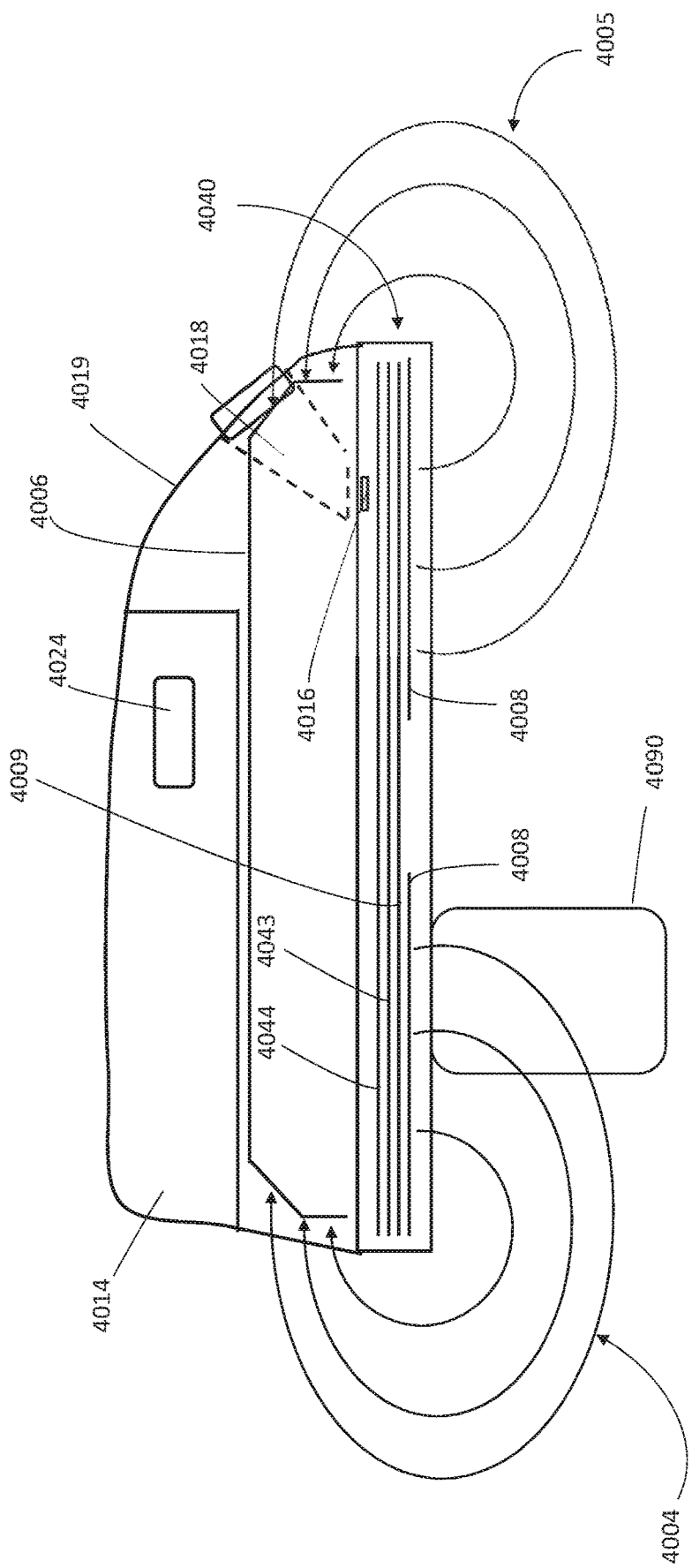
FIG. 40 is a cross-sectional view of an obscured feature detector, according to another embodiment, illustrating electric field patterns.

FIG. 40 is a cross-sectional view of an obscured feature detector 4001, according to another embodiment, illustrating electric field patterns. FIG. 40 shows an orientation of the electric field lines 4004, 4005 curving out and up and around the sides of the obscured feature detector 4001. The obscured feature detector 4001 includes a housing 4019, and a sensor plate board 4040 (e.g., a PCB). In some embodiments, the housing 4019 may comprise an upper housing, an on-off switch 4024, a handle 4014, and a plurality of light pipes 4018. The sensor plate board 4040 may be a multi-layered PCB with a top layer 4044, a second layer 4043, a third layer that may be an active shield 4009, and a bottom layer that includes sensor plates 4008. Additional components of the sensor plate board 4040 may include components described above with reference to FIG. 23.

FIG. 40 shows an obscured feature detector 4001 that forms electric field lines 4004, 4005 extending from sensor plates 4008 and ending on one or more common plates 4006. The sensor plates 4008 are positioned on the bottom of the obscured feature detector 4001 and the one or more common plates 4006 are located on a different plane from the sensor plates 4008, to be positioned a greater distance from a surface through which the obscured feature detector 4001 may be detecting an obscured feature. The common plate(s) 4006 may comprise a single plate or a number of different plates that are electrically connected, thereby maintaining a uniform voltage. A shielding plate 4009 (e.g. an active shield) is disposed between the sensor plates 4008 and the common plate(s) 4006. Electric fields (represented by electric field lines 4004, 4005) form between the sensor plates 4008 and the common plate(s) 4006, and the shielding plate 4009 causes the electric field lines 4004, 4005 to extend down, outward, and up around the sides of the obscured feature detector 4001. Stated otherwise, the shielding plate 4009 restricts the electric field lines 4004, 4005 from extending in a straight line from the sensor plates 4008 to the common plate(s) 4006, 4007.

The shielding plate 4009 may be and active shield driven at the same charge or voltage as the sensor plates 4008 so that the capacitance between the shielding plate 4009 and the sensor plates 4008 may be nominal and non-impactful to the sensing of the sensor plates 4008. If the shielding plate 4009 has the same voltage or charge as the sensor plates 4008, the electric field lines 4004, 4005 generated from the sensor plates 4008 will not be drawn to the shielding plate 4009, and will curve around it in order to reach a plate with a different potential, such as the common plate(s) 4006. As noted, the shielding plate 4009 may be positioned advantageously to cause the electric field lines 4004, 4005 to be directed downward and then out and around the edges or sides of the obscured feature detector 4001. For example, in some embodiments the shielding plate 4009 may be located on a layer directly above (e.g., away from a surface through which the obscured feature detector 4001 may be detecting an object) the sensor plates 4008 and cover the entire area of the sensor plates 4008.

By configuring the electric field lines 4004, 4005 to curve around the sides of the obscured feature detector 4001, the electric field lines 4004, 4005 may be able to penetrate further into a sensed object 4090 and/or further into a surface to sense an obscured object than were they confined to the area directly in front of the sensor plates. Deeper penetration of the electric field lines 4004, 4005 enables the sensor plates 4008 to yield more accurate and/or consistent readings, particularly as a thickness of the sensed object 4090 and/or a thickness of a surface of detection changes.

The embodiments herein may be used for a variety of purposes other than detecting obscured features. FIG. 40 provides an illustrative example of using an embodiment of an obscured feature detector 4001 for sensing an object 4090. For example, in a manufacturing or production-line environment that involves the handling or testing of biological products, a disclosed embodiment may be employed to detect whether or not a product has changed its electrochemical properties. If, to further the example, the product at hand is a type of produce such as a fruit or vegetable, the product may change its dielectric properties (such as its relative static permeability) as it decomposes or varies its ripeness. Since capacitance is a function of the relative static permeability (otherwise known as the dielectric constant) of the material between two capacitive plates, the capacitance measured by the embodiment may vary when products of different ripeness pass through the sensing fields. In this example, an obscured feature detector according to one embodiment of the present disclosure may be used to sense whether or not a product is within a desired specification of ripeness. Since the obscured feature detector may use a multitude of sensor plates, the measurement may be able to provide more resolution of detail than what would be possible if only a single pair of capacitive plates were being used.

Another application of the disclosed embodiments may involve the investigation of the electrical properties of various materials. In some situations, it may be important to determine some electrical properties of a material without altering the position, shape, or structural integrity of the material. A disclosed embodiment on or near the material at hand may measure the capacitance and possibly compare the measurement to that of a reference material. The capacitance measured, or the difference in capacitances when compared against a reference material, may yield a variety of details regarding the electrical properties of the material at hand.

The disclosed embodiments may also be used to provide details about the curvature or shape of a surface. If a disclosed embodiment is utilized along a curved or angled surface, for example, sensor plate readings may yield different values depending on a distance of the sensor plate from the surface. From the variations in sensor values, the disclosed embodiments may be able to provide insight with regards to the gradient or angle of the surface.

The sensor values may also vary according to the texture of the material within the sensing field. For example, if the material at hand is porous, grainy, rough, smooth, fibrous, or otherwise textured, the disclosed embodiments may be employed to provide details about that texture. In some applications, it may be possible to use the disclosed embodiments to make inferences regarding the density of a given material, or to determine other quality characteristics of a product that dependent upon its dielectric constant.

Another application of the disclosed embodiments may involve determining if a container is filled to the proper level, or if it has the right quantity of items.

Figure 41:
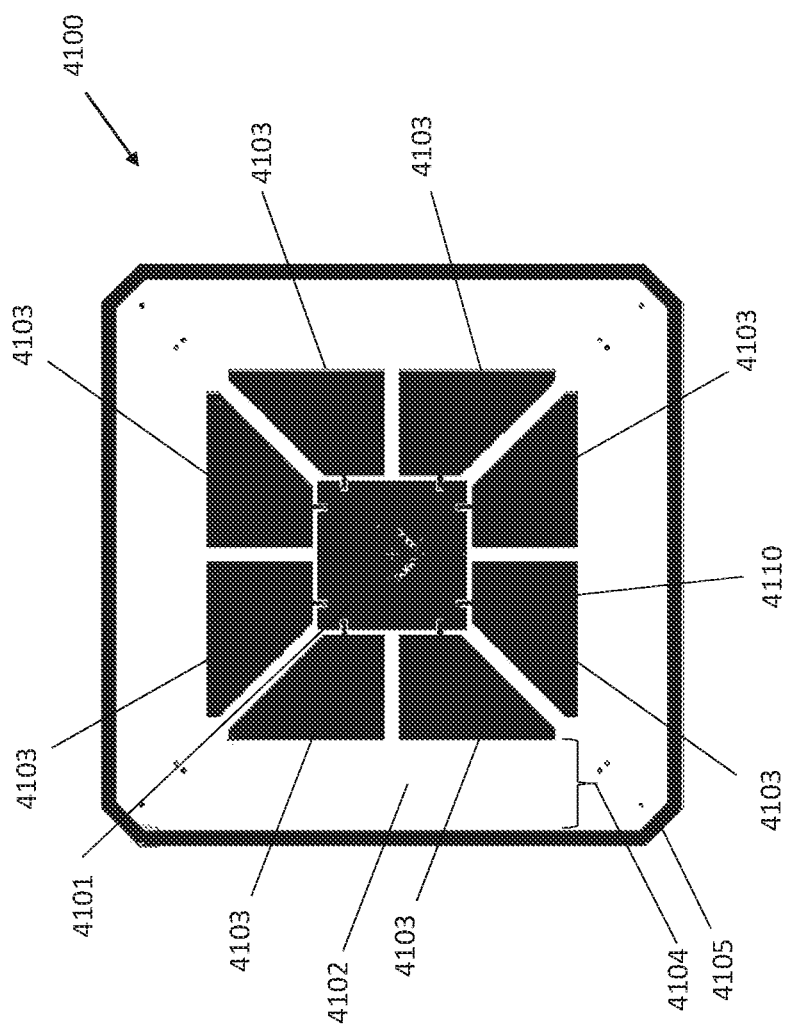
FIG. 41 is a sensor plate cluster that includes an active shield center, eight sensor plates, an active shield plate, and a common plate.

FIG. 41 is a view of a sensor plate cluster 4100 that includes sensor plates 4013, an active shield plate 4102, an active shield center 4101, and a common ring 4105. FIG. 41 shows eight sensor plates 4103. The sensor plates 4103 are arranged radially around a center location. In operation the sensor plates 4103, the active shield plate 4102, and the active shield center 4101 may all be driven simultaneously with a common signal. The sensor plates 4103, the active shield plate 4102, and the active shield center 4101 may not be electrically coupled to each other, but because they are each driven with the same signal the electric field that they create may be equivalent to the electric field that would be created if they were each coupled to each other. Together they may form the first end of a common electric field.

There is a common ring 4105 that may form the second end of the common electric field. In some embodiments the common ring 4105 is driven with 0 volts. In other embodiments it may be driven with a different unchanging voltage, or with an alternating voltage. Although there is common electric field that is created by the sensor plates 4103, the active shield plate 4102, and active shield center 4101 all driving together, nevertheless each element contributes to a particular portion of the common electric field. For example, the portion of the electric field that is driven from the sensor plate 4103 on the lower-left side of the sensor plate cluster 4100 will be located primarily in the lower-left side of the sensor plate cluster 4100. For example, the field lines from the lower-left sensor plate 4110 may originate at that particular sensor plate 4110. The field lines from the lower-left sensor plate 4110 will surrounded by field lines from the active shield center 4101, and field lines from the active shield plate 4102, and field lines from neighboring sensor plates. It is as though the field lines from the lower left sensor plate 4110 are being guided by the field lines from the surrounding elements in the sensor plate cluster 4100. For example, the field lines from the neighboring sensor plates will bound the lower-left sensor plate 4110 field lines on either side. The field lines from the active shield plate 4102 will bound the field lines from the lower-left sensor plate 4110 on the top (where the top is the part of field that is furthest from the plane of the sensor plates). Likewise the field lines from the active shield plate 4012 will bound the field lines from the lower-left sensor plate 4110 on the bottom. If the relative geometries and positions of surrounding elements change the field lines from the lower-left sensor plate will likewise change.

By configuring surrounding electric fields, a product designer can control what is being sensed because each sensor plate will primarily sense in the path of its respective electric fields. Using this technique it is possible to control where the electric fields will be located. For example, to sense less of the material (e.g., the surface) that is close to the plane of a sensor plate 4103, a product designer may increase the active shield plate distance 4104 (e.g., a dimension of a separation between a sensor plate 4103 and the common ring 4105). For example, a product designer may choose to reduce the size of the sensor plates 4103 by simultaneously increasing the active shield plate distance 4104. Implementing this design change will raise the lower bound on the sensor plate field lines such that the sensed field lines are located along an arc that is further (e.g., deeper into the sensed surface) from the plane of the sensor plate 4103. It may be advantageous to avoid sensing inconsistencies in the surface. For example, if the surface was a wall made of sheetrock there could be inconsistencies could be due to air bubbles in the sheetrock, variations in surface texture, inconsistencies in the paint, inconsistencies due to seams between sheets of sheetrock, or other factors. In some embodiments it may be preferable to sense less of the inconsistencies in the surface so that sensor plate readings would be more representative of obscured features that may be further from the plane of the sensor plate 4103, which it may be desirable to read.

Figure 42:
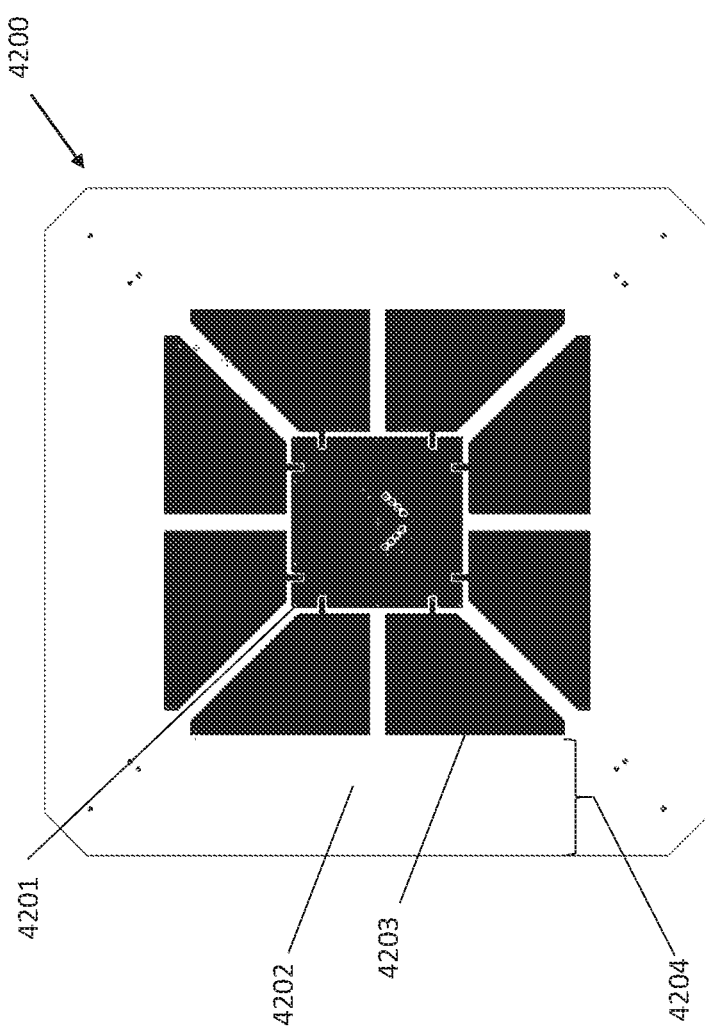
FIG. 42 is a sensor plate cluster that includes an active shield center, eight sensor plates, and an active shield plate.

FIG. 42 is an alternate sensor plate cluster 4200 that includes sensor plates 4203, an active shield plate 4202, and an active shield center 4201. The sensor plate cluster 4200 of FIG. 42 may be used in the obscured feature detector shown 4300 in FIG. 43. The embodiments illustrated in FIGS. 42 and 43 may function very similarly to the configuration in FIG. 41, with a difference being the location of the common plate on the opposite side of the PCB. Positioning the common plate on the opposite side of the PCB may cause the field lines to extend deeper into the surface and may drive the field lines further across a broader spectrum of an obscured feature. As a result, obscured feature detectors that include the design of FIG. 42 and FIG. 43 may sense more deeply into a sensed surface, and may sense over a broader area compared to the configuration in FIG. 41.

Figure 43:
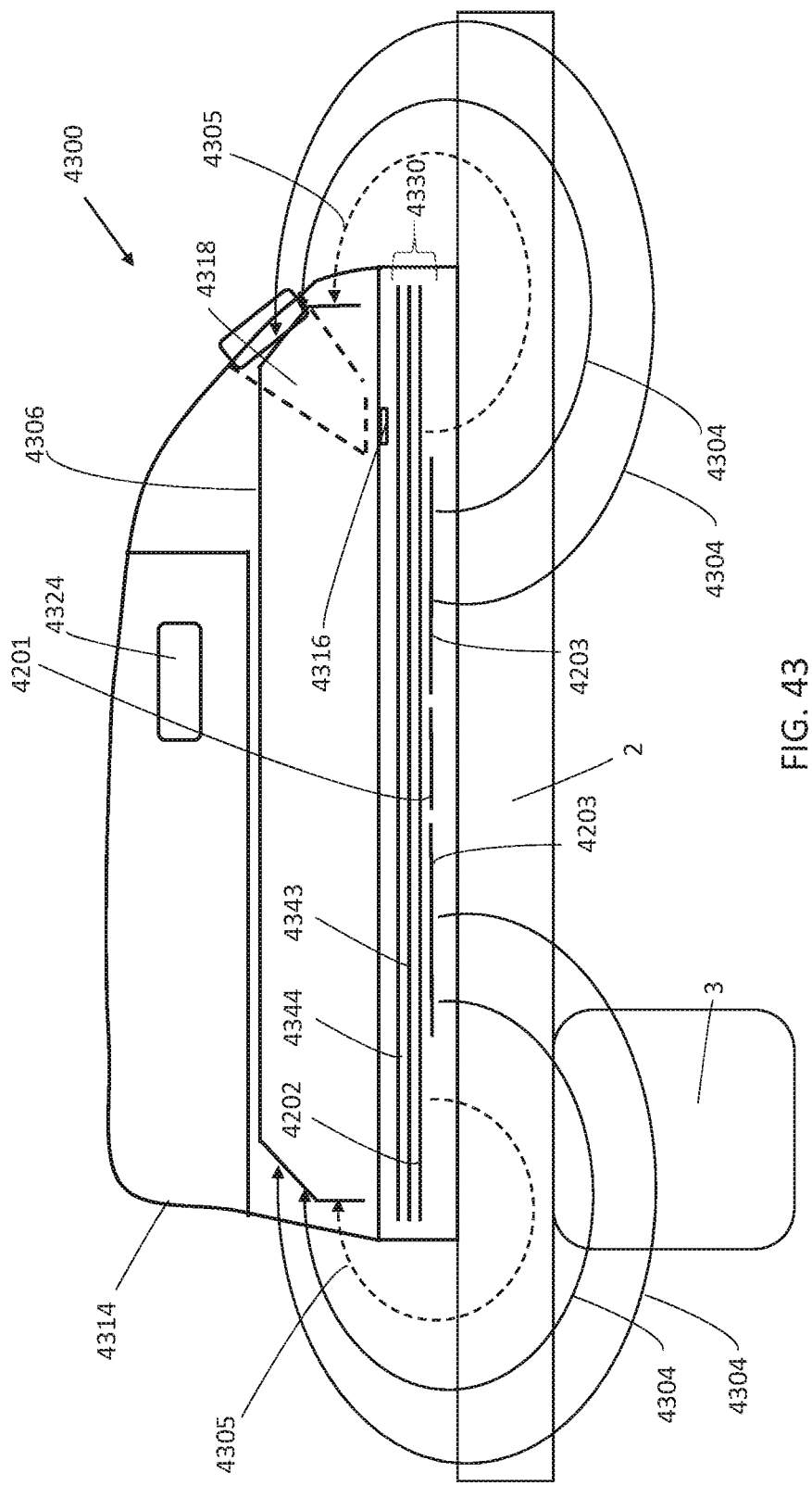
FIG. 43 is a side view of an obscured feature detector, according to one embodiment, that is placed on a surface and that includes a sensor plate cluster similar to that shown in FIG. 42.

FIG. 43 is a side view of an embodiment of an obscured feature detector 4300 that may use the sensor plate cluster 4200 shown in FIG. 42. The obscured feature detector 4300 is positioned on a surface 2. There is a handle 4314 by which a user can grasp the device and a button 4324 that the user may actuate or otherwise manipulate to turn on the obscured feature detector 4300. A light pipe 4318 may guide the light from the indicators 4316 on a PCB 4330 to a location where the user may view the light from the indicators 4316. The PCB 4330 may include be four layers. The top layer 4344 may include a majority of circuitry of the PCB 4330. A second layer 4343 of the PCB 4330 may include various routing of signals. The third layer may comprise an active shield layer 4202. The active shield layer 4202 may cover or otherwise encompass nearly the entire third layer of the PCB 4330, thereby shielding the sensor plates 4203 from the sensing circuitry of the top layer 4344. The sensor plates 4203 may be disposed on the fourth layer. There is also an active shield center 4201 that is in the center of the PCB 4330 on the fourth layer.

In one embodiment, the sensor plates 4203, the active shield center 4201, and the active shield layer 4202 are all driven with the same signal. In other words, each is driven with signals that have the same voltage at the same point in time. Because they are driven together, they create an electric field together. As a result the electric field that is created is the same electric field that may be created if the active shield layer 4202, and sensor plates 4203, and active shield center 4201 were all electrically coupled to each other, because they are each driven with the same signal. Together the active shield layer 4202, and sensor plates 4203, and active shield center 4201 all form a first end of an electric field. The electric fields 4304, 4305 may all have a second end of the electric field at a hand guard common plate 4306. In this embodiment, edge electric fields 4305 that are near the edge of the sensor plate cluster 4200 are driven by the active shield layer 4202. These edge electric fields 4305 may originate at the active shield layer 4302 that is near the edge. In this embodiment they penetrate the surface 2, then wrap around and terminate at the hand guard common plate 4306. In some embodiments the hand guard common plate 4306 is driven with 0 volts. In other embodiments, the hand guard common plate 4306 may be driven with a different unchanging voltage, or with an alternating voltage. These edge electric fields 4305 may not penetrate deeply enough to pass through the obscured feature 3. Because these electric fields only penetrate the surface 2 and may not penetrate deeply enough to reach the obscured features, the edge electric fields may only vary depending upon the properties of the surface 2. For example if there are inconsistencies in the surface 2, the edge electric field 4305 will experience a corresponding change. Advantageously, the edge electric field 4305 may not be sensed by the sensor plates 4305.

For many applications the sensor plaster cluster 4200 shown in FIG. 42 may function better than the sensor plate cluster shown in FIG. 22. The sensor plate cluster 4200 shown in FIG. 42 may avoid sensing some of the surface inconsistencies so that the sensor plate readings are better focused on the obscured features that may be further from the plane of the sensor plates 4203. This will advantageously allow the obscured feature detector 4300 to sense more accurately and more deeply.

Figure 44:
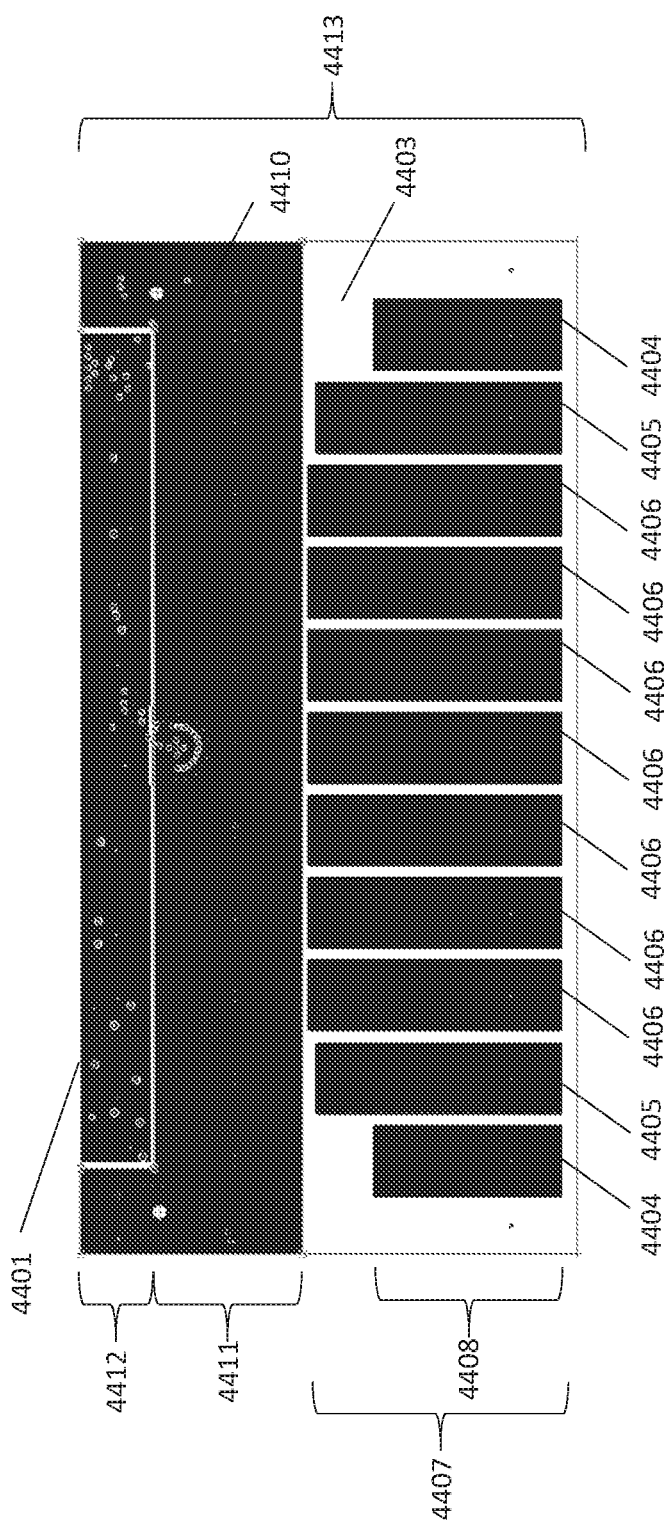
FIG. 44 is a sensor plate cluster that includes eleven sensor plates, an active shield plate, and a common plate, and the end sensor plates have less surface area than the sensor plates that are not at the ends.

FIG. 44 is a sensor plate cluster 4413 of an obscured feature detector, according to one embodiment. The sensor plate cluster 4413 includes multiple sensor plates 4404, 4405, 4406. The sensor plates 4404, 4405, 4406 are configured to form the first end of an electric field. A common plate 4401 is configured to form a second end of the electric field. An active shield plate 4410 is disposed between the sensor plates 4404, 4405, 4406 and the common plate 4401 and is driven with a voltage. In this embodiment of FIG. 44, the end sensor plates 4404 have less surface area than the non-end sensor plates 4406. There is a common plate width 4412, and an active shield plate width 4411, and a non-end sensor plate width 4407, and an end sensor plate width 4408. There is also an active shield region plate 4403. The active shield region plate 4403 may be on a different plane. In FIG. 44 the active shield region plate 4403 is represented by the white space on the printed circuit board because in the illustrated embodiment it is on a different layer of the PCB.

In this illustrated embodiment of FIG. 44, the sensor plates 4404, 4405, 4406 are driven with a signal. The active shield plate 4410 and active shield region plate 4403 are driven with the same signal as the sensor plates 4404, 4405, 4406. Likewise when one sensor plate 4404, 4405, 4406 is sensed the other sensor plates 4404, 4405, 4406 in the array are driven with the same voltage signal.

The smaller sensor area of the end sensor plates 4404 may make the end sensor plates 4404 less responsive to changes in a surface 2, such that the responsiveness of the end sensor plates 4404 more closely matches the responsiveness of the non-end sensor plates 4405, 4406. Further, an electric field formed between an end sensor plate 4404 and the common plate 4401 will be smaller than were the surface area end sensor plate 4404 identical (or closely similar) to the surface area of the non-end sensor plates 4405, 4406. In other words, the smaller surface area of the end sensor plate 4404 results in a smaller electric field that is more similar in shape (including more similar in depth into the surface of detection) to the electric field between a non-end sensor plate 4405, 4406 and the common plate 4401. An electric field between a smaller area end sensor plate 4404 and the common plate 4401 does not diverge as drastically as an end sensor plate having the same surface area as a non-end sensor plate. The electric fields between the end sensor plates 4404 and the common plate 4401 are more similar to the electric fields between non-end sensor plates 4405, 4406 and the common plate 4401. As noted previously, the more similar shape of the electric field translates in more predictable readings of the sensor plates, and thereby more accurate detections of obscured features.

Figure 45:
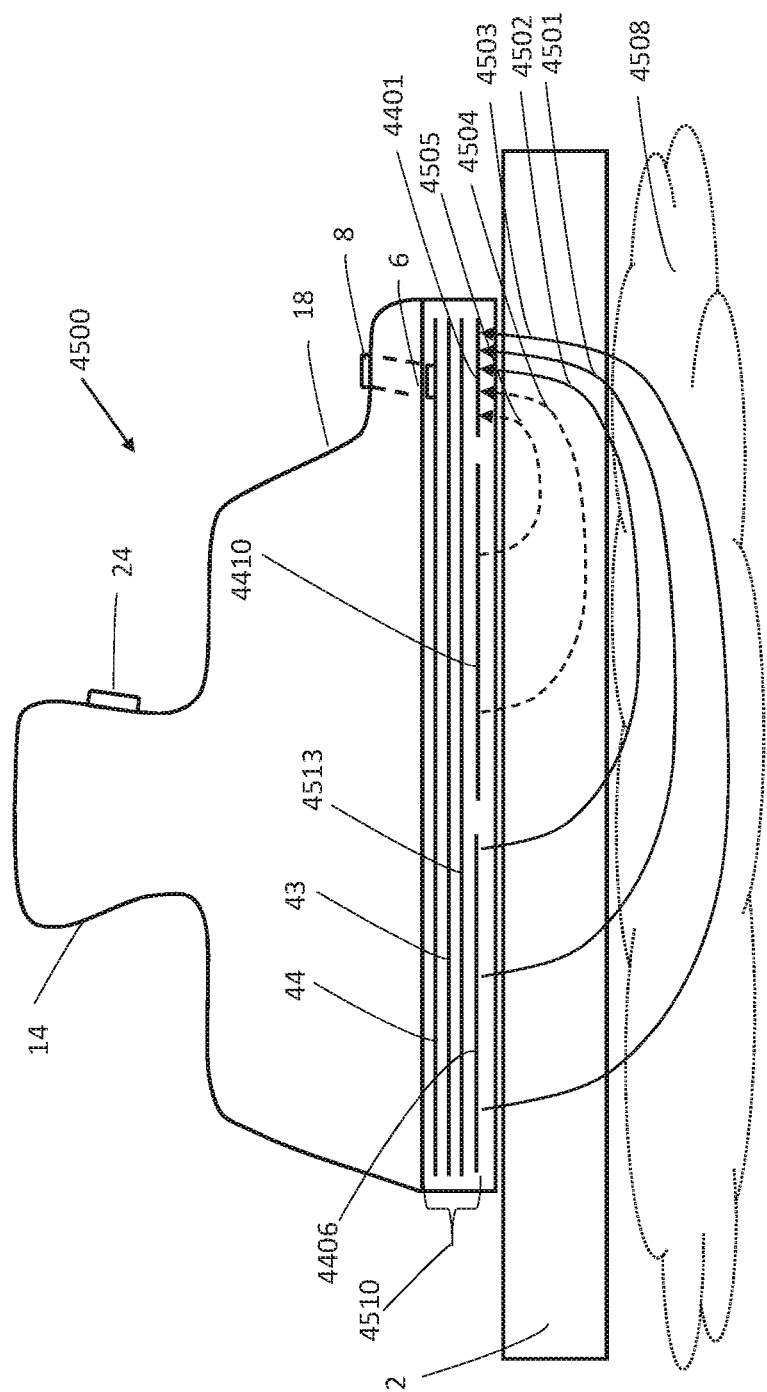
FIG. 45 is a side view of an obscured feature detector, according to one embodiment, that is placed on a surface and that includes a sensor plate cluster similar to that shown in FIG. 44.

FIG. 45 is a side view of an obscured feature detector 4500 that may use the sensor plate cluster 4413 that is shown in FIG. 44. The obscured feature detector 4500 includes a handle 14 that a user may grip to grasp the device, and a button 24 that can be actuated to turn on the obscured feature detector 4500. In FIG. 45, the obscured feature detector 4500 is positioned on a surface 2.

A light pipe 8 may guide the light from the indicators 6 on the PCB to a location where the user may view the light from the indicators 6. The obscured feature detector 4500 may include a four-layer PCB 4510. Most of the sensing circuitry, which is not shown, may be disposed on the top layer 44 of the PCB 4510. The second layer 43 of the PCB 4510 may include various routing of signals. A third layer of the PCB 4510 includes an active shield layer 4513. On the fourth layer are disposed sensor plates 4406, a common plate 4401, and an active shield plate 4410.

In one embodiment, the sensor plates 4406, the active shield plate 4410, and the active shield layer 4513 are all driven with the same voltage signal. In other words, each is driven with signals that have substantially the same voltage at the same point in time. As they are driven together, they create an electric field together. As a result the electric field that is created may be the same electric field that would be created if the active shield layer 4513, and sensor plates 4406, and active shield plate 4410 were all electrically coupled to each other, because they are each driven with the same signal. Together the active shield layer 4513, and sensor plates 4406, and active shield plate 4410 all form a first end of an electric field. The electric fields 4501, 4502, 4503, 4504, 4505 may all have a second end at the common plate 4401.

In the embodiment shown in FIG. 45 there are five electric field lines 4501, 4502, 4503, 4504, and 4505 that are illustrated. There are three sensed electric field lines 4501, 4502, and 4503. There are likewise two un-sensed electric field lines 4504, 4505. In the embodiment shown in FIG. 45 it may be desirable to sense objects in the obscured feature region 4508, and to avoid sensing the surface 2.

Although all of the electric field lines comprise a common electric field only the portion of the field that is driven by the sensor plates 4406 may be sensed. The electric fields 4504, 4505 that are driven by the active shield plate 4410 may not penetrate deeply enough to pass through the obscured feature 3. Because these electric fields 4504, 4505 only penetrate the surface 2 and may not penetrate deeply enough to reach the obscured features, a reading of the un-sensed electric fields 4504, 4505 may only vary depending upon the properties of the surface 2. For example if there are inconsistencies in the surface 2 the un-sensed electric field 4504 and 4505 will experience a corresponding change. Advantageously the un-sensed electric fields 4504 and 4505 may not be sensed by the sensor plates 4406.

A product designer can vary the relative sizes of the different components, namely the sensor plates 4406, the active shield plate 4410, and the common plate 4401, to target the sensing at the desired depth. For example, if the surface 2 is relatively thin it may be desirable to have an active shield plate 4410 that is relatively narrow so that only a very small portion of the field will not be sensed. Likewise, to detect obscured features that are further from the sensor plates 4406, or to sense through a thicker surface 2, it may be desirable to have an active shield plate 4410 that is relatively wide so that the sensing field is directed deeper. Likewise to sense through a surface 2 with a lot of inconsistency it may be preferred to have a wider active shield plate 4410 so that the sensed fields sense less of the surface 2.

It is understood that the sensed electric field lines 4501, 4502, 4503 will need to pass through the surface 2 twice in order to detect an obscured feature 3. So the sensor plate 4406 readings will be vulnerable to inconsistencies in the surface 2 in the region where these field lines pass. Fortunately, however, by not sensing field lines that only pass through the surface 2 the quality of the sensing may be improved. The result being that the sensor plates 4406 can better identify a location of obscured features 3 because the readings may not be clouded by inconsistencies in the surface 2. The result being that it is possible to be selective about where what material is being sensed.

In order to be effective, the active shield plate 4410 may be positioned between the common plate 4401 at the sensor plates 4404, 4405, 4406 so that the electric fields generated from the active shield plate 4410 may in effect push the sensed field lines deeper into and through the surface 2. The width of the active shield plate 4410 may vary by application. It may be recommended for many applications that the minimum dimension for the active shield plate width is about 18% of the total width of the sum of the width of the non-end sensor plate width 4407, plus the active shield plate width 4411, plus common plate width 4412. For many applications a suitable active shield plate width may be much larger. For example 30% may improve performance in many applications, and 40% may be an additional improvement. Likewise values for the active shield plate width that are closer to 50% of the total width of the sum of the width of the non-end sensor plate width 4407, plus the active shield plate width 4411, plus common plate width 4412 may be ideal for many applications.

In terms of hard dimensions a 13 millimeter wide active shield plate width may be a minimal dimension, with better performance at 20 millimeters, 25 millimeters, or 30 millimeters wide. Those skilled in the art can determine the dimensions suitable for a particular application.

In some embodiments the active shield, which may be on the active shield plate 4410, is driven with a voltage signal that is the same as the voltage signal on the sensor plates 4406. In some embodiments the active shield is driven with an unchanging voltage, such as 0V. In some embodiments the active shield is driven with a voltage signal that is a ratio of the sensor plate voltage signal, wherein the ratio may be more than one, or less than one, such that the active shield voltage signal may be larger than the sensor plate voltage signal or less than the sensor plate voltage signal. In some embodiments the active shield is positioned between the common plate 4401 and the sensor plates 4406. If the active shield voltage signal is greater than the sensor plate voltage signal it may have the effect of driving the sensor plate electric fields deeper into the surface. Likewise if the active shield voltage signal is less than the sensor plate voltage signal it may have the effect of driving the sensor plate electric fields less deeply into the surface. In some embodiments the magnitude of the active shield voltage level can be changed by the user, or by the controller to sense at different depths. In some embodiments an image of the obscured features at different depths can be ascertained by performing multiple sensor plate reads with different active shield voltage signals. Such readings may also be performed by an array of sensor plates in a linear, or grid-like array to create an image of obscured features.

Figure 46:
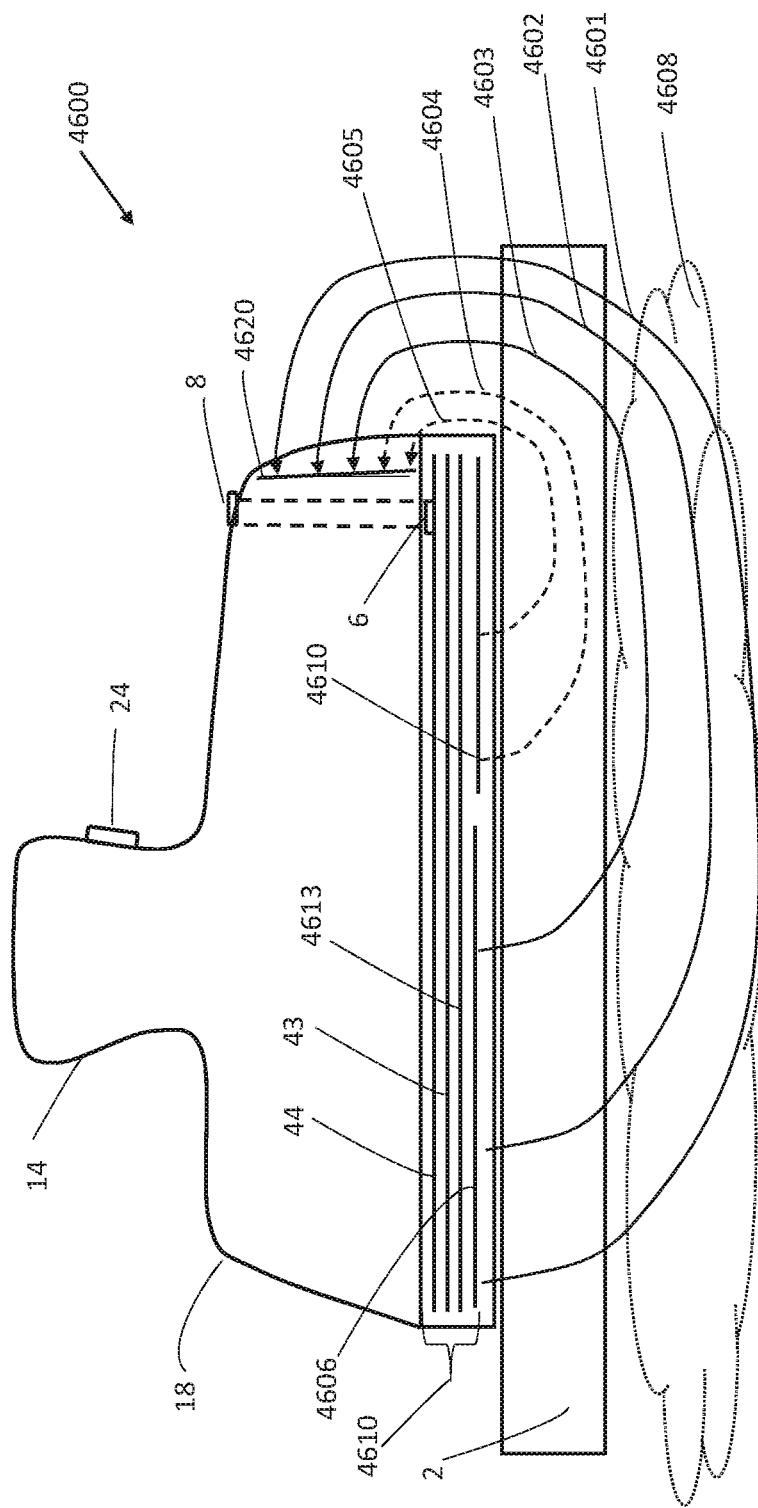
FIG. 46 is a side view of an obscured feature detector, according to another embodiment, that is placed on a surface.

FIG. 46 is a side view of an obscured feature detector 4600, which is similar to the obscured feature detector 4500 of FIG. 45. A difference between the obscured feature detector 4500 in FIG. 45 and the obscured feature detector 4600 of FIG. 46 is the position of the common plate 4620 relative to the sensor plates 4606 and active shield plates 4610. In the obscured feature detector 4600 in FIG. 46 the active shield layer 4613 is substantially between the sensor plates 4606 and the common plate 4620. The obscured feature detector 4600 in FIG. 46 may be configured to cause the field lines (e.g., the electric fields 4601, 4602, 4603, 4604, 4605) to penetrate more deeply into the surface, and may enable obscured feature detectors that can sense more deeply, or that have a smaller size. In the embodiment illustrated in FIG. 46 the field lines travel more than 180 degrees along an arc between the common plate 4620 and the sensor plates 4606. In some embodiments the common plate 4620 and sensor plates 4606 are on opposite sides of the active shield 4613. In some embodiments the common plate 4620 and sensor plates 4606 are on opposite sides of the printed circuit board 4610.

The obscured feature detector 4600 includes a handle 14 that a user may grip to grasp the device, and a button 24 that can be actuated to turn on the obscured feature detector 4500. In FIG. 46, the obscured feature detector 4600 is positioned on a surface 2.

A light pipe 8 may guide the light from the indicators 6 on a PCB 4610 to a location where the user may view the light from the indicators 6. The obscured feature detector 4600 may include a four-layer PCB 4610. Most of the sensing circuitry, which is not shown, may be disposed on the top layer 44 of the PCB 4610. The second layer 43 of the PCB 4610 may include various routing of signals. A third layer of the PCB 4610 may include an active shield layer 4613. On the fourth layer are disposed sensor plates 4606, and an active shield plate 4610.

In one embodiment, the sensor plates 4606, the active shield plate 4610, and the active shield layer 4613 are all driven with the same voltage signal. In other words, each is driven with signals that have substantially the same voltage at the same point in time. As they are driven together, they create an electric field together. As a result the electric field that is created may be the same electric field that would be created if the active shield layer 4613, and sensor plates 4606, and active shield plate 4610 were all electrically coupled to each other, because they are each driven with the same signal. Together the active shield layer 4613, and sensor plates 4606, and active shield plate 4410 all form a first end of an electric field 4601, 4602, 4603, 4604, 4605. Each electric field 4601, 4602, 4603, 4604, 4605 may all have a second end at the common plate 4620.

In the embodiment shown in FIG. 46, five electric field lines 4601, 4602, 4603, 4604, 4605 are illustrated. There are three sensed electric field lines 4601, 4602, 4603. There are likewise two un-sensed electric field lines 4604, 4605. In the embodiment shown in FIG. 46 it may be desirable to sense objects in the obscured feature region 4608, and to avoid sensing the surface 2.

Although all of the electric field lines 4601, 4602, 4603, 4604, 4605 comprise a common electric field only the portion of the field that is driven by the sensor plates 4606 may be sensed. The electric fields 4604, 4605 that are driven by the active shield plate 4610 may not penetrate deeply enough to pass through an obscured feature 3. Because these electric fields 4604, 4605 only penetrate the surface 2 and may not penetrate deeply enough to reach the obscured features, a reading of the un-sensed electric fields 4604, 4605 may only vary depending upon the properties of the surface 2. For example if there are inconsistencies in the surface 2 the un-sensed electric field 4604 and 4605 will experience a corresponding change. Advantageously the un-sensed electric fields 4604 and 4605 may not be sensed by the sensor plates 4606.

A product designer can vary the relative sizes of the different components, namely the sensor plates 4606, the active shield plate 4610, and the common plate 4620, to target the sensing at the desired depth. For example, if the surface 2 is relatively thin it may be desirable to have an active shield plate 4610 that is relatively narrow so that only a very small portion of the field will not be sensed. Likewise, to detect obscured features that are further from the sensor plates 4606, or to sense through a thicker surface 2, it may be desirable to have an active shield plate 4610 that is relatively wide so that the sensing field is directed deeper. Likewise to sense through a surface 2 with a lot of inconsistency it may be preferred to have a wider active shield plate 4610 so that the sensed fields sense less of the surface 2. In some embodiments the designer may select the area to be sensed by changing the size and position of the sensor plates 4606, active shield plate 4610, and common plate 4620.

Figure 47:
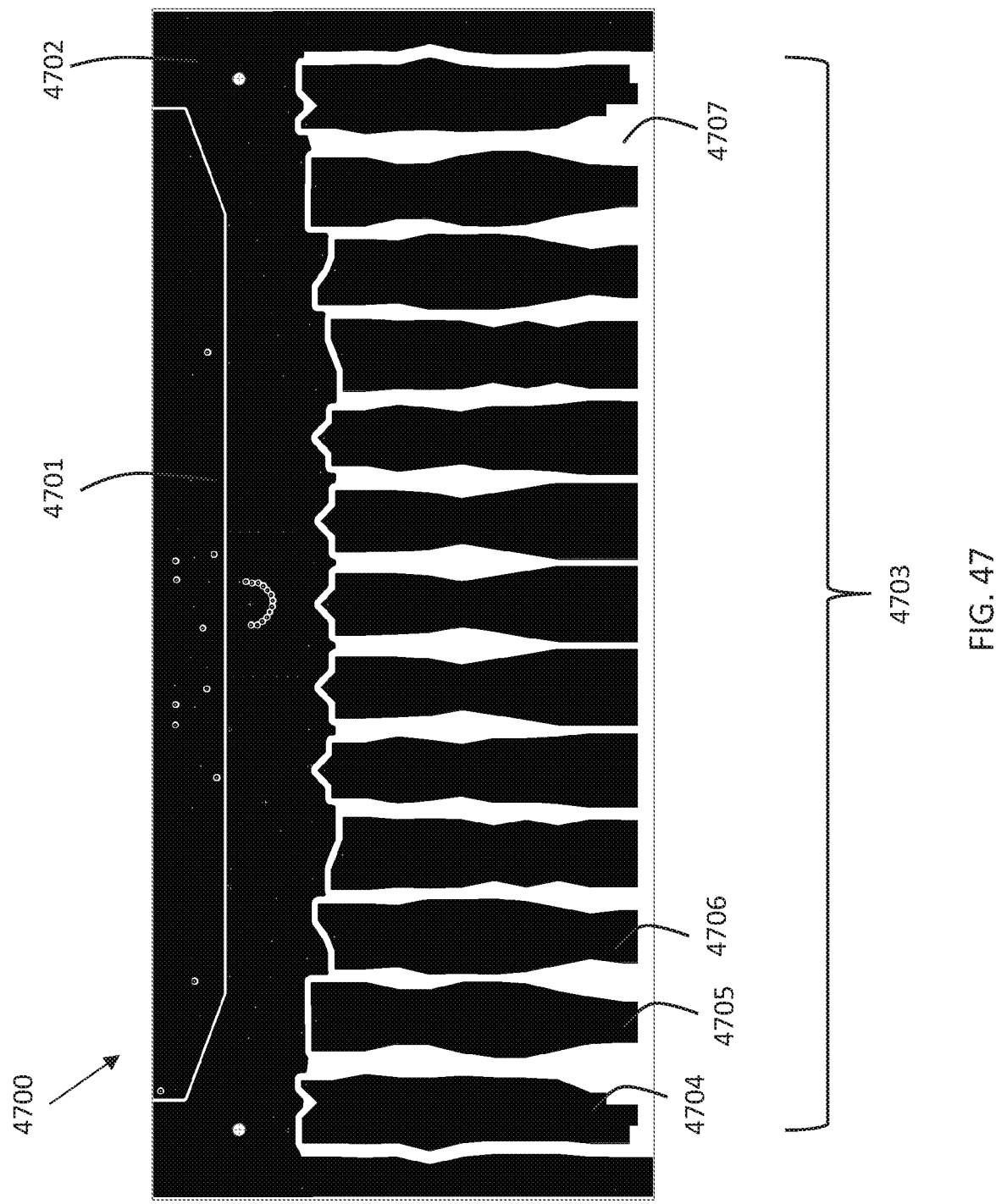
FIG. 47 is a plate configuration for an obscured feature detector, according an embodiment of the present disclosure.

FIG. 47 illustrates a plate configuration for an obscured feature detector 4700, according to an embodiment of the present disclosure. The obscured feature detector 4700 includes a ground plate 4701, a lower active shield plate 4702, an upper active shield plate 4707, and a set of sensor plates 4703. A bottom PCB layer of a sensing board of the obscured feature detector 4700 comprises the ground plate 4701, the lower active shield plate 4702, and the set of sensor plates 4703. A PCB layer adjacent to and above the bottom PCB layer comprises the upper active shield plate 4707.

The set of sensor plates 4703 comprises a plurality of individual sensor plates 4704, 4705, 4706, which may be arranged in a row. In the embodiment of FIG. 47, at least one of the sensor plates of the set of sensor plates 4703 may be irregular and/or asymmetric in form (e.g., shape). In at least the embodiment of FIG. 47, each of at least three sensor plates has a different sensor plate shape. For example, each of the sensor plates 4704, 4705, 4706 takes a complex, asymmetric polygonal shape. More particularly, the first sensor plate 4704 has a first shape that is distinctive from the shape of each other sensor plate (and symmetrically mirrored to the last sensor plate). Similarly, the second sensor plate 4705 has a second shape that is distinctive from the shape of each of the other sensor plates (and symmetrically mirrored to the penultimate sensor plate). In the embodiment of FIG. 47, this pattern may repeat except for a group of similarly shaped sensor plates at or towards a center of the set of sensor plates 4703. By way of further example, the sensor plate 4706, a third-from-the-end sensor plate, is defined by a shape that is different from the shape of the sensor plates at the center of the set of sensor plates 4703. In the embodiment of FIG. 47, each of the four sensor plates sequentially from an end of the set of sensor plates 4703 has a shape different from each of the sensor plates of the four sensor plates, and also different from the shape of the center plates. Additionally, each of the four sensor plates sequentially from the end of the row of sensor plates in the set of sensor plates 4703 is defined by eight or more sides. Furthermore, each of the sensor plates 4704, 4705, 4706 has a reverse-symmetry counterpart at the opposite end of the set of sensor plates 4703. A sensor plate, e.g., the sensor plate 4704, may vary in width along its length. A shape of a sensor plate, such as the sensor plate 4704 may be defined by six or more linear sides. A sensor plate may be defined by eight or more linear sides. A sensor plate may be defined by a shape having at least one curved side or portion. In an embodiment, the collection of varied shape sensor plates in the set of sensor plates 4703 may be mirrored along a central axis so as to form a bilaterally symmetric set of sensor plates. In another embodiment, the set of sensor plates 4703 may be bilaterally asymmetric.

At least one of the sensor plates of set of sensor plates 4703 may couple with a common plate (e.g., ground). In one embodiment, at least one sensor plate may couple with more than one common plate. In some embodiments, the sensor plates 4704, 4705, 4706 may form a first end of the sensed electric field. In some embodiments, the ground plate 4701 may form a second end of the sensed electric field. In some embodiments, all of the sensor plates in the set of sensor plates 4703 may be driven simultaneously. In some embodiments, the sensor plates of the set of sensor plates 4703 may be sensed one at a time. The lower active shield plate 4702 and the upper active shield plate 4707 may be driven simultaneously with the set of sensor plates 4703 with a signal that is similar to the signal applied to the set of sensor plates 4703.

In the embodiment of FIG. 47, the set of sensor plates 4703 is driven and forms the first end of a sensed electric field, and the ground plate 4701 forms the second end of the sensed electric field. In another embodiment, the ground plate 4701 may serve as one end of the electric field and may be replaced with a driven source, and the set of sensor plates 4703 may hold another potential (e.g., ground) to form the second end of the electric field. In another embodiment, sensing of the electric field may occur as between two or more sensor plates of the set of sensor plates 4703 and absent a ground (e.g., a ground plate).

Figure 48:
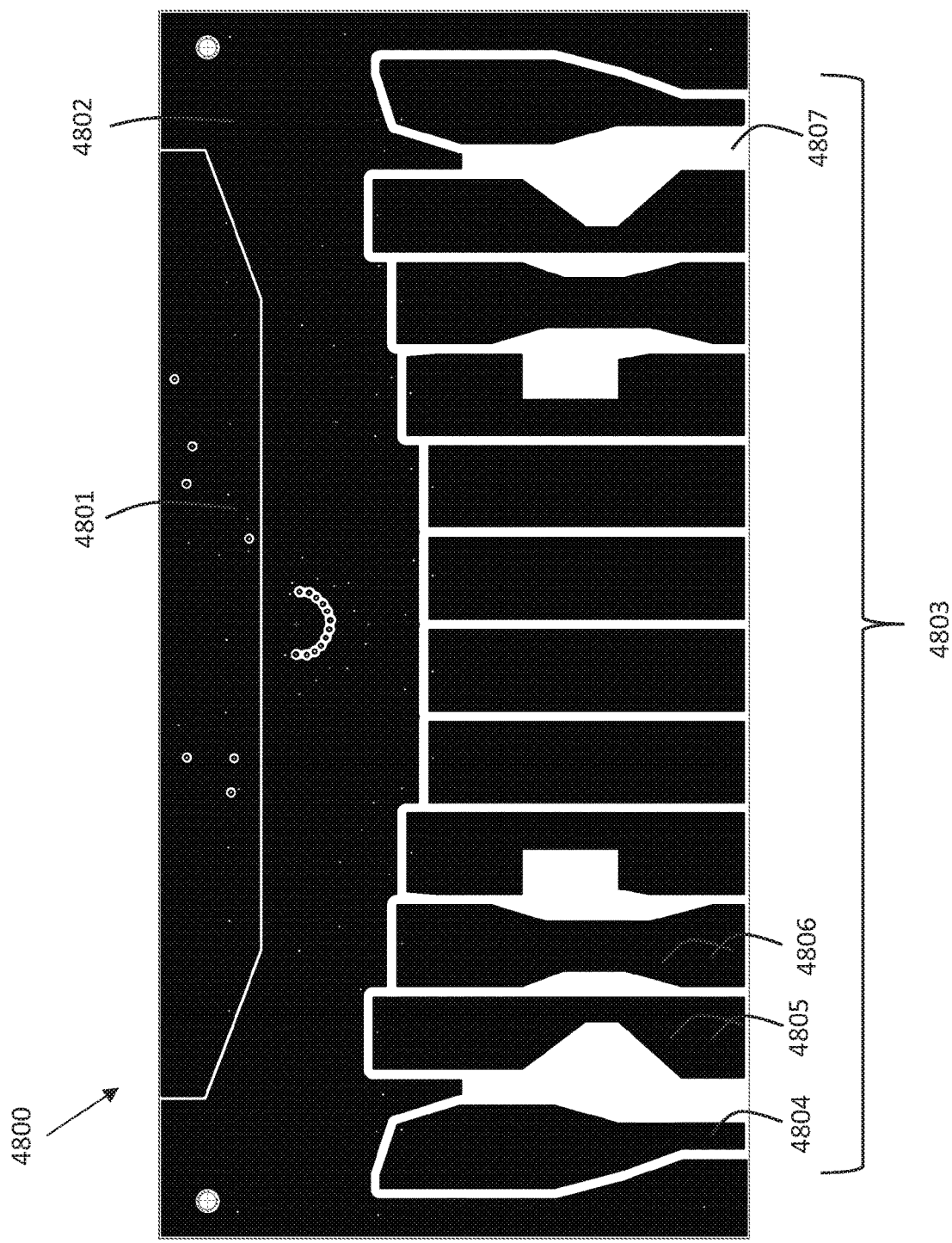
FIG. 48 is a plate configuration for an obscured feature detector, according to an embodiment of the present disclosure.

FIG. 48 is a plate configuration for an obscured feature detector 4800, according to an embodiment of the present disclosure. The obscured feature detector 4800 includes a ground plate 4801, a lower active shield plate 4802, an upper active shield plate 4807, and a set of sensor plates 4803. A bottom PCB layer of a sensing board of an obscured feature detector 4800 comprises the ground plate 4801, the lower active shield plate 4802, and the set of sensor plates 4803. A PCB layer adjacent to and above the bottom PCB layer comprises the upper active shield plate 4807.

The set of sensor plates 4803 comprises a plurality of twelve individual sensor plates, including the sensor plates 4804, 4805, 4806. In the embodiment of FIG. 48, each of the sensor plates 4804, 4805, 4806 takes a complex, asymmetric and irregular polygonal shape. Furthermore each of the sensor plates 4804, 4805, 4806 has a reverse-symmetry counterpart at the opposite end of the set of sensor plates 4803. At a medial portion of the set of sensor plates 4803 are four sensor plates each having a regular rectangular shape.

In some embodiments, all of the sensor plates in the set of sensor plates 4803 may be driven simultaneously, and only one sensor plate in the set of sensor plates 4803 is driven at a time. The lower active shield plate 4802 and the upper active shield plate 4807 may also be driven simultaneously with the set of sensor plates 4803 with a signal that is similar to the signal on the set of sensor plates 4803.

In an embodiment, the ground plate 4801 may not be coupled to a circuit ground, but may be electrically coupled to a driving source, a sensing source, or both. In an embodiment, the sensor plates of the set of sensor plates 4803 may be electrically coupled to a driving source, a sensing source, or both.

Figure 49:
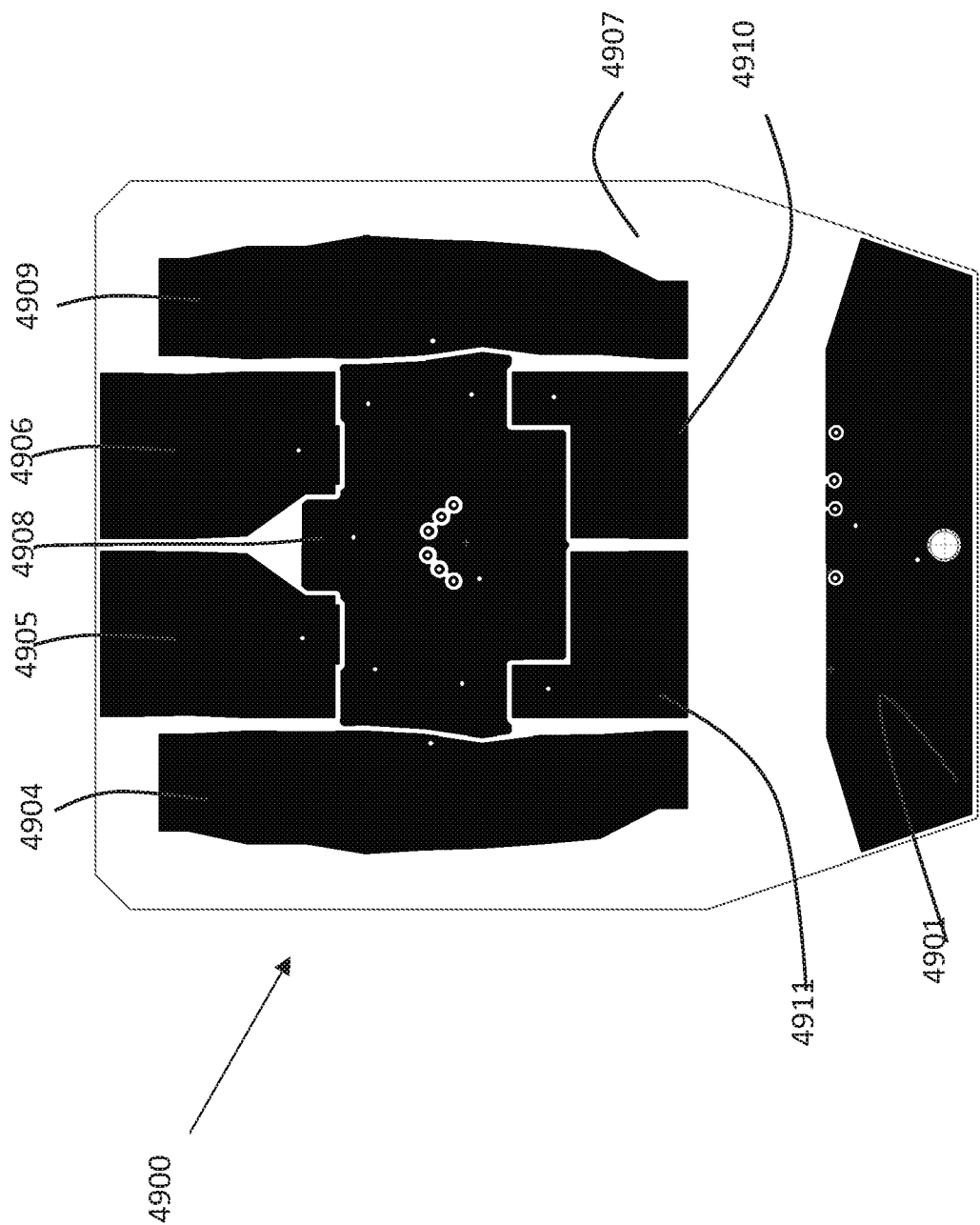
FIG. 49 is a plate configuration for an obscured feature detector, according to an embodiment of the present disclosure.

FIG. 49 is a plate configuration for an obscured feature detector 4900, according to an embodiment of the present disclosure. The sensing zone 4900 includes a ground plate 4901, a lower active shield plate 4908, an upper active shield plate 4907, and a plurality of sensor plates 4904, 4905, 4906, 4909, 4910, 4911. A bottom PCB layer of a sensing board of an obscured feature detector comprises the ground plate 4901, the lower active shield plate 4902, and the sensor plates 4904, 4905, 4906, 4909, 4910, 4911. A PCB layer adjacent to and above the bottom PCB layer comprises the upper active shield plate 4907.

A second sensor plate reading comprises a combination of a reading from the sensor plate 4905 and a reading from the sensor plate 4911. A third sensor plate reading similarly comprises a combination of a reading from the sensor plate 4906 and a reading from the sensor plate 4910. In other words, a reading from the sensor plate 4904 comprises a first sensor plate reading, a combination of readings from the sensor plates 4905, 4911 comprises a second sensor plate reading, a combination of readings from the sensor plates 4906, 4911 comprises a third sensor plate reading, and a reading from the sensor plate 4909 comprises a fourth sensor plate reading. Each of the sensor plates 4904, 4905, 4906, 4909, 4910, 4911 may be driven simultaneously. Each of the four sensor plate readings may be sampled individually.

The lower active shield plate 4908 and the upper active shield plate 4907 may be driven simultaneously with the sensor plates 4904, 4905, 4906, 4909, 4910, 4911 and with a signal similar to the signal driving the sensor plates 4904, 4905, 4906, 4909, 4910, 4911. The ground plate 4901 may form an end of a sensed electric field.

EXAMPLES

The following are some example embodiments within the scope of the disclosure. In order to avoid complexity in providing the disclosure, not all of the examples listed below are separately and explicitly disclosed as having been contemplated herein as combinable with all of the others of the examples listed below and other embodiments disclosed hereinabove. Unless one of ordinary skill in the art would understand that these examples listed below, and the above disclosed embodiments, are not combinable, it is contemplated within the scope of the disclosure that such examples and embodiments are combinable.

Example 1

An obscured feature detector comprising: three or more sensor plates arranged linearly to form a sensor array, each of the three or more sensor plates configured to form a first end of a corresponding electric field and to take a sensor reading of the corresponding electric field, wherein the corresponding electric field varies based on a proximity of the sensor plate to one or more surrounding objects and on a material property of each of the one or more surrounding objects, wherein an end sensor plate at an end of the sensor array has a smaller area than a non-end sensor plate that is not at the end of the sensor array; a common plate to form a second end of the corresponding electric field of one or more sensor plates of the three or more sensor plates; a sensing circuit coupled to the three or more sensor plates, the sensing circuit being configured to measure the sensor readings on the three or more sensor plates; and an indicator to be toggled between a deactivated state and an activated state to indicate a location of a region of relative high sensor reading.

Example 2

The obscured feature detector of Example 1, wherein each of the sensor plates form an electric field with a single common plate of the one or more common plates.

Example 3

The obscured feature detector of Example 1, wherein the three or more sensor plates are each driven with the same signal simultaneously.

Example 4

The obscured feature detector of Example 1, wherein the end sensor plate is configured such that the corresponding electric field formed by the end sensor plate is geometrically similar to the corresponding electric field formed by a middle sensor plate.

Example 5

The obscured feature detector of Example 1, wherein the sensor array and the common plate lie in a common plane that is to be parallel to a surface that obscures a detected feature at a time of detection.

Example 6

The obscured feature detector of Example 5, wherein the three or more sensor plates are each driven with the same signal simultaneously.

Example 7

The obscured feature detector of Example 5, wherein the three or more sensor plates are each driven with the same signal simultaneously and wherein the sensing circuit measures the sensor reading of one of the three or more sensor plates.

Example 8

The obscured feature detector of Example 1, further comprising an active shield, wherein the three sensor plates and the active shield are each driven with the same signal simultaneously.

Example 9

The obscured feature detector of Example 1, wherein the three sensor plates and an active shield are each driven with the same signal simultaneously and wherein the sensing circuit measures the sensor reading of only one of the sensor plates.

Example 10

The obscured feature detector of Example 1, wherein the common plate comprises a set of multiple individual plates, each individual plate forming a second end of the corresponding electric field of a sensor plate of the three or more sensor plates.

Example 11

The obscured feature detector of Example 10, wherein each of the multiple individual plates is independently activated.

Example 12

The obscured feature detector of Example 1, wherein a width dimension of the end plate is less than a width dimension of the non-end sensor plate.

Example 13

The obscured feature detector of Example 1, wherein a width dimension of a first end of the end plate is less than a width dimension of a second end of the end plate.

Example 14

The obscured feature detector of Example 1, wherein all non-end sensor plates of the three or more sensor plates have the same dimensions.

Example 15

The obscured feature detector of Example 1, wherein a voltage signal is driven on the common plate, wherein a reading is taken on a sensor plate of the three or more sensor plates, and wherein the reading is relative to the capacitance between the common plate and the sensor plate.

Example 16

An obscured feature detector comprising: three or more sensor plates arranged linearly to form a sensor array, each of the sensor plate configured to form a first end of a corresponding electric field and to take a sensor reading of the corresponding electric field, wherein the corresponding electric field varies based on a proximity of the sensor plate to one or more surrounding objects and on a material property of each of the one or more surrounding objects, wherein each end sensor plate at an end of the sensor array has dimensions different from dimensions of a non-end sensor plate that is not at the end of the sensor array, the dimensions of the end sensor plates configured such that the corresponding electric field formed by each of the end sensor plates is geometrically similar to the corresponding electric field formed by a middle sensor plate; a common plate to form a second end of the corresponding electric field of one or more sensor plates on the three or more sensor plates; a sensing circuit coupled to the three or more sensor plates, the sensing circuit being configured to measure the sensor readings of the three or more sensor plates; and an indicator to be toggled between a deactivated state and an activated state to indicate a location of a region of relative high sensor reading.

Example 17

The obscured feature detector of Example 16, wherein the three or more sensor plates are each driven with the same signal simultaneously.

Example 18

The obscured feature detector of Example 16, wherein the sensor array and the common plate both lie in a plane that is to be parallel to a surface that obscures a detected feature at a time of detection.

Example 19

The obscured feature detector of Example 16, further comprising an active shield, wherein the three sensor plates and the active shield are each driven with the same signal simultaneously.

Example 20

The obscured feature detector of Example 16, wherein a width dimension of the end plate is less than a width dimension of the non-end sensor plate.

Example 21

The obscured feature detector of Example 16, wherein a width dimension of a first end of the end plate is less than a width dimension of a second end of the end plate.

Example 22

The obscured feature detector of Example 16, wherein a voltage signal is driven on the common plate, wherein a reading is taken on a sensor plate of the three or more sensor plates, and wherein the reading is relative to the capacitance between the common plate and the sensor plate.

Example 23

A method of detecting an obscured feature behind a surface, comprising: taking a sensor reading of three or more sensor plates of an obscured feature detector that is disposed on a surface, the three or more sensor plates arranged linearly in a sensor array, wherein an end sensor plate has a smaller area than a non-end sensor plate, and wherein the sensor reading is taken of a region of a sensing field formed between the three or more sensor plates and a common plate of the obscured feature detector; measuring, via a sensing circuit, the sensor readings of the three or more sensor plates; comparing measurements of sensor readings in different regions of the sensing field; and toggling an indicator from a deactivated state to an activated state to indicate a location of a region of the sensing field having a relatively high sensor reading.

Example 24

The method of Example 23, further comprising driving an active shield of the obscured feature detector with the same signal as the three or more sensor plates to form the sensing field.

Example 25

The method of Example 23, wherein the measured sensor reading is a capacitive reading.

Example 26

The method of Example 23, wherein the measured sensor reading is an electromagnetic reading.

Example 26

The method of Example 23, wherein a width dimension of the end plate is less than a width dimension of the non-end sensor plate.

Example 27

The method of Example 23, wherein a width dimension of a first end of the end plate is less than a width dimension of a second end of the end plate.

Example 28

An obscured feature detector comprising: three or more sensor plates arranged along a length to form a sensor array, each of the three or more sensor plates configured to form a first end of a corresponding electric field and to take a sensor reading of the corresponding electric field, wherein the corresponding electric field varies based on a proximity of the sensor plate to one or more surrounding objects and on a material property of each of the one or more surrounding objects, a common plate to form a second end of the corresponding electric field of one or more sensor plates of the three or more sensor plates; an active shield plate that is driven with a voltage signal, wherein the active shield plate is positioned between the sensor plates and the common plate, and wherein the active shield has a width dimension that is measured perpendicular to the length of the sensor array, wherein the active shield width is more than 18% of a combined width of the common plate, the active shield zone, and a sensor plate of the three or more sensor plates; a sensing circuit coupled to the three or more sensor plates, the sensing circuit being configured to measure the sensor readings on the three or more sensor plates; and an indicator to be toggled between a deactivated state and an activated state to indicate a location of a region of relative high sensor reading.

Example 29

The obscured feature detector of Example 28, wherein a plurality of sensor plates of the three or more sensor plates are driven with the same signal simultaneously.

Example 30

The obscured feature detector of Example 28, wherein a plurality of sensor plates of the three or more sensor plates and the active shield plate are each driven with the same signal simultaneously.

Example 31

The obscured feature detector of Example 28, wherein increasing the voltage level of the signal on the active shield causes the field lines from a sensor plate of the three or more sensor plates to take a path that is further from the plane of the sensor plate.

Example 32

The obscured feature detector of Example 28, wherein the active shield plate is driven with a static voltage level.

Example 33

The obscured feature detector of Example 28, wherein the active shield plate is driven with a non-static voltage level.

Example 34

The obscured feature detector of Example 28, wherein the voltage signal on the active shield plate matches a voltage signal that is on a sensor plate of the three or more sensor plates.

Example 35

The obscured feature detector of Example 28, wherein the voltage signal on the active shield plate is a ratio of a voltage signal that is on a sensor plate of the three or more sensor plates.

Example 36

The obscured feature detector of Example 28, wherein a first sensor plate of the three or more sensor plates has more surface area than a second sensor plate of the three or more sensor plates.

Example 37

The obscured feature detector of Example 28, wherein the active shield plate, the common plate, and the three or more sensor plates are substantially in the same plane.

Example 38

The obscured feature detector of Example 28, wherein a voltage signal is driven on the common plate, and wherein a reading is taken on a sensor plate of the three or more sensor plates and the reading is relative to a capacitance between the common plate and the sensor plate.

Example 39

An obscured feature detector comprising: three or more sensor plates arranged along a length to form a sensor array, each of the three or more sensor plates configured to form a first end of a corresponding electric field and to take a sensor reading of the corresponding electric field, wherein the corresponding electric field varies based on a proximity of the sensor plate to one or more surrounding objects and on a material property of each of the one or more surrounding objects, a common plate to form a second end of the corresponding electric field of one or more sensor plates of the three or more sensor plates; an active shield plate that is driven with a voltage, wherein the active shield plate is configured to influence the electric fields between the three or more sensor plates and the common plate, and wherein the active shield has a width that is perpendicular to the length of the sensor array, wherein the active shield plate width is more than 18% of the combined width of the common plate, the active shield zone, and a sensor plate; a sensing circuit coupled to the three or more sensor plates, the sensing circuit being configured to measure the sensor readings on the three or more sensor plates; and an indicator to be toggled between a deactivated state and an activated state to indicate a location of a region of relative high sensor reading.

Example 40

The obscured feature detector of Example 39, wherein a plurality of sensor plates of the three or more sensor plates are driven with the same signal simultaneously.

Example 41

The obscured feature detector of Example 39, wherein a plurality of sensor plates of the three or more sensor plates and the active shield plate are each driven with the same signal simultaneously.

Example 42

The obscured feature detector of Example 39, wherein increasing the voltage level of the signal on the active shield causes the field lines from a sensor plate of the three or more sensor plates to take a path that is further from the plane of the sensor plate.

Example 43

The obscured feature detector of Example 39, wherein the active shield plate is driven with a static voltage level.

Example 44

The obscured feature detector of Example 39, wherein the active shield plate is driven with a non-static voltage level.

Example 45

The obscured feature detector of Example 39, wherein the voltage signal on the active shield plate matches a voltage signal that is on a sensor plate of the three or more sensor plates.

Example 46

The obscured feature detector of Example 39, wherein the voltage signal on the active shield plate is a ratio of a voltage signal that is on a sensor plate of the three or more sensor plates.

Example 47

The obscured feature detector of Example 39, wherein a first sensor plate of the three or more sensor plates has more surface area than a second sensor plate of the three or more sensor plates.

Example 48

The obscured feature detector of Example 39, wherein the active shield plate, the common plate, and the three or more sensor plates are substantially in the same plane.

Example 49

The obscured feature detector of Example 39, wherein a voltage signal is driven on the common plate, and wherein a reading is taken on a sensor plate of the three or more sensor plates and the reading is relative to a capacitance between the common plate and the sensor plate.

Example 50

An obscured feature detector comprising: three or more sensor plates arranged along a length to form a sensor array, each of the three or more sensor plates configured to form a first end of a corresponding electric field and to take a sensor reading of the corresponding electric field, wherein the corresponding electric field varies based on a proximity of the sensor plate to one or more surrounding objects and on a material property of each of the one or more surrounding objects; a common plate to form a second end of the corresponding electric field of one or more sensor plates of the three or more sensor plates; an active shield plate that is driven with a voltage, wherein the active shield is configured to influence the electric fields between the three or more sensor plates and the common plate, and wherein the active shield plate has a width that is perpendicular to the length of the sensor array, wherein the active shield width is more than 13 millimeters wide; a sensing circuit coupled to the three or more sensor plates, the sensing circuit being configured to measure the sensor readings of the three or more sensor plates; and an indicator to be toggled between a deactivated state and an activated state to indicate a location of a region of relative high sensor reading.

Example 51

The obscured feature detector of Example 50, wherein a plurality of sensor plates of the three or more sensor plates are driven with the same signal simultaneously.

Example 52

The obscured feature detector of Example 50, wherein a plurality of sensor plates of the three or more sensor plates and the active shield plate are each driven with the same signal simultaneously.

Example 53

The obscured feature detector of Example 50, wherein increasing the voltage level of the signal on the active shield causes the field lines from a sensor plate of the three or more sensor plates to take a path that is further from the plane of the sensor plate.

Example 54

The obscured feature detector of Example 50, wherein the active shield plate is driven with a static voltage level.

Example 55

The obscured feature detector of Example 50, wherein the active shield plate is driven with a non-static voltage level.

Example 56

The obscured feature detector of Example 50, wherein the voltage signal on the active shield plate matches a voltage signal that is on a sensor plate of the three or more sensor plates.

Example 57

The obscured feature detector of Example 50, wherein the voltage signal on the active shield plate is a ratio of a voltage signal that is on a sensor plate of the three or more sensor plates.

Example 58

The obscured feature detector of Example 50, wherein a first sensor plate of the three or more sensor plates has more surface area than a second sensor plate of the three or more sensor plates.

Example 59

The obscured feature detector of Example 50, wherein the active shield plate, the common plate, and the three or more sensor plates are substantially in the same plane.

Example 60

The obscured feature detector of Example 50, wherein a voltage signal is driven on the common plate, and wherein a reading is taken on a sensor plate of the three or more sensor plates and the reading is relative to a capacitance between the common plate and the sensor plate.

Example 61

An obscured feature detector comprising: a group of three or more sensor plates arranged radially around a center point, each sensor plate of the three or more sensor plates to form a first end of a corresponding electric field and to take a sensor reading of the corresponding electric field that varies based on a proximity of the sensor plate to one or more surrounding objects and on a material property of each of the one or more surrounding objects; a common plate to form a second end of the corresponding electric field of one or more sensor plates of the three or more sensor plates; one or more active shield plates driven with a voltage and positioned outside of a perimeter of the group of three or more sensor plates; and a sensing circuit coupled to the three or more sensor plates, the sensing circuit being configured to measure the sensor readings of the three or more sensor plates.

Example 62

The obscured feature detector of Example 61, wherein the common plate is a ring disposed around the one or more active shield plates.

Example 63

The obscured feature detector of Example 61, wherein multiple sensor plates of the three or more sensor plates are driven with the same signal simultaneously.

Example 64

The obscured feature detector of Example 61, wherein multiple sensor plates of the three or more sensor plates and the one or more active shield plates are each driven with the same signal simultaneously.

Example 65

The obscured feature detector of Example 61, wherein increasing the voltage on the one or more active shield plates causes the field lines from a sensor plate of the three or more sensor plates to take a path to the common plate that is further from the plane of the three or more sensor plates.

Example 66

The obscured feature detector of Example 61, wherein the one or more active shield plates are driven with a static voltage level.

Example 67

The obscured feature detector of Example 61, wherein the one or more active shield plates are driven with a non-static voltage level.

Example 68

The obscured feature detector of Example 61, wherein the voltage signal on the one or more active shield plate matches a voltage signal that is on a sensor plate of the three or more sensor plates.

Example 69

The obscured feature detector of Example 61, wherein the voltage signal on the one or more active shield plates is a ratio of the voltage signal that is on a sensor plate of the three or more sensor plates.

Example 70

The obscured feature detector of Example 61, wherein the active shield plate, the common plate, and the three or more sensor plates are substantially in the same plane.

Example 71

The obscured feature detector of Example 61, wherein a voltage signal is driven on the common plate, and wherein a reading is taken on a sensor plate of the three or more plates and the reading is relative to a capacitance between the common plate and the sensor plate.

Example 72

An obscured feature detector comprising: a group of two or more sensor plates arranged radially around a center point, each sensor plate of the two or more sensor plates to form a first end of a corresponding electric field and to take a sensor reading of the corresponding electric field that varies based on a proximity of the sensor plate to one or more surrounding objects and on a material property of each of the one or more surrounding objects; a common plate to form a second end of the corresponding electric field of one or more sensor plates; one or more active shield plates to be driven with a voltage and positioned outside of the perimeter of the group of two or more sensor plates; and a sensing circuit coupled to the two or more sensor plates, the sensing circuit being configured to measure the sensor readings of the two or more sensor plates.

Example 73

The obscured feature detector of Example 72, wherein an active shield plate of the one or more active shield plates is positioned between the common plate and a sensor plate of the two or more sensor plates.

Example 74

The obscured feature detector of Example 73, wherein the common plate is approximately perpendicular to the active shield plate.

Example 75

The obscured feature detector of Example 72, wherein the common plate is a ring disposed around the one or more active shield plates.

Example 76

The obscured feature detector of Example 72, wherein multiple sensor plates of the two or more sensor plates are driven with the same signal simultaneously.

Example 77

The obscured feature detector of Example 72, wherein multiple sensor plates of the two or more sensor plates and the one or more active shield plates are each driven with the same signal simultaneously.

Example 78

The obscured feature detector of Example 72, wherein increasing the voltage on the active shield plate causes the field lines from a sensor plate of the two or more sensor plates to take a path to the common plate that is further from the plane of the two or more sensor plates.

Example 79

The obscured feature detector of Example 72, wherein the active shield plate is driven with a static voltage level.

Example 80

The obscured feature detector of Example 72, wherein the active shield plate is driven with a non-static voltage level.

Example 81

The obscured feature detector of Example 72, wherein the voltage signal on the active shield plate matches a voltage signal that is on a sensor plate of the two or more sensor plates.

Example 82

The obscured feature detector of Example 72, wherein the voltage signal on the active shield plate is a ratio of the voltage signal that is on a sensor plate of the two or more sensor plates.

Example 83

The obscured feature detector of Example 72, wherein the active shield plate, the common plate, and the two or more sensor plates are substantially in the same plane.

Example 84

The obscured feature detector of Example 72, wherein a voltage signal is driven on the common plate, and wherein a reading is taken on a sensor plate of the two or more plates and the reading is relative to a capacitance between the common plate and the sensor plate.

Example 85

An obscured feature detector comprising: a common plate positioned at a center point of a bottom of the obscured feature detector; one or more active shield plates driven with a voltage and arranged radially around the common plate; three or more sensor plates arranged radially around the one or more active shield plates, each sensor plate to form a corresponding electric field with the common plate, each sensor plate to take a sensor reading of the corresponding electric field that varies based on a proximity of the sensor plate to one or more surrounding objects and on a material property of each of the one or more surrounding objects; and a sensing circuit coupled to the three or more sensor plates, the sensing circuit being configured to measure the sensor readings of the three or more sensor plates.

Example 86

The obscured feature detector of Example 85, wherein multiple sensor plates of the three or more sensor plates are driven with the same signal simultaneously.

Example 87

The obscured feature detector of Example 85, wherein multiple sensor plates of the three or more sensor plates and the one or more active shield plates are each driven with the same signal simultaneously.

Example 88

The obscured feature detector of Example 85, wherein increasing the voltage on the one or more active shield plates causes the field lines from a sensor plate of the three or more sensor plates to take a path to the common plate that is further from the plane of the three or more sensor plates.

Example 89

The obscured feature detector of Example 85, wherein the one or more active shield plates are driven with a static voltage level.

Example 90

The obscured feature detector of Example 85, wherein the one or more active shield plates are driven with a non-static voltage level.

Example 91

The obscured feature detector of Example 85, wherein the voltage signal on the one or more active shield plates matches a voltage signal that is on a sensor plate of the three or more sensor plates.

Example 92

The obscured feature detector of Example 85, wherein the voltage signal on the one or more active shield plates is a ratio of the voltage signal that is on a sensor plate of the three or more sensor plates.

Example 93

The obscured feature detector of Example 85, wherein the one or more active shield plates, the common plate, and the three or more sensor plates are substantially in the same plane.

Example 94

The obscured feature detector of Example 85, wherein a voltage signal is driven on the common plate, and wherein a reading is taken on a sensor plate of the three or more plates and the reading is relative to a capacitance between the common plate and the sensor plate.

Example 95

An obscured feature detector according to any of the forgoing examples having a plurality of sensor plates arranged in a row, wherein the sensor plate at each end of the row of sensor plates is defined by a shape having six or more sides.

Example 96

The obscured feature detector of Example 95, wherein the sensor plate medially adjacent to either end sensor plate in the row of sensor plates is defined by a shape having at least six sides.

Example 97

The obscured feature detector of Example 96, wherein the sensor plate next medially adjacent (or third from end) is defined by a shape having at least six sides.

Example 98

The obscured feature detector of Example 97, wherein the sensor plate next medially adjacent (or fourth from end) is defined by a shape having at least six sides.

Example 99

An obscured feature detector according to any of Examples 95, 96, 97, and 98, wherein at least two medially disposed sensor plates are of a regular rectilinear shape.

Example 100

An obscured feature detector according to any of Examples 95, 96, 97, and 98 wherein at least two medially disposed sensor plates are of an irregular rectilinear symmetric shape.

Example 101

An obscured feature detector according to any of Examples 99 and 100, wherein the row of sensor detectors is bilaterally symmetric.

Example 102

An obscured feature detector according to any of Examples 99 and 100, wherein the row of sensor detectors is bilaterally asymmetric.

Example 103

An obscured feature detector according to any of Examples 101 and 102, wherein at least one sensor plate is defined by a curvilinear side or side portion.

Example 104

An obscured feature detector, wherein the set of sensor plates are arranged in an array not of a linear row form.

Example 104

An obscured feature detector, wherein a first pair of sensor plates provide readings which are combined to be interpreted as a reading as from a single sensor plate.

Example 104

The obscured feature detector of Example 104, wherein a second pair of sensor plates provide readings which are combined to be interpreted as a reading as from a single sensor plate.

Example 105

An obscured feature detector comprising: a sensor plate array including three or more sensor plates, each of the three or more sensor plates configured to form a first end of a corresponding electric field and to take a sensor reading of the corresponding electric field, wherein the corresponding electric field varies based on a proximity of the sensor plate to one or more surrounding objects and on a material property of each of the one or more surrounding objects, the three or more sensor plates including: a first sensor plate that has a first shape, a second sensor plate that has a second shape that is different from the first shape of the first sensor plate; one or more common plates to form a second end of the corresponding electric field of one or more sensor plates of the three or more sensor plates; a sensing circuit coupled to the three or more sensor plates, the sensing circuit configured to measure the sensor readings on the three or more sensor plates; and an indicator to be toggled between a deactivated state and an activated state to indicate a location of a region of relative high sensor reading.

Example 106

The obscured feature detector of Example 105, wherein at least one of the three or more sensor plates is asymmetrical.

Example 107

The obscured feature detector of Example 105, wherein a sensor plate of the three or more sensor plates has more than four linear sides.

Example 108

The obscured feature detector of Example 105, wherein at least one of the three or more sensor plates varies in width along a length of the at least one of the three or more sensor plates sensor plate.

Example 109

The obscured feature detector of Example 105, wherein the three or more sensor plates comprise at least three different sensor plate shapes.

Example 110

The obscured feature detector of Example 105, wherein at least one of the three or more sensor plates is defined by six or more linear sides.

Example 111

The obscured feature detector of Example 105, wherein at least one of the three or more sensor plates is defined by eight or more linear sides.

Example 112

The obscured feature detector of Example 105, wherein the sensor plate array is bilaterally symmetrical.

Example 113

The obscured feature detector of Example 105, wherein the sensor plate array is bilaterally asymmetrical.

Example 114

The obscured feature detector of Example 105, wherein at least one of the three or more sensor plates couples to more than one common plate.

Example 115

The obscured feature detector of Example 105, wherein at least one of the three or more sensor plates is defined by at least one curved side.

Example 116

An obscured feature detector comprising: a sensor plate array including three or more sensor plates arranged in a geometric pattern having one or more ends, each of the three or more sensor plates configured to form a first end of a corresponding electric field and to take a sensor reading of the corresponding electric field, wherein the corresponding electric field varies based on a proximity of the sensor plate to one or more surrounding objects and on a material property of each of the one or more surrounding objects, the three or more sensor plates including: one or more middle plates, and end plates at each end of the geometric pattern, at least one of the end plates having an end shape that is different from a middle shape of the one or more middle plates; one or more common plates to form a second end of the corresponding electric field of one or more sensor plates of the three or more sensor plates; a sensing circuit coupled to the three or more sensor plates, the sensing circuit configured to measure the sensor readings on the three or more sensor plates; and an indicator to be toggled between a deactivated state and an activated state to indicate a location of a region of relative high sensor reading.

Example 117

The obscured feature detector of Example 116, wherein the geometric pattern includes a row of sensor plates including the three or more sensor plates.

Example 118

The obscured feature detector of Example 117, wherein the three or more sensor plates include one or more second-to-end plates adjacent to the one or more end plates, at least one of the one or more second-to-end plates having a second-to-end shape that is different from the middle shape of the one or more middle plates.

Example 119

The obscured feature detector of Example 118, wherein the second to end shape is different from the end shape of the at least one of the one or more end plates.

Example 120

The obscured feature detector of Example 118, wherein the three or more sensor plates include one or more third-to-end plates adjacent to the second-to-end plates, at least one of the third-to-end plates having a third-to-end shape that is different from the middle shape of the one or more middle plates.

Example 121

The obscured feature detector of Example 120, wherein the third-to-end shape is different from the second-to-end shape and the end shape.

Example 122

The obscured feature detector of Example 120, wherein the three or more sensor plates include one or more fourth-to-end plates adjacent to the one or more third-to-end plates, at least one of the one or more fourth-to-end plates having a fourth-to-end shape that is different from the middle shape of the one or more middle plates.

Example 123

The obscured feature detector of Example 122, wherein the fourth-to-end shape is different from the third-to-end shape, the second-to-end shape, and the end shape.

Example 124

The obscured feature detector of Example 122, wherein the end shape, the second-to-end shape, the third-to-end shape, and the fourth-to-end shape are each defined by eight or more linear sides.

It will be apparent to those having skill in the art that many changes may be made to the details of the above-described embodiments without departing from the underlying principles of the disclosure. The scope of the present disclosure should, therefore, be determined only by the following claims.

The invention claimed is:

1. An obscured feature detector comprising:
a sensor plate array including three or more sensor plates, each of the three or more sensor plates configured to form a first end of a corresponding electric field and to take a sensor reading of the corresponding electric field, wherein the corresponding electric field varies based on a proximity of the sensor plate to one or more surrounding objects and on a material property of each of the one or more surrounding objects, the three or more sensor plates including:
a first sensor plate that has a first shape,
a second sensor plate that has a second shape that is different from the first shape of the first sensor plate;
one or more common plates to form a second end of the corresponding electric field of one or more sensor plates of the three or more sensor plates;
a sensing circuit coupled to the three or more sensor plates, the sensing circuit configured to measure the sensor readings on the three or more sensor plates; and
an indicator to be toggled between a deactivated state and an activated state to indicate a location of a region of relative high sensor reading.

2. The obscured feature detector of claim 1, wherein at least one of the three or more sensor plates is asymmetrical.

3. The obscured feature detector of claim 1, wherein a sensor plate of the three or more sensor plates has more than four linear sides.

4. The obscured feature detector of claim 1, wherein at least one of the three or more sensor plates varies in width along a length of the at least one of the three or more sensor plates sensor plate.

5. The obscured feature detector of claim 1, wherein the three or more sensor plates comprise at least three different sensor plate shapes.

6. The obscured feature detector of claim 1, wherein at least one of the three or more sensor plates is defined by six or more linear sides.

7. The obscured feature detector of claim 1, wherein at least one of the three or more sensor plates is defined by eight or more linear sides.

8. The obscured feature detector of claim 1, wherein the sensor plate array is bilaterally symmetrical.

9. The obscured feature detector of claim 1, wherein the sensor plate array is bilaterally asymmetrical.

10. The obscured feature detector of claim 1, wherein at least one of the three or more sensor plates couples to more than one common plate.

11. The obscured feature detector of claim 1, wherein at least one of the three or more sensor plates is defined by at least one curved side.

12. An obscured feature detector comprising:
a sensor plate array including three or more sensor plates arranged in a geometric pattern having one or more ends, each of the three or more sensor plates configured to form a first end of a corresponding electric field and to take a sensor reading of the corresponding electric field, wherein the corresponding electric field varies based on a proximity of the sensor plate to one or more surrounding objects and on a material property of each of the one or more surrounding objects, the three or more sensor plates including:

one or more middle plates, and end plates at each end of the geometric pattern, at least one of the end plates having an end shape that is different from a middle shape of the one or more middle plates;

one or more common plates to form a second end of the corresponding electric field of one or more sensor plates of the three or more sensor plates;

a sensing circuit coupled to the three or more sensor plates, the sensing circuit configured to measure the sensor readings on the three or more sensor plates; and an indicator to be toggled between a deactivated state and an activated state to indicate a location of a region of relative high sensor reading.

13. The obscured feature detector of claim 12, wherein the geometric pattern includes a row of sensor plates including the three or more sensor plates.

14. The obscured feature detector of claim 13, wherein the three or more sensor plates include one or more second-to-end plates adjacent to the end plates, at least one of the one or more second-to-end plates having a second-to-end shape that is different from the middle shape of the one or more middle plates.

15. The obscured feature detector of claim 14, wherein the second to end shape is different from the end shape of the at least one of the end plates.

16. The obscured feature detector of claim 14, wherein the three or more sensor plates include one or more third-to-end plates adjacent to the one or more second-to-end plates, at least one of the one or more third-to-end plates having a third-to-end shape that is different from the middle shape of the one or more middle plates.

17. The obscured feature detector of claim 16, wherein the third-to-end shape is different from the second-to-end shape and the end shape.

18. The obscured feature detector of claim 16, wherein the three or more sensor plates include one or more fourth-to-end plates adjacent to the one or more third-to-end plates, at least one of the one or more fourth-to-end plates having a fourth-to-end shape that is different from the middle shape of the one or more middle plates.

19. The obscured feature detector of claim 18, wherein the fourth-to-end shape is different from the third-to-end shape, the second-to-end shape, and the end shape.

20. The obscured feature detector of claim 18, wherein the end shape, the second-to-end shape, the third-to-end shape, and the fourth-to-end shape are each defined by eight or more linear sides.

\* \* \* \* \*